(12) United States Patent
Nosaka

(10) Patent No.: US 10,886,892 B2
(45) Date of Patent: Jan. 5, 2021

(54) FILTER APPARATUS, MULTIPLEXER, RADIO-FREQUENCY FRONT END CIRCUIT, AND COMMUNICATION APPARATUS

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/532,525

(22) Filed: Aug. 6, 2019

(65) Prior Publication Data

US 2019/0363692 A1    Nov. 28, 2019

Related U.S. Application Data

(63) Continuation of application No. PCT/JP2018/005281, filed on Feb. 15, 2018.

(30) Foreign Application Priority Data

Feb. 20, 2017  (JP) ................................. 2017-029522

(51) Int. Cl.
*H01Q 1/50* (2006.01)
*H03H 9/02* (2006.01)
(Continued)

(52) U.S. Cl.
CPC .......... *H03H 9/02866* (2013.01); *H01Q 1/50* (2013.01); *H03H 9/14544* (2013.01);
(Continued)

(58) Field of Classification Search
CPC ........ H01Q 1/50; H03H 9/6483; H03H 9/542; H03H 9/25; H03H 9/14544;
(Continued)

(56) References Cited

U.S. PATENT DOCUMENTS 4,004,102 A * 1/1977 Ott ........................... H04B 3/40
379/398
4,253,192 A * 2/1981 Donnally ............. H04B 5/0018
340/870.18
(Continued)

FOREIGN PATENT DOCUMENTS

JP  61-64760 U   5/1986
JP  09-167937 A  6/1997
(Continued)

OTHER PUBLICATIONS

Official Communication issued in International Patent Application No. PCT/JP2018/005281, dated Apr. 24, 2018.

*Primary Examiner* — Graham P Smith
*Assistant Examiner* — Jae K Kim
(74) *Attorney, Agent, or Firm* — Keating & Bennett, LLP

(57) ABSTRACT

A filter includes a series arm resonant circuit connected between input/output terminals, and a parallel arm resonant circuit connected between a node on a path connecting the input/output terminals and ground. The series arm resonant circuit includes a series arm resonator having a band width ratio wider than the band width ratio of the parallel arm resonant circuit and a capacitor connected to the series arm resonator.

22 Claims, 53 Drawing Sheets

(51) Int. Cl.
*H03H 9/145* (2006.01)
*H03H 9/25* (2006.01)
*H03H 9/64* (2006.01)
*H03H 9/72* (2006.01)
*H04B 1/40* (2015.01)

(52) U.S. Cl.
CPC ............ *H03H 9/25* (2013.01); *H03H 9/6489* (2013.01); *H03H 9/72* (2013.01); *H04B 1/40* (2013.01)

(58) Field of Classification Search
CPC .. H03H 9/14541; H03H 9/72; H03H 9/02866; H03H 9/6489; H04B 1/0458; H04B 1/18; H04B 1/40
See application file for complete search history.

(56) References Cited

U.S. PATENT DOCUMENTS

| | | |
|---|---|---|
| 2007/0152774 A1 | 7/2007 | Nakanishi et al. |
| 2009/0034504 A1* | 2/2009 | Uejima ..................... H01P 1/15 370/343 |
| 2012/0217822 A1 | 8/2012 | Nakamoto |
| 2012/0286900 A1 | 11/2012 | Kadota et al. |
| 2013/0113576 A1 | 5/2013 | Inoue et al. |
| 2014/0009361 A1* | 1/2014 | Kato ....................... H01Q 1/243 343/860 |
| 2014/0287704 A1* | 9/2014 | Dupuy .................... H01Q 3/24 455/114.2 |
| 2015/0070058 A1* | 3/2015 | Rada ........................ H03F 1/56 327/156 |
| 2015/0155846 A1* | 6/2015 | He ......................... H01Q 5/335 343/852 |
| 2016/0218683 A1* | 7/2016 | Rada ....................... H03F 3/195 |
| 2018/0205149 A1* | 7/2018 | Nishida ................... H01Q 5/10 |

FOREIGN PATENT DOCUMENTS

| | | |
|---|---|---|
| JP | 2005-260909 A | 9/2005 |
| JP | 2005-295496 A | 10/2005 |
| JP | 2006-254281 A | 9/2006 |
| JP | 2011-146768 A | 7/2011 |
| JP | 2012-175594 A | 9/2012 |
| JP | 2013-225945 A | 10/2013 |
| JP | 2016-220263 A | 12/2016 |
| WO | 2005/076473 A1 | 8/2005 |
| WO | 2014/034492 A1 | 3/2014 |

* cited by examiner (a) BWR OF SERIES ARM RESONATOR s1a > BWR OF PARALLEL ARM RESONANT CIRCUIT 12 (p1a)

(b) BWR OF SERIES ARM RESONATOR s1b > BWR OF PARALLEL ARM RESONANT CIRCUIT 12 (p1b)

(a) BWR (LOW) OF SERIES ARM RESONATOR s2a ≈ BWR (LOW) OF PARALLEL ARM RESONANT CIRCUIT 12 (p2a)

(b) BWR (HIGH) OF SERIES ARM RESONATOR s1b ≈ BWR (HIGH) OF PARALLEL ARM RESONANT CIRCUIT 12 (p1b)

(a) BWR OF SERIES ARM RESONATOR s2c < BWR OF PARALLEL ARM RESONANT CIRCUIT 12 (p2c)

(b) BWR OF SERIES ARM RESONATOR s2d > BWR OF PARALLEL ARM RESONANT CIRCUIT 12 (p2d)

SELF-RESONANCE POINT OF CAPACITANCE

FILTER APPARATUS, MULTIPLEXER, RADIO-FREQUENCY FRONT END CIRCUIT, AND COMMUNICATION APPARATUS

CROSS REFERENCE TO RELATED APPLICATIONS

This application claims the benefit of priority to Japanese Patent Application No. 2017-029522 filed on Feb. 20, 2017 and is a Continuation Application of PCT Application No. PCT/JP2018/005281 filed on Feb. 15, 2018. The entire contents of each application are hereby incorporated herein by reference.

BACKGROUND OF THE INVENTION

1. Field of the Invention

The present invention relates to a filter apparatus including resonators, a multiplexer, a radio-frequency front end circuit, and a communication apparatus.

2. Description of the Related Art

Filters disposed in front end portions of mobile communication devices are required to appropriately adjust pass band widths, the sharpness of pass band ends, attenuation band widths, and so on in accordance with the combination of bands used in multimode-multiband communication.

Japanese Unexamined Patent Application Publication No. 2005-260909 discloses a configuration of a surface acoustic wave device that defines a band pass filter. Specifically, a radio-frequency filter described in Japanese Unexamined Patent Application Publication No. 2005-260909 has a configuration in which the radio-frequency filter includes a series arm resonator and a parallel arm resonator, an insulating-material layer is provided between an interdigital transducer (IDT) electrode of the series arm resonator and a piezoelectric substrate, and an IDT electrode of the parallel arm resonator is directly formed on the piezoelectric substrate. With this configuration, the sharpness between a pass band and an attenuation band and sufficient attenuation are capable of being achieved by making the frequency difference between a resonant frequency and an anti-resonant frequency of the series arm resonator smaller than that of the parallel arm resonator.

However, with the radio-frequency filter disclosed in Japanese Unexamined Patent Application Publication No. 2005-260909, the frequency difference of the parallel arm resonator is greater than that of the series arm resonator. When the frequency difference of the parallel arm resonator is greater than that of the series arm resonator in a filter apparatus including the series arm resonator and the parallel arm resonator, there is a problem in that the sharpness at the low frequency side of the pass band is degraded. In addition, when the series arm resonator and the parallel arm resonator are acoustic wave resonators, bulk-wave loss occurs in an area at the high frequency side of the anti-resonant frequency of the series arm resonator. When the acoustic wave resonators are applied to a filter having a lower pass band frequency in a multiplexer in which multiple filters having different pass band frequencies are connected with a common terminal, there are problems in that return loss of the acoustic wave resonators is degraded in the area at the high frequency side to increase insertion loss of a filter having a higher pass band frequency, compared with that of the filter having the lower pass band frequency.

SUMMARY OF THE INVENTION

Preferred embodiments of the present invention provide filter apparatuses, multiplexers, radio-frequency front end circuits, and communication apparatuses, which are each capable of reducing the return loss at the high frequency side of the pass band while ensuring the sharpness between the pass band and the attenuation band.

A filter apparatus according to a preferred embodiment of the present invention includes a series arm resonant circuit connected between a first input/output terminal and a second input/output terminal and a parallel arm resonant circuit connected to a node on a path connecting the first input/output terminal to the second input/output terminal and ground. When a value calculated by dividing a frequency difference between an anti-resonant frequency at a lowest frequency side, among one or more anti-resonant frequencies of a resonant circuit, and a resonant frequency at the lowest frequency side, among one or more resonant frequencies of the resonant circuit, by the resonant frequency is defined as a band width ratio of the resonant circuit and a value calculated by dividing a frequency difference between an anti-resonant frequency of a resonator and a resonant frequency of the resonator by the resonant frequency is defined as a band width ratio of the resonator, the series arm resonant circuit includes a first series arm resonator having a band width ratio higher than the band width ratio of the parallel arm resonant circuit, and a first capacitor connected to the first series arm resonator.

With the above configuration, since the series arm resonant circuit includes the first series arm resonator having a band width ratio wider than the band width ratio of the parallel arm resonant circuit and the first capacitor connected to the first series arm resonator, the band width ratio of the series arm resonant circuit is narrower than the band width ratio of the first series arm resonator. Accordingly, the sharpness (steepness) between the pass band and the attenuation band at the high frequency side of the pass band is capable of being ensured, compared with a filter including the first series arm resonator and the parallel arm resonant circuit. In addition, since the band width ratio of the parallel arm resonant circuit is narrower than the band width ratio of the first series arm resonator, the sharpness (steepness) between the pass band and the attenuation band at the low frequency side of the pass band is able to be ensured. Consequently, the sharpness between the pass band and the attenuation band is able to be ensured. Furthermore, since a radio-frequency signal input through the first input/output terminal or the second input/output terminal is subjected to power distribution in the first series arm resonator and the first capacitor, a Q value of the capacitance component of the series arm resonant circuit at the high frequency side of the anti-resonant frequency of the series arm resonant circuit is capable of being improved. Accordingly, it is possible to reduce the return loss at the high frequency side of the pass band of the filter apparatus.

The band width ratio of the series arm resonant circuit may be equal or substantially equal to the band width ratio of the parallel arm resonant circuit.

With the above configuration, it is possible to provide a filter in which the frequency difference between the low frequency end of the pass band and the attenuation pole at the low frequency side of the pass band is equal or substantially equal to the frequency difference between the high frequency end of the pass end and the attenuation pole at the high frequency side of the pass band, and which has a high sharpness between the pass band and the attenuation band at both ends of the pass band.

The first series arm resonator may be an acoustic wave resonator including an IDT electrode including a plurality of electrode fingers provided on a substrate at least partially having piezoelectricity.

With the above configuration, since the size of the first series arm resonator is capable of being reduced, it is possible to reduce the size of the filter apparatus and reduce the cost thereof. In addition, since the acoustic wave resonator generally has high Q characteristic, it is possible to reduce the loss of the filter apparatus and improve the selectability thereof.

The first capacitor may include the substrate and a first interdigital capacitor electrode including a plurality of electrode fingers provided on the substrate. The pitch of the plurality of electrode fingers of the first interdigital capacitor electrode may be narrower than the pitch of the plurality of electrode fingers of the first series arm resonator.

A self-resonant frequency is shifted toward the high-frequency side as the pitch of the electrode fingers of the first capacitor is decreased. The self-resonant frequency is a singular point at which the Q value (capacitance Q) of the capacitance element is locally decreased. Accordingly, shifting the self-resonant frequency of the first capacitor to the high side of the pass band of the radio-frequency filter by making the pitch of the electrode fingers of the first interdigital capacitor electrode narrower than the pitch of the electrode fingers of the first series arm resonator enables the Q value of the first capacitor in the pass band to be increased. Accordingly, it is possible to reduce or prevent the loss in the pass band.

The film thickness of the multiple electrode fingers in the first interdigital capacitor electrode may be smaller than or equal to the film thickness of the multiple electrode fingers in the first series arm resonator.

For manufacturing reasons, the pitch of the electrode fingers is restricted by the film thickness of the electrode fingers. Accordingly, since the pitch of the electrode fingers in the first capacitor is further narrowed by making the film thickness of the electrode fingers in the first capacitor thinner than the film thickness of the electrode fingers in the first series arm resonator, the size of the first interdigital capacitor electrode is capable of being reduced and both the Q value at the resonant frequency and the anti-resonant frequency of the first series arm resonator and the Q value of the first capacitor are easily ensured. Accordingly, it is possible to reduce the size of the filter apparatus and to reduce the loss in the pass band by ensuring both the Q value of the first series arm resonator and the Q value of the first capacitor.

The first series arm resonator may be connected on the path, and the first capacitor may be connected in parallel to the first series arm resonator.

With the above configuration, it is possible to ensure the sharpness (steepness) between the pass band and the attenuation band at the high frequency side and the low frequency side of the pass band to reduce the return loss at the high frequency side of the pass band and to reduce the insertion loss in the pass band. Furthermore, it is possible to reduce the size of the series arm resonant circuit.

The series arm resonator may be connected on the path. The series arm resonant circuit may further include a first impedance element connected in series to the first series arm resonator. A circuit in which the first series arm resonator is connected in series to the first impedance element may be connected in parallel to the first capacitor. The first impedance element may be either of a second capacitor or an inductor.

With the above configuration, it is possible to adjust the pass band width or the attenuation band while reducing the return loss at the high frequency side of the pass band.

The series arm resonator may be connected on the path. The series arm resonant circuit may further include a first impedance element connected in series to the first series arm resonator and a first switch connected in series to the first capacitor. A circuit in which the first series arm resonator is connected in series to the first impedance element may be connected in parallel to a circuit in which the first capacitor is connected in series to the first switch. The first impedance element may be either of a second capacitor or an inductor.

With the above configuration, switching between the conducting state and the non-conducting state of the first switch enables the frequency of the attenuation pole at the high frequency side of the pass band to be varied while reducing the return loss at the high frequency side of the pass band.

The series arm resonant circuit may further include a second switch connected in parallel to the first impedance element.

With the above configuration, switching between the conducting state and the non-conducting state of the second switch enables the frequency of the attenuation pole at the high frequency side of the pass band to be varied while reducing the return loss at the high frequency side of the pass band.

The first series arm resonator may be connected on the path. The series arm resonant circuit may further include a first switch connected in series to the first capacitor. The first series arm resonator may be connected in parallel to a circuit in which the first capacitor is connected in series to the first switch.

With the above configuration, switching between the conducting state and the non-conducting state of the first switch enables the frequency of the attenuation pole at the high frequency side of the pass band to be varied while reducing the return loss at the high frequency side of the pass band.

The parallel arm resonant circuit may include a first parallel arm resonator connected between the node and the ground. The band width ratio of the first parallel arm resonator may be narrower than the band width ratio of the first series arm resonator. The resonant frequency of the first parallel arm resonator may be lower than the resonant frequency of the first series arm resonator and the anti-resonant frequency of the first parallel arm resonator may be lower than the anti-resonant frequency of the first series arm resonator.

With the above configuration, it is possible to ensure the sharpness between the pass band and the attenuation band at the low frequency side of the pass band while reducing the return loss at the high frequency side of the pass band.

The parallel arm resonant circuit may include a first parallel arm resonator connected between the node and the ground and a third capacitor connected in series to the first parallel arm resonator. The band width ratio of the first parallel arm resonator may be equal to or narrower than the band width ratio of the first series arm resonator. The resonant frequency of the first parallel arm resonator may be lower than the resonant frequency of the first series arm resonator and the anti-resonant frequency of the first parallel arm resonator may be lower than the anti-resonant frequency of the first series arm resonator.

With the above configuration, it is possible to ensure the sharpness between the pass band and the attenuation band at the low frequency side of the pass band while reducing the return loss at the high frequency side of the pass band.

The parallel arm resonant circuit may include a first parallel arm resonator connected between the node and the ground and a first variable frequency circuit that is connected to the first parallel arm resonator and that varies at least one of the resonant frequency and the anti-resonant frequency of the parallel arm resonant circuit. The first variable frequency circuit may include a third capacitor connected in series to the first parallel arm resonator and a third switch connected in parallel to the third capacitor. The band width ratio of the first parallel arm resonator may be equal to or narrower than the band width ratio of the first series arm resonator. The resonant frequency of the first parallel arm resonator may be lower than the resonant frequency of the first series arm resonator and the anti-resonant frequency of the first parallel arm resonator may be lower than the anti-resonant frequency of the first series arm resonator.

With the above configuration, switching between the conducting state and the non-conducting state of the third switch enables the frequency of the attenuation pole at the low frequency side of the pass band to be varied while reducing the return loss at the high frequency side of the pass band.

The parallel arm resonant circuit may further include a second parallel arm resonator connected between the node and the ground. The second parallel arm resonator may be connected in parallel to a circuit in which the first parallel arm resonator is connected in series to the first variable frequency circuit. The band width ratio of the second parallel arm resonator may be equal to or narrower than the band width ratio of the first series arm resonator. The resonant frequency of the second parallel arm resonator may be higher than the resonant frequency of the first parallel arm resonator and the anti-resonant frequency of the second parallel arm resonator may be higher than the anti-resonant frequency of the first parallel arm resonator.

With the above configuration, switching between the conducting state and the non-conducting state of the third switch enables a cutoff frequency at the low frequency side of the pass band and the frequency of the attenuation pole at the low frequency side of the pass band to be varied while reducing the return loss at the high frequency side of the pass band. Accordingly, it is possible to vary the frequency at the low frequency side of the pass band without increasing the insertion loss at the low pass end.

The parallel arm resonant circuit may include a first parallel arm resonator connected between the node and the ground, a second parallel arm resonator connected between the node and the ground, and a second variable frequency circuit that is connected to the second parallel arm resonator and that varies at least one of the resonant frequency and the anti-resonant frequency of the parallel arm resonant circuit. The second variable frequency circuit may include a fourth capacitor connected in series to the second parallel arm resonator and a fourth switch connected in parallel to the fourth capacitor. The first parallel arm resonator may be connected in parallel to a circuit in which the second parallel arm resonator is connected in series to the fourth capacitor. The band width ratio of the first parallel arm resonator may be equal to or narrower than the band width ratio of the first series arm resonator. The resonant frequency of the first parallel arm resonator may be lower than the resonant frequency of the first series arm resonator and the anti-resonant frequency of the first parallel arm resonator may be lower than the anti-resonant frequency of the first series arm resonator. The band width ratio of the second parallel arm resonator may be equal to or narrower than the band width ratio of the first series arm resonator. The resonant frequency of the second parallel arm resonator may be higher than the resonant frequency of the first parallel arm resonator and the anti-resonant frequency of the second parallel arm resonator may be higher than the anti-resonant frequency of the first parallel arm resonator.

With the above configuration, switching between the conducting state and the non-conducting state of the fourth switch enables a cutoff frequency at the high frequency side of the pass band and the frequency of the attenuation pole at the high frequency side of the pass band to be varied while reducing the return loss at the high frequency side of the pass band. Accordingly, it is possible to vary the frequency at the high frequency side of the pass band without increasing the insertion loss at the high pass end.

Each of the first series arm resonator and the first parallel arm resonator may be an acoustic wave resonator including an IDT electrode including a plurality of electrode fingers provided on a substrate at least partially having piezoelectricity. A first adjustment film that adjusts the band width ratio may be provided between the IDT electrode of at least the first parallel arm resonator, in the first series arm resonator and the first parallel arm resonator, and the substrate.

With the above configuration, it is possible to set the band width ratios of the first series arm resonator and the first parallel arm resonator by adjusting the film thickness of the first adjustment film. For example, when the band width ratio of the first series arm resonator is to be higher than the band width ratio of the first parallel arm resonator, the film thickness of the first adjustment film of the first series arm resonator may be thinner that the film thickness of the first adjustment film of the first parallel arm resonator.

Each of the first series arm resonator and the first parallel arm resonator may be an acoustic wave resonator including an IDT electrode including a plurality of electrode fingers provided on a substrate at least partially having piezoelectricity. A second adjustment film that adjusts the band width ratio may cover the IDT electrode of at least the first parallel arm resonator, in the first series arm resonator and the first parallel arm resonator.

With the above configuration, it is possible to set the band width ratios of the first series arm resonator and the first parallel arm resonator by adjusting the film thickness of the second adjustment film. For example, when the band width ratio of the first series arm resonator is to be higher than the band width ratio of the first parallel arm resonator, the film thickness of the second adjustment film of the first series arm resonator may be thinner that the film thickness of the second adjustment film of the first parallel arm resonator.

A multiplexer according to a preferred embodiment of the present invention includes a common terminal, a filter apparatus according to a preferred embodiment of the present invention, and a first filter having a pass band at a high frequency side of a pass band of the filter apparatus. The first input/output terminal and the first filter may be connected to the common terminal.

With the filter apparatus having the pass band at the low frequency side, the return loss at the high frequency side of the pass band is capable of being reduced. Since the pass band of the first filter connected to the filter apparatus with the common terminal is at the high frequency side of the pass band of the filter apparatus, it is possible to reduce the insertion loss of the first filter.

The filter apparatus may further include one or more acoustic wave resonators. The series arm resonant circuit may be connected to the common terminal without the one or more acoustic wave resonators and the parallel arm resonant circuit interposed therebetween.

With the above configuration, since the return loss at the high frequency side of the pass band, when the filter apparatus is viewed from the common terminal, is capable of being minimized, it is possible to effectively reduce the insertion loss of the first filter.

In a filter apparatus according to a preferred embodiment of the present invention, in which the first input/output terminal is connected to the common terminal; a first filter which includes a first terminal and a second terminal and in which the first terminal is connected to the common terminal; and a switch circuit which includes a third terminal, a first selection terminal, and a second selection terminal and in which the first selection terminal is connected to the second input/output terminal and the second selection terminal is connected to the second terminal to switch between connection of the third terminal to the first selection terminal and connection of the third terminal to the second selection terminal are included. The frequency of the pass band of the first filter is higher than the frequency of the pass band of the filter apparatus. The filter apparatus further includes one or more acoustic wave resonators. The series arm resonant circuit is connected to the common terminal without the one or more acoustic wave resonators and the parallel arm resonant circuit interposed therebetween. When the third terminal is not connected to the first selection terminal, the first switch may be in a conducting state.

With the above configuration, when the first switch is in the conducting state, the series arm resonant circuit is subjected to the power distribution in the first series arm resonator and the first capacitor and the Q value of the capacitance component of the series arm resonant circuit at the high frequency side of the anti-resonant frequency of the series arm resonant circuit is capable of being improved. Accordingly, even when the filter apparatus is not selected with the switch circuit, the insertion loss in the pass band of the first filter is reduced.

A radio-frequency front end circuit according to a preferred embodiment of the present invention includes a filter apparatus described above and an amplifier circuit connected to the filter apparatus.

With the above configuration, it is possible to provide the radio-frequency front end circuit including the filter apparatus having the reduced return loss at the high frequency side of the pass band while ensuring the sharpness between the pass band and the attenuation band.

A communication apparatus according to a preferred embodiment of the present invention includes an RF signal processing circuit that processes a radio-frequency signal transmitted and received through an antenna element and the radio-frequency front end circuit described above, which transmits the radio-frequency signal between the antenna element and the RF signal processing circuit.

With the above configuration, it is possible to provide the communication apparatus including the filter apparatus having the reduced return loss at the high frequency side of the pass band while ensuring the sharpness between the pass band and the attenuation band.

According the filter apparatuses, the multiplexers, the radio-frequency front end circuits, and the communication apparatuses of preferred embodiments of the present invention, it is possible to reduce the return loss at the high frequency side of the pass band while ensuring the sharpness between the pass band and the attenuation band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
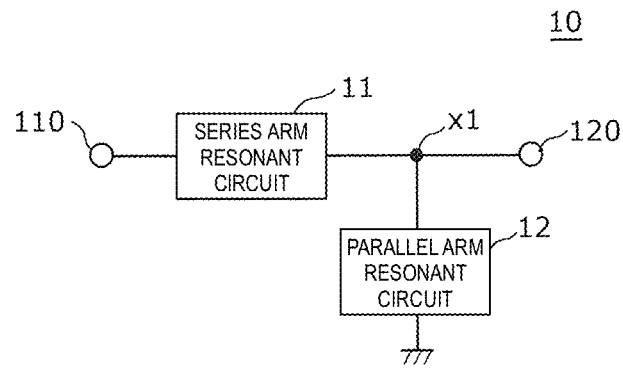
FIG. 1A is a circuit block diagram of a filter apparatus according to a first preferred embodiment of the present invention.

Preferred embodiments of the present invention will herein be described in detail using examples with reference to the drawings. All of the preferred embodiments described below indicate comprehensive or specific examples. Numerical values, shapes, materials, components, the arrangement of the components, the connection structure of the components, and so on, which are indicated in the preferred embodiments described below, are only examples and are not intended to limit the scope of the present invention. Among the components in the preferred embodiments described below, the components that are not described in the independent claims are described as optional components. In addition, the sizes or the ratios of the sizes of the components illustrated in the drawings are not necessarily strictly indicated. The same reference numerals are used in the respective drawings to identify the same or substantially the same components and a duplicate description of such components may be omitted or simplified.

In the following description, a "low pass end" means a "lowest frequency in the pass band" and a "high pass end" means a "highest frequency in the pass band." In the following description, a "low pass side" means a "low frequency side of the pass band outside the pass band" and a "high pass side" means a "high frequency side of the pass band outside the pass band." In the following description, a "low frequency side" may be referred to as a "low side" and a "high frequency side" may be referred to as a "high side."

A resonant frequency in a resonator or a circuit is the resonant frequency to provide an attenuation pole in the pass band or near the pass band of a filter including the resonator or the circuit, unless otherwise specified, and is the frequency of a "resonance point", which is a singular point at which the impedance of the resonator or the circuit is locally minimized (ideally, a point at which the impedance is zero).

An anti-resonant frequency in a resonator or a circuit is the anti-resonant frequency to provide the attenuation pole in the pass band or near the pass band of a filter including the resonator or the circuit, unless otherwise specified, and is the frequency of an "anti-resonance point", which is a singular point at which the impedance of the resonator or the circuit is locally maximized (ideally, a point at which the impedance reaches an infinite value).

A series arm circuit and a parallel arm circuit in the preferred embodiments described below are defined in the following manner.

The series arm circuit is a circuit that is disposed between a first input/output terminal or a second input/output terminal and a node, to which the parallel arm circuit is connected, or a circuit that is disposed between one node on the path, to which one parallel arm circuit is connected, and another node on the path, to which another parallel arm circuit is connected.

The parallel arm circuit is a circuit that is disposed between one node on a path connecting the first input/output terminal to the second input/output terminal and ground.

A series arm resonant circuit is a circuit that is disposed between the first input/output terminal or the second input/output terminal and the node on the path, to which the parallel arm circuit is connected, or a circuit that is disposed between one node on the path, to which one parallel arm circuit is connected, and another node on the path, to which another parallel arm circuit is connected, and is a circuit that has the resonant frequency and the anti-resonant frequency.

A parallel arm resonant circuit is a circuit that is disposed between one node on the path connecting the first input/output terminal to the second input/output terminal and the ground and is a circuit that has the resonant frequency and the anti-resonant frequency.

First Preferred Embodiment 1.1 Configuration of Filter 10

FIG. 1A is a circuit block diagram of a filter 10 according to a first preferred embodiment of the present invention. The filter 10 illustrated in FIG. 1A includes a series arm resonant circuit 11 and a parallel arm resonant circuit 12.

The series arm resonant circuit 11 is connected between an input/output terminal 110 (the first input/output terminal) and an input/output terminal 120 (the second input/output terminal).

The parallel arm resonant circuit 12 is connected to a node x1 on a path connecting the input/output terminal 110 to the input/output terminal 120 and the ground (a reference terminal).

Figure 1B:
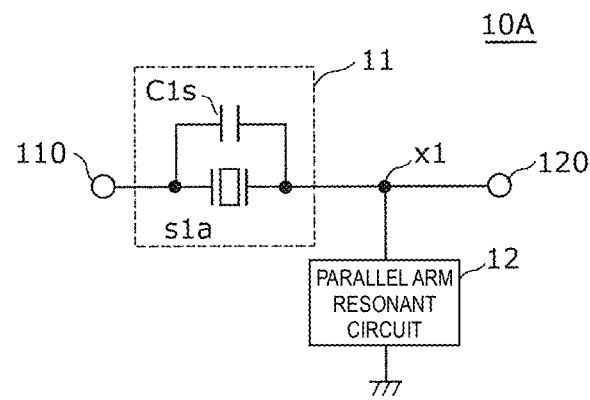
FIG. 1B is a circuit configuration diagram of the filter apparatus according to the first preferred embodiment of the present invention.

FIG. 1B is a circuit configuration diagram of a filter 10A according to the first preferred embodiment. The filter 10A illustrated in FIG. 1B is an example of the specific circuit configuration of the filter 10. As illustrated in FIG. 1B, the filter 10A includes the series arm resonant circuit 12 and the series arm resonant circuit 11 includes a series arm resonator s1a and a capacitor C1s.

The series arm resonator s1a is a first series arm resonator that is connected between the input/output terminal 110 and the input/output terminal 120 and that has a band width ratio wider than the band width ratio of the parallel arm resonant circuit 12.

Here, the band width ratio is defined as a value ((fa−fr)/fr) (or a percentage of the value) calculated by dividing a frequency difference (fa−fr) between an anti-resonant frequency fa and a resonant frequency fr of a resonant circuit or a resonator by the resonant frequency fr. When one or more anti-resonant frequencies (anti-resonance points) and one or more resonant frequencies (resonance points) exist in a resonant circuit, which is either of the series arm resonant circuit and the parallel arm resonant circuit, the band width ratio of the resonant circuit is defined as a value calculated by dividing the frequency difference between the anti-resonant frequency at the lowest frequency side, among the one or more anti-resonant frequencies of the resonant circuit, and the resonant frequency at the lowest frequency side, among the one or more resonant frequencies of the resonant circuit, by the resonant frequency.

The capacitor C1s is a first capacitor connected in parallel to the series arm resonator s1a.

The series arm resonator s1a may preferably include a plurality of acoustic wave resonators. For example, the series arm resonator s1a includes a plurality of divided resonators resulting from, for example, series division of one acoustic wave resonator. The series arm resonator s1a may be defined by an LC resonant circuit having the resonant frequency and the anti-resonant frequency, instead of the acoustic wave resonators.

It is sufficient for the parallel arm resonant circuit 12 to be a circuit having the resonant frequency and the anti-resonant frequency and the circuit configuration of the parallel arm resonant circuit 12 is not particularly limited. For example, the parallel arm resonant circuit 12 may be defined by an acoustic wave resonator. Alternatively, the parallel arm resonant circuit 12 may be defined by an LC resonant circuit having the resonant frequency and the anti-resonant frequency, instead of the acoustic wave resonator.

If a capacitance element of the LC resonant circuit is defined by an interdigital capacitor provided on a piezoelectric substrate even when at least either of the series arm resonator s1a and the parallel arm resonant circuit 12 is the LC resonant circuit, bulk-wave loss described below occurs.

Figure 1C:
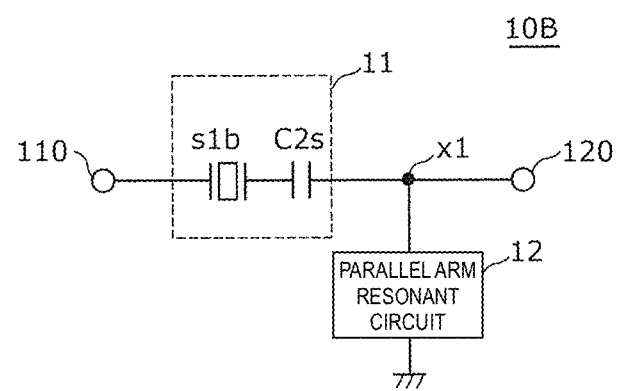
FIG. 1C is a circuit configuration diagram of a filter apparatus according to a modification of the first preferred embodiment of the present invention.

FIG. 1C is a circuit configuration diagram of a filter 10B according to a modification of the first preferred embodiment. The filter 10B illustrated in FIG. 1C is an example of the specific circuit configuration of the filter 10. As illustrated in FIG. 1C, the filter 10B includes the series arm resonant circuit 11 and the parallel arm resonant circuit 12 and the series arm resonant circuit 11 includes a series arm resonator sib and a capacitor C2s.

The series arm resonator sib is the first series arm resonator that is connected between the input/output terminal 110 and the input/output terminal 120 and that has a band width ratio wider than the band width ratio of the parallel arm resonant circuit 12.

The capacitor C2s is the first capacitor connected in series to the series arm resonator sib.

In the filter 10 (the filters 10A and 10B) according to the first preferred embodiment, since the series arm resonant circuit 11 includes the first series arm resonator (s1a and sib) having a band width ratio wider than the band width ratio of the parallel arm resonant circuit 12 and the first capacitor (C1s and C2s) connected to the first series arm resonator, the band width ratio of the series arm resonant circuit 11 is narrower than the band width ratio of the first series arm resonator. Accordingly, the sharpness (steepness) between the pass band and the attenuation band at the high frequency side of the pass band is able to be ensured, compared with a filter including the first series arm resonator and the parallel arm resonant circuit 12. In addition, since the band width ratio of the parallel arm resonant circuit 12 is narrower than the band width ratio of the first series arm resonator, the sharpness (steepness) between the pass band and the attenuation band at the low frequency side of the pass band is able to be ensured. Furthermore, since a radio-frequency signal input through the input/output terminal 110 or the input/output terminal 120 is subjected to power distribution in the first series arm resonator and the first capacitor, a capacitance Q value of the series arm resonant circuit 11 at the high frequency side of the anti-resonant frequency of the series arm resonant circuit 11 is improved. Accordingly, it is possible to reduce return loss at the high frequency side of the pass band of the filter 10 (the filters 10A and 10B).

1.2 Transmission Characteristics of Filter

Figure 2A:
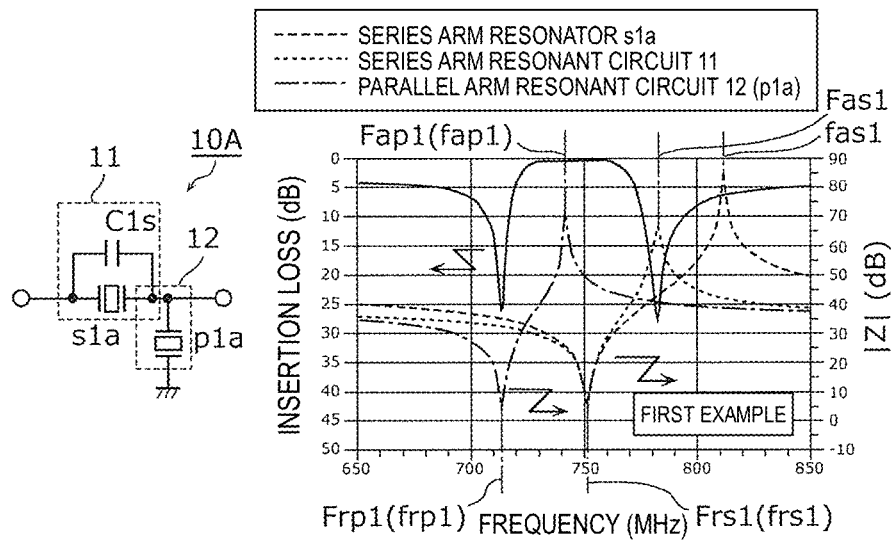
FIG. 2A includes graphs representing transmission characteristics and impedance characteristics of filter apparatuses according to first and second examples of preferred embodiments of the present invention.
Figure 2A:
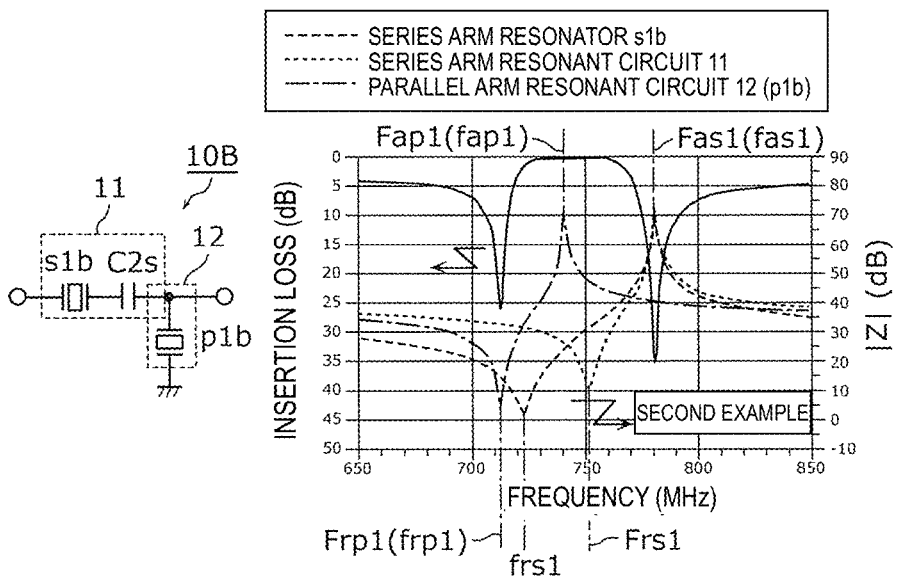

FIG. 2A includes graphs representing transmission characteristics of the filters (10A and 10B) according to the first preferred embodiment (a first example and a second example) and impedance characteristics of the resonators and the resonant circuits. Part (a) of FIG. 2A represents the transmission characteristic of the filter 10A according to the first example and the impedance characteristics of the resonator and the resonant circuits, and part (b) of FIG. 2A represents the transmission characteristic of the filter 10B according to the second example and the impedance characteristics of the resonator and the resonant circuits.

Figure 2B:
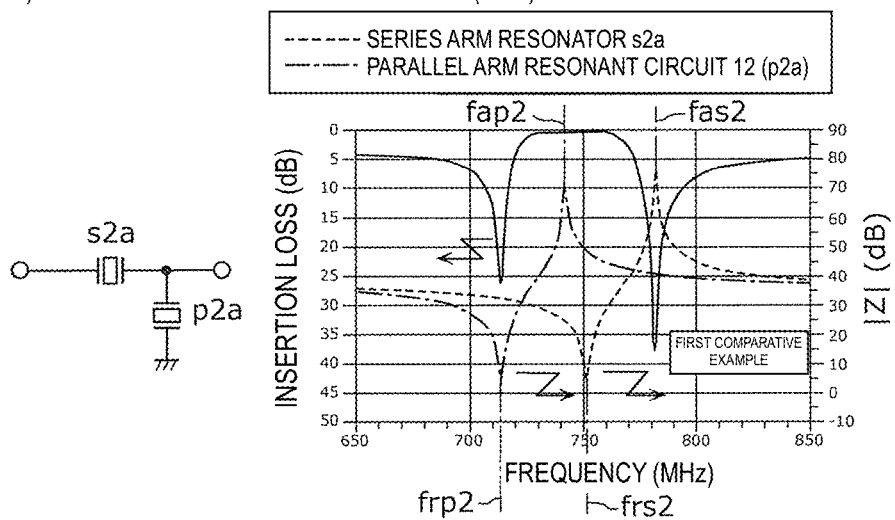
FIG. 2B includes graphs representing the transmission characteristics and the impedance characteristics of filter apparatuses according to first and second comparative examples.
Figure 2B:
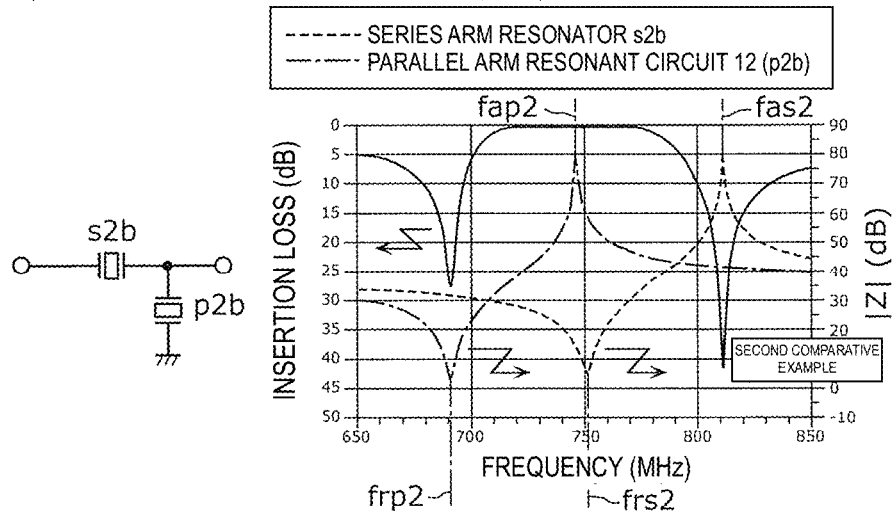

FIG. 2B includes graphs representing the transmission characteristics of filters according to a first comparative example and a second comparative example and the impedance characteristics of the resonators and the resonant circuits. Part (a) of FIG. 2B represents the transmission characteristic of the filter according to the first comparative example and the impedance characteristics of the resonator and the resonant circuit and part (b) FIG. 2B represents the transmission characteristic of the filter according to the second comparative example and the impedance characteristics of the resonator and the resonant circuit.

Figure 2C:
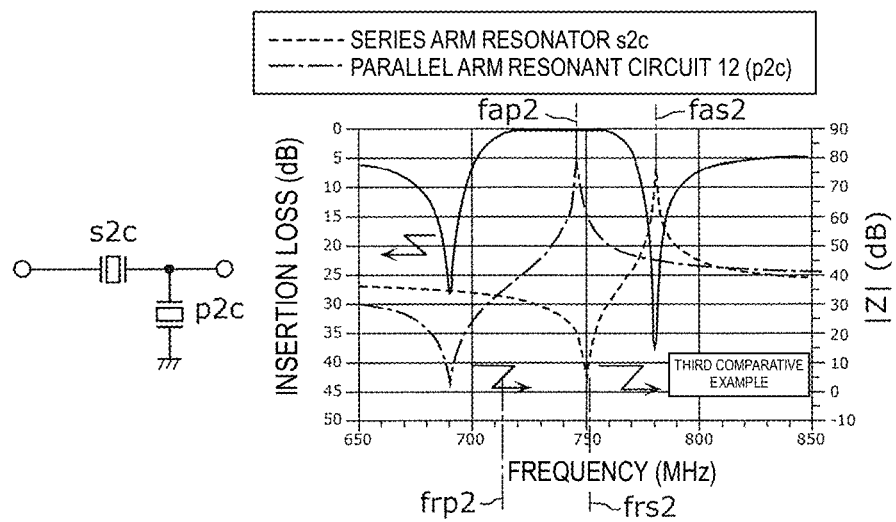
FIG. 2C includes graphs representing the transmission characteristics and the impedance characteristics of filter apparatuses according to third and fourth comparative examples.
Figure 2C:
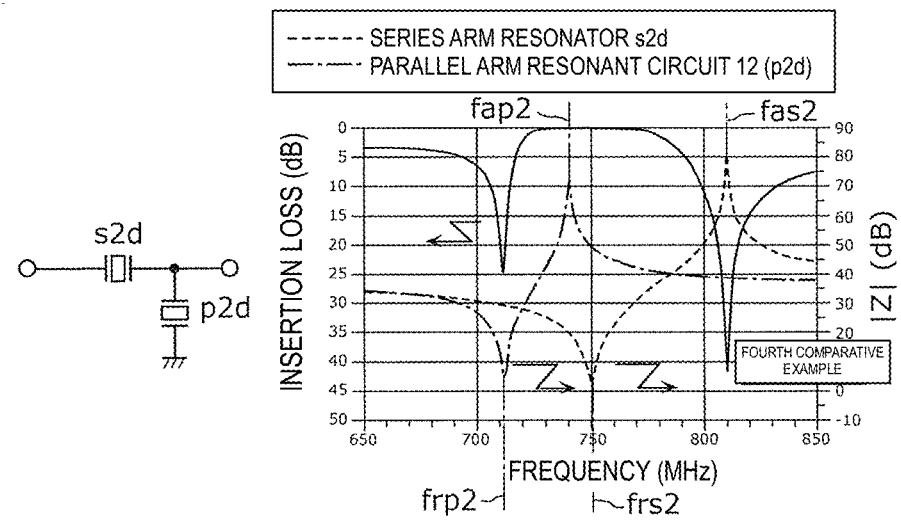

FIG. 2C includes graphs representing the transmission characteristics of filters according to a third comparative example and a fourth comparative example and the impedance characteristics of the resonators and the resonant circuits. Part (a) of FIG. 2C represents the transmission characteristic of the filter according to the third comparative example and the impedance characteristics of the resonator and the resonant circuit and part (b) of FIG. 2C represents the transmission characteristic of the filter according to the fourth comparative example and the impedance characteristics of the resonator and the resonant circuit.

It is assumed in the first and second examples and the first to fourth comparative examples that the parallel arm resonant circuit includes one parallel arm resonator.

Table 1 indicates the resonant frequencies, the anti-resonant frequencies, the band width ratios, and the capacitance values of the filters according to the first and second examples and the first to fourth comparative examples.

TABLE 1

|  |  | Resonant frequency fr (MHz) | Anti-resonant frequency fa (MHz) | Band width ratio BWR (%) | Capacitance value (pF) |
| --- | --- | --- | --- | --- | --- |
| First example | Series arm resonator s1a | 750 | 810 | 8.00 | 1.5 |
|  | Capacitor C1s | — | — | — | 1.5 |
|  | Series arm resonant circuit 11 | 750 | 781 | 4.13 | 3.0 |
|  | Parallel arm resonator p1a Parallel arm resonant circuit 12 | 712 | 740 | 4.00 | 3.0 |
| Second example | Series arm resonator s1b | 750 | 810 | 8.00 | 1.5 |
|  | Capacitor C2s | — | — | — | 1.5 |
|  | Series arm resonant circuit 11 | 750 | 781 | 4.13 | 3.0 |
|  | Parallel arm resonator p1b Parallel arm resonant circuit 12 | 712 | 740 | 4.00 | 3.0 |
| First comparative example | Series arm resonator s2a | 750 | 780 | 4.00 | 3.0 |
|  | Parallel arm resonator p2a | 712 | 740 | 4.00 | 3.0 |
| Second comparative example | Series arm resonator s2b | 750 | 810 | 8.00 | 3.0 |
|  | Parallel arm resonator p2b | 690 | 745 | 8.00 | 3.0 |
| Third comparative example | Series arm resonator s2c | 750 | 780 | 4.00 | 3.0 |
|  | Parallel arm resonator p2c | 690 | 745 | 8.00 | 3.0 |
| Fourth comparative example | Series arm resonator s2d | 750 | 810 | 8.00 | 3.0 |
|  | Parallel arm resonator p2d | 712 | 740 | 4.00 | 3.0 |

Here, the relationship between the resonant frequency and the anti-resonant frequency and filter characteristics in a ladder band pass filter including the series arm resonant circuit and the parallel arm resonant circuit will now be described.

The parallel arm resonant circuit has a resonant frequency Frp at which impedance |Z| is locally minimized and an anti-resonant frequency Fap (>Frp) at which the impedance |Z| is locally maximized. The series arm resonant circuit has a resonant frequency Frs at which the impedance |Z| is locally minimized and an anti-resonant frequency Fas (>Frs>Frp) at which the impedance |Z| is locally maximized. In the composition of the band pass filter including ladder resonators, the anti-resonant frequency Fap of the parallel arm resonant circuit is close to the resonant frequency Frs of the series arm resonant circuit. This defines the attenuation pole at the resonant frequency Frp at which the impedance of the parallel arm resonant circuit is close to zero, and a stop band at the low frequency side occurs near the resonant frequency Frp. In addition, at higher frequencies, the impedance of the parallel arm resonant circuit is increased near the anti-resonant frequency Fap and the impedance of the series arm resonant circuit is close to zero near the resonant frequency Frs. Accordingly, the pass band occurs near the anti-resonant frequency Fap and the resonant frequency Frs on the signal path from the input/output terminal 110 to the input/output terminal 120. At higher frequencies near the anti-resonant frequency Fas, the attenuation pole is provided at the anti-resonant frequency Fas at which the impedance of the series arm resonant circuit is increased and the stop band at the high frequency side occurs near the anti-resonant frequency Fap. In other words, the anti-resonant frequency Fap of the parallel arm resonant circuit and the resonant frequency Frs of the series arm resonant circuit define the pass band, the resonant frequency Frp of the parallel arm resonant circuit defines the attenuation pole at the low pass side, and the anti-resonant frequency Fas of the series arm resonant circuit defines the attenuation pole at the high pass side.

1.2.1 Transmission Characteristics of Filter 10A According to First Example

As illustrated in part (a) of FIG. 2A, the filter 10A according to the first example includes the series arm resonant circuit 11 and the parallel arm resonant circuit 12. The series arm resonant circuit 11 includes the series arm resonator s1a and the capacitor C1s, which are connected in parallel to each other, and the parallel arm resonant circuit 12 includes a parallel arm resonator p1a.

Figure 3:
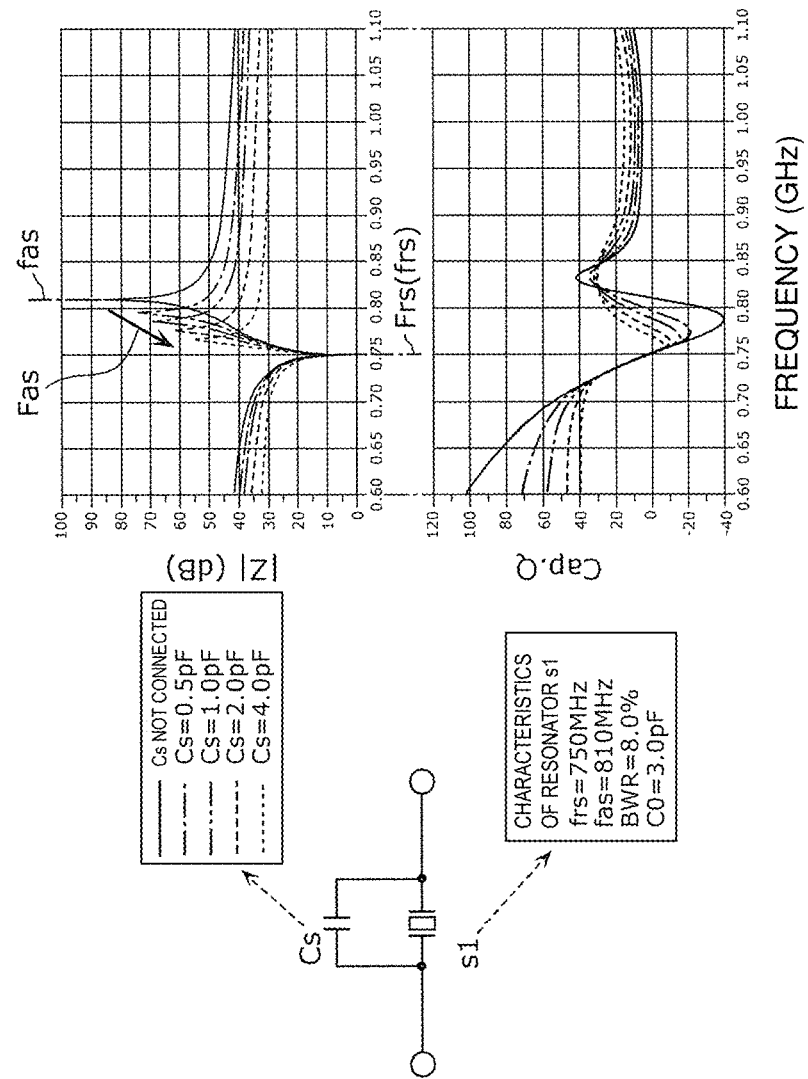
FIG. 3 includes graphs representing the impedance characteristics and capacitance Q values of a series arm resonant circuit.

FIG. 3 includes graphs representing the impedance characteristics and the capacitance Q values of the series arm resonant circuit. On the left side in FIG. 3, a series arm resonator s1 and a capacitor Cs are illustrated, which define the series arm resonant circuit and which are connected in parallel to each other. As represented in the graph on the upper right side in FIG. 3, the anti-resonant frequency Fas of the series arm resonant circuit is shifted to the low frequency side as the capacitance value of the capacitor Cs is increased with respect to a resonant frequency frs and an anti-resonant frequency fas of the series arm resonator s1. Accordingly, the band width ratio ((Fas-Frs)/Frs) of the series arm resonant circuit is narrowed as the capacitance value of the capacitor Cs is increased.

Accordingly, as represented in the graph in part (a) of FIG. 2A, the band width ratio ((fas1−frs1)/frs1) of the series arm resonator s1a is wider than the band width ratio ((Fap1−Frp1)/Frp1) of the parallel arm resonant circuit 12. In addition, since the series arm resonant circuit 11 includes the series arm resonator s1a and the capacitor C1s, which are connected in parallel to each other, the band width ratio ((Fas1−Frs1)/Frs1) of the series arm resonant circuit 11 is narrower than the band width ratio ((fas1−frs1)/frs1) of the series arm resonator s1a.

Consequently, the filter 10A according to the first example is capable of ensuring the sharpness (steepness) between the pass band and the attenuation band at the high frequency side of the pass band, compared with the filter including the series arm resonator s1a and the parallel arm resonant circuit 12. In addition, since the band width ratio of the parallel arm resonant circuit 12 is narrower than the band width ratio of the series arm resonator s1a, the filter 10A according to the first example is also capable of ensuring the sharpness (steepness) between the pass band and the attenuation band at the low frequency side of the pass band. In other words, since the band width ratio of the series arm resonant circuit 11 is capable of being equal or substantially equal to the band width ratio of the parallel arm resonant circuit 12, it is possible to provide the filter in which the frequency difference between the low frequency end of the pass band and the attenuation pole at the low frequency side of the pass band is equal or substantially equal to the frequency difference between the high frequency end of the pass end and the attenuation pole at the high frequency side of the pass band and which has a high sharpness between the pass band and the attenuation band at both ends of the pass band.

As represented in the graph on the lower right side in FIG. 3, the capacitance Q value of the series arm resonant circuit is increased in the frequency band at the high frequency side of the pass band (for example, a band higher than or equal to about 0.85 GHz in FIG. 3) as the capacitance value of the capacitor Cs is increased. In the series arm resonator s1, the bulk-wave loss occurs in the band at the high frequency side of the anti-resonant frequency. In contrast, in the series arm resonant circuit according to the present preferred embodiment, since the input radio-frequency signal is subjected to the power distribution in the series arm resonator s1 and the capacitor Cs because the capacitor Cs having no bulk-wave loss in the band at the high frequency side of the anti-resonant frequency is connected in parallel to the series arm resonator s1, the capacitance Q value of the series arm resonator s1 at the high frequency side of the anti-resonant frequency of the series arm resonant circuit 11 is increased. Increasing the capacitance Q value at the high frequency side of the anti-resonant frequency of the series arm resonant circuit 11 enables the return loss at the high frequency side of the pass band of the filter 10A to be reduced.

Bulk-wave loss, in which mechanical energy is radiated in the substrate and equivalent resistance of the surface acoustic wave resonator is increased, occurs in a stop band at the high frequency side of the anti-resonant frequency of the acoustic wave resonator. Similar bulk-wave loss occurs in a frequency area higher than a self-resonant frequency also in the capacitance element, such as an interdigital electrode, formed on the piezoelectric substrate.

1.2.2 Transmission Characteristics of Filter 10B According to Second Example As illustrated in part (b) of FIG. 2A, the filter 10B according to the second example includes the series arm resonant circuit 11 and the parallel arm resonant circuit 12, the series arm resonant circuit 11 includes the series arm resonator sib and the capacitor C2s, which are connected in series to each other, and the parallel arm resonant circuit 12 includes a parallel arm resonator p1b. As represented in the graph in part (b) of FIG. 2A, the band width ratio ((fas1−frs1)/frs1) of the series arm resonator sib is wider than the band width ratio ((Fap1−Frp1)/Frp1) of the parallel arm resonant circuit 12. In addition, since the series arm resonant circuit 11 includes the series arm resonator sib and the capacitor C2s, which are connected in series to each other, the band width ratio ((Fas1−Frs1)/Frs1) of the series arm resonant circuit 11 is narrower than the band width ratio ((fas1−frs1)/frs1) of the series arm resonator sib. Accordingly, the filter 10B according to the second example is able to ensure the sharpness (steepness) between the pass band and the attenuation band at the high frequency side of the pass band, compared with the filter including the series arm resonator sib and the parallel arm resonant circuit 12. In addition, since the band width ratio of the parallel arm resonant circuit 12 is narrower than the band width ratio of the series arm resonator sib, the filter 10B according to the second example is also able to ensure the sharpness (steepness) between the pass band and the attenuation band at the low frequency side of the pass band.

Also in the filter 10B according to the second example, since the radio-frequency signal input through the input/output terminal 110 or the input/output terminal 120 is subjected to the power distribution in the series arm resonator sib and the capacitor C2s because of the capacitor C2s that is connected in series, the capacitance Q value of the series arm resonator sib at the high frequency side of the anti-resonant frequency of the series arm resonant circuit 11 is improved. This increases the capacitance Q value of the series arm resonant circuit 11 in the frequency band at the high frequency side of the pass band. The improved capacitance Q value at the high frequency side of the anti-resonant frequency of the series arm resonant circuit 11 enables the return loss at the high frequency side of the pass band of the filter 10B to be reduced.

1.2.3 Transmission Characteristics of Filter According to First Comparative Example As illustrated in part (a) of FIG. 2B, the filter according to the first comparative example includes a series arm resonator s2a and a parallel arm resonator p2a. As represented in the graph in part (a) of FIG. 2B, the band width ratio ((fas2−frs2)/frs2) of the series arm resonator s2a is equal or substantially equal to the band width ratio ((fap2−frp2)/frp2) of the parallel arm resonator p2a and the band width ratios of the series arm resonator s2a and the parallel arm resonator p2a are equal or substantially equal to those of the parallel arm resonators p1a and p1b according to the first and second examples, respectively.

1.2.4 Transmission Characteristics of Filter According to Second Comparative Example As illustrated in part (b) of FIG. 2B, the filter according to the second comparative example includes a series arm resonator s2b and a parallel arm resonator p2b. As represented in the graph in part (b) of FIG. 2B, the band width ratio ((fas2−frs2)/frs2) of the series arm resonator s2b is equal or substantially equal to the band width ratio (fap2−frp2)/frp2) of the parallel arm resonator p2b. The band width ratio ((fas2−frs2)/frs2) of the series arm resonator s2b and the band width ratio (fap2−frp2)/frp2) of the parallel arm resonator p2b are wider than the respective band width ratios according to the first example.

1.2.5 Transmission Characteristics of Filter According to Third Comparative Example As illustrated in part (a) of FIG. 2C, the filter according to the third comparative example includes a series arm resonator s2c and a parallel arm resonator p2c. As represented in the graph in part (a) of FIG. 2C, the band width ratio ((fas2−frs2)/frs2) of the series arm resonator s2c is narrower than the band width ratio ((fap2−frp2)/frp2) of the parallel arm resonator p2c.

1.2.6 Transmission Characteristics of Filter According to Fourth Comparative Example As illustrated in part (b) of FIG. 2C, the filter according to the fourth comparative example includes a series arm resonator s2d and a parallel arm resonator p2d. As represented in the graph in part (b) of FIG. 2C, the band width ratio ((fas2−frs2)/frs2) of the series arm resonator s2d is wider than the band width ratio ((fap2−frp2)/frp2) of the parallel arm resonator p2d.

Figure 4A:
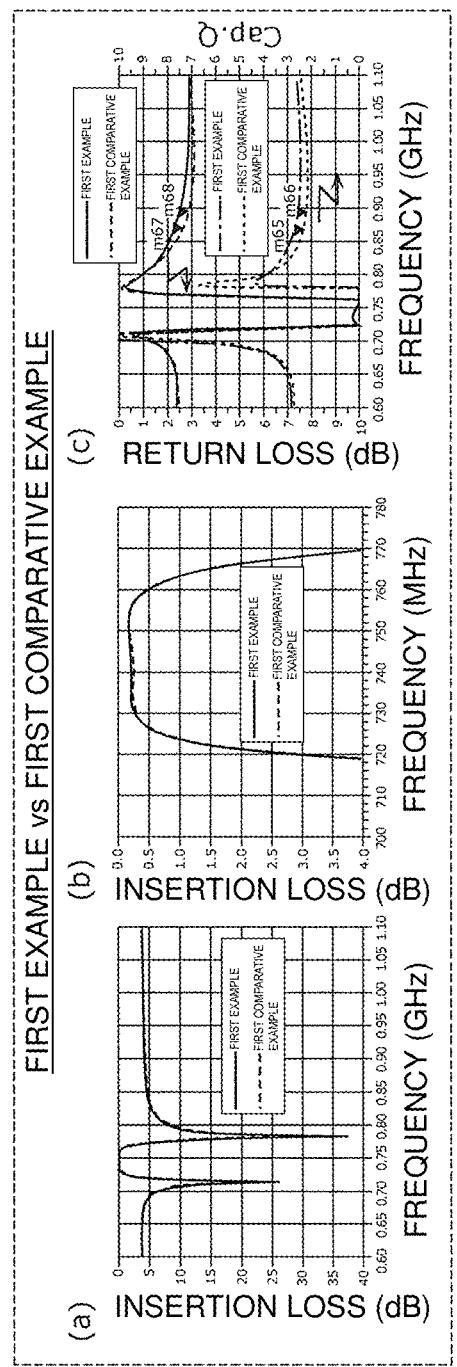
FIG. 4A includes graphs representing the results of comparison between the transmission characteristics, reflection characteristics, and the capacitance Q values of the filter apparatuses according to the first example and the first comparative example.

1.2.7 Comparison of Characteristics Between Filters According to First Example and First Comparative Example FIG. 4A includes graphs representing the results of a comparison between the transmission characteristics, reflection characteristics, and the capacitance Q values of the filters according to the first example and the first comparative example. In FIG. 4A to FIG. 5D, part (a) represents the transmission characteristics of the filters, part (b) represents the insertion losses in the pass bands of the filters, and part (c) represents the return losses of the filters and the capacitance Q values of the filters.

Since the resonant frequencies, the anti-resonant frequencies, and the band width ratios of the series arm resonant circuits and the parallel arm resonant circuits in the filter according to the first example are equal or substantially equal to those in the filter according to the first comparative example, the sharpness between the pass band and the attenuation band and the insertion loss in the pass band are substantially equal to each other, as illustrated in parts (a) and (b) of FIG. 4A.

In contrast, as illustrated in part (c) of FIG. 4A, the capacitance Q value of the filter 10A according to the first example is greater than that of the filter according to the first comparative example in the frequency band at the high frequency side of the pass band. The series arm resonator s1a is characterized in that the bulk-wave loss occurs in the frequency area at the high frequency side of the anti-resonant frequency and the Q value of the capacitance component is reduced. In contrast, in the capacitor C1s, the capacitance Q value is not degraded in the frequency area. Accordingly, since the capacitance Q value in the frequency area of the filter 10A according to the first example is improved, compared with that of the filter according to the first comparative example, because the radio-frequency signal input into the filter is subjected to the power distribution in the series arm resonator s1a and the capacitor C1s, the return loss at the high frequency side of the pass band is reduced.

Figure 4B:
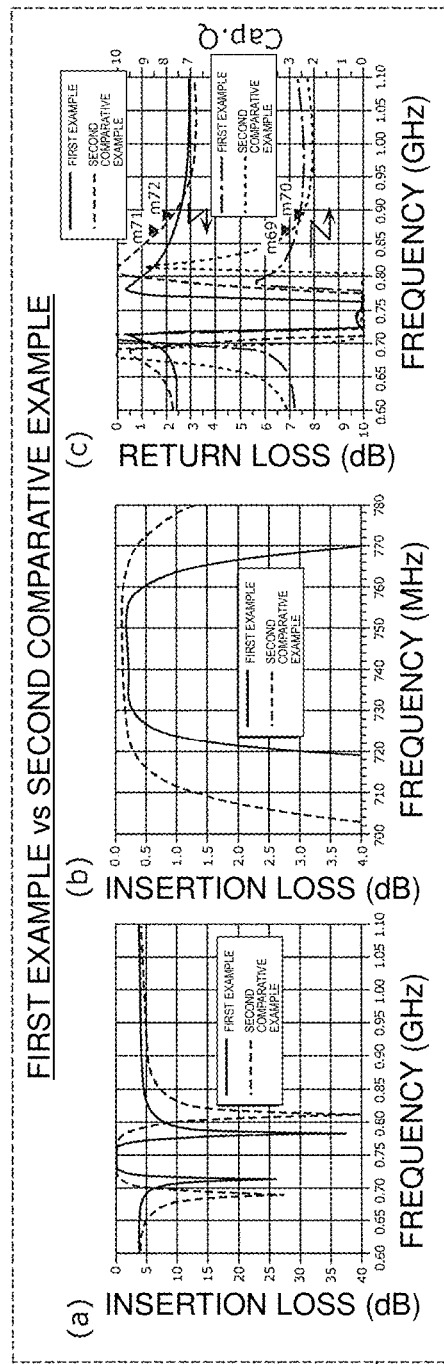
FIG. 4B includes graphs representing the results of comparison between the transmission characteristics, the reflection characteristics, and the capacitance Q values of the filter apparatuses according to the first example and the second comparative example.

1.2.8 Comparison of Characteristics Between Filters According to First Example and Second Comparative Example FIG. 4B includes graphs representing the results of comparison between the transmission characteristics, the reflection characteristics, and the capacitance Q values of the filters according to the first example and the second comparative example.

The band width ratios of the series arm resonant circuit and the parallel arm resonant circuit of the filter according to the second comparative example are higher than those of the filter 10A according to the first example. Accordingly, the sharpness (steepness) between the pass band and the attenuation band is degraded, as illustrated in part (a) of FIG. 4B, although the insertion loss in the pass band is good, as illustrated in part (b) of FIG. 4B.

In addition, as illustrated in part (c) of FIG. 4B, in the band at the high frequency side near the pass band, the attenuation pole at the high frequency side of the pass band, which is defined by the anti-resonant frequency of the series arm resonant circuit, is toward the higher frequencies in the filter according to the second comparative example, compared with that in the filter 10A according to the first example. Accordingly, the return loss is reduced in the filter according to the second comparative example, compared with that in the filter 10A according to the first example. In contrast, in the band at the high frequency side spaced apart from the pass band, the capacitance Q value of the filter 10A according to the first example is higher than that of the filter according to the second comparative example and the return loss in the band at the high frequency side spaced apart from the pass band is reduced in the filter 10A according to the first example, compared with that in the filter according to the second comparative example.

Figure 4C:
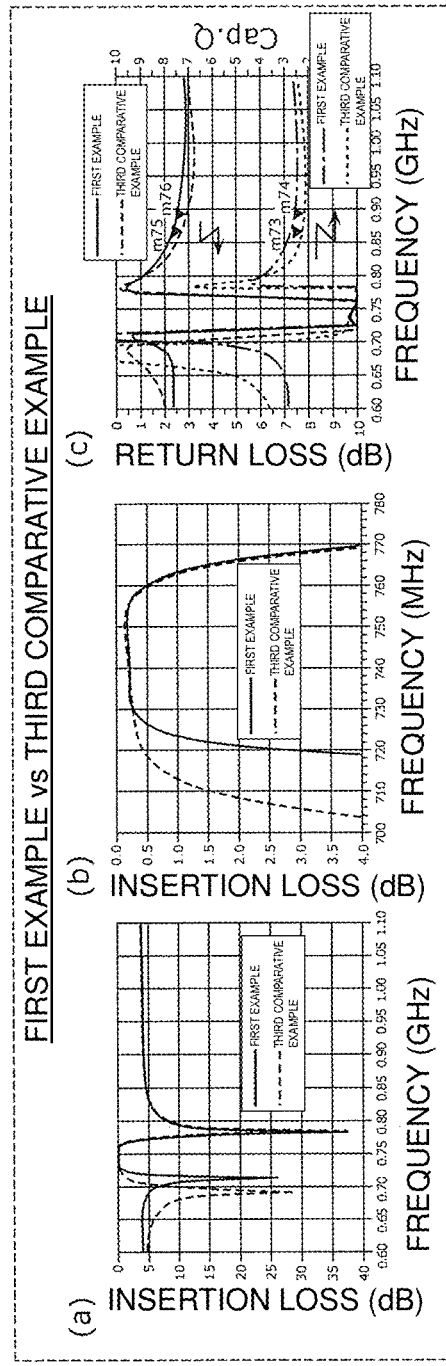
FIG. 4C includes graphs representing the results of comparison between the transmission characteristics, the reflection characteristics, and the capacitance Q values of the filter apparatuses according to the first example and the third comparative example.

1.2.9 Comparison of Characteristics Between Filters According to First Example and Third Comparative Example FIG. 4C includes graphs representing the results of comparison between the transmission characteristics, the reflection characteristics, and the capacitance Q values of the filters according to the first example and the third comparative example.

Although the band width ratio of the series arm resonant circuit in the filter according to the third comparative example is equal or substantially equal to that in the filter 10A according to the first example, the band width ratio of the parallel arm resonant circuit in the filter according to the third comparative example is higher than that in the filter 10A according to the first example. Accordingly, the sharpness (steepness) between the pass band and the attenuation band at the low frequency side of the pass band is degraded in the filter according to the third comparative example, as illustrated in part (a) of FIG. 4C, although the insertion loss in the pass band in the filter according to the third comparative example is equal or substantially equal to that in the filter 10A according to the first example, as illustrated in part (b) of FIG. 4C.

In addition, as illustrated in part (c) of FIG. 4C, in the frequency band at the high frequency side of the pass band, the capacitance Q value of the filter 10A according to the first example is higher than that of the filter according to the third comparative example. This is because the radio-frequency signal input into the filter is subjected to the power distribution in the series arm resonator s1a and the capacitor C1s. Accordingly, the return loss at the high frequency side of the pass band is reduced in the filter 10A according to the first example, compared with that in the filter according to the third comparative example.

Figure 4D:
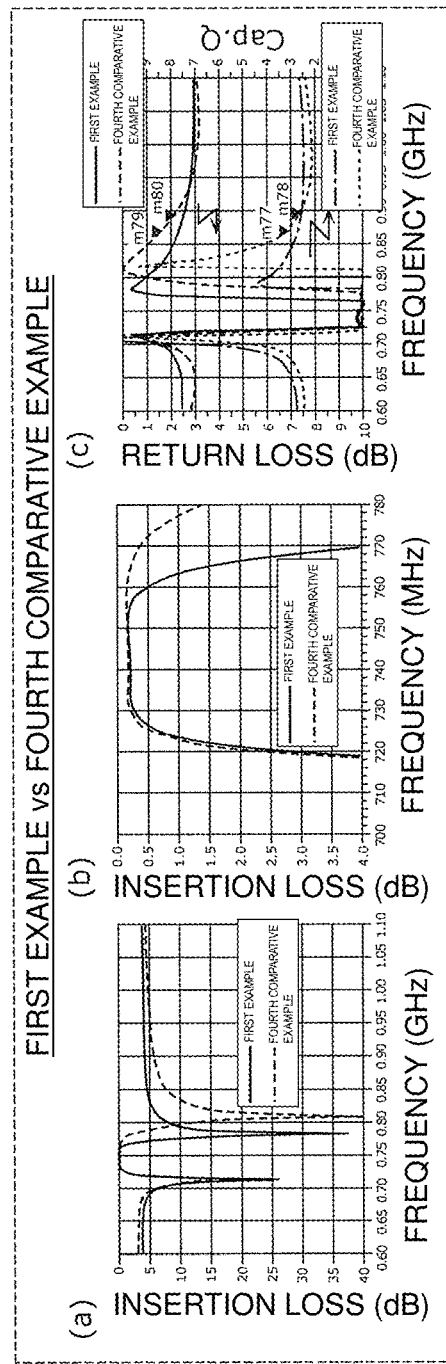
FIG. 4D includes graphs representing the results of comparison between the transmission characteristics, the reflection characteristics, and the capacitance Q values of the filter apparatuses according to the first example and the fourth comparative example.

1.2.10 Comparison of Characteristics Between Filters According to First Example and Fourth Comparative Example FIG. 4D includes graphs representing the results of comparison between the transmission characteristics, the reflection characteristics, and the capacitance Q values of the filters according to the first example and the fourth comparative example.

Although the band width ratio of the parallel arm resonant circuit in the filter according to the fourth comparative example is equal or substantially equal to that in the filter 10A according to the first example, the band width ratio of the series arm resonant circuit in the filter according to the fourth comparative example is higher than that in the filter 10A according to the first example. Accordingly, the sharpness (steepness) between the pass band and the attenuation band at the high frequency side of the pass band is degraded in the filter according to the fourth comparative example, as illustrated in part (a) of FIG. 4D, although the insertion loss in the pass band in the filter according to the fourth comparative example is equal or substantially equal to that in the filter 10A according to the first example, as illustrated in part (b) of FIG. 4D.

In addition, as illustrated in part (c) of FIG. 4D, in the band at the high frequency side near the pass band, the attenuation pole at the high frequency side of the pass band, which is defined by the anti-resonant frequency of the series arm resonant circuit, is toward the high frequencies in the filter according to the fourth comparative example, compared with that in the filter 10A according to the first example. Accordingly, the return loss is reduced in the filter according to the fourth comparative example, compared with that in the filter 10A according to the first example. In contrast, in the band at the high frequency side spaced apart from the pass band, the capacitance Q value of the filter 10A according to the first example is higher than that of the filter according to the fourth comparative example and the return loss in the band at the high frequency side spaced apart from the pass band is reduced in the filter 10A according to the first example, compared with that in the filter according to the fourth comparative example.

Figure 5A:
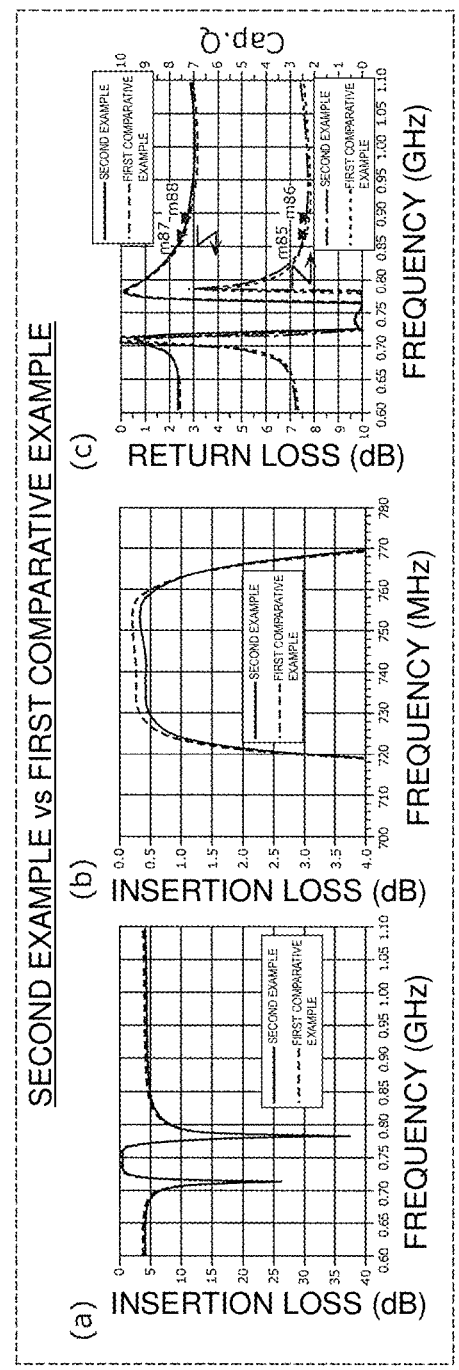
FIG. 5A includes graphs representing the results of comparison between the transmission characteristics, the reflection characteristics, and the capacitance Q values of the filter apparatuses according to the second example and the first comparative example.

1.2.11 Comparison of Characteristics Between Filters According to Second Example and First Comparative Example FIG. 5A includes graphs representing the results of comparison between the transmission characteristics, the reflection characteristics, and the capacitance Q values of the filters according to the second example and the first comparative example.

Since the resonant frequencies, the anti-resonant frequencies, and the band width ratios of the series arm resonant circuits and the parallel arm resonant circuits in the filter according to the second example are equal or substantially equal to those in the first comparative example, the sharpness between the pass band and the attenuation band in the filter according to the second example is equal substantially equal to that in the filter according to the first comparative example, as illustrated in part (a) of FIG. 5A. The insertion loss in the pass band in the filter according to the first comparative example is reduced, compared with that in the filter according to the second example, as illustrated in part (b) of FIG. 5A. This is because, since the resonant frequency of the series arm resonator is shifted toward the high frequencies with the capacitor C2s, the Q of the resonant frequency of the series arm resonant circuit, which defined by the pass band of the filter according to the second example, is reduced due to the resistance component of the capacitor C2s to increase the insertion loss in the pass band.

In contrast, as illustrated in part (c) of FIG. 5A, the capacitance Q value of the filter 10B according to the second example is greater than that of the filter according to the first comparative example in the frequency band at the high frequency side of the pass band. The series arm resonator sib is characterized in that the bulk-wave loss occurs in the frequency area at the high frequency side of the anti-resonant frequency and the Q value of the capacitance component is reduced. In contrast, in the capacitor C2s, the capacitance Q value is not degraded in the frequency area. Accordingly, the capacitance Q value in the frequency area in the filter 10B according to the second example is improved, compared with that in the filter according to the first comparative example, because the radio-frequency signal input into the filter is subjected to the power distribution in the series arm resonator sib and the capacitor C2s to reduce the return loss at the high frequency side of the pass band.

Figure 5B:
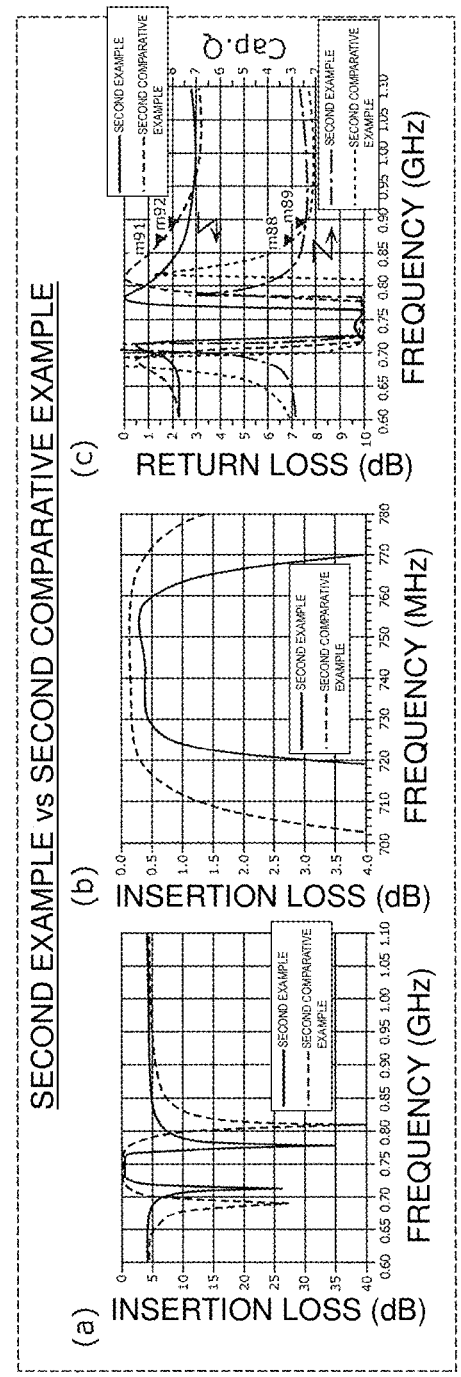
FIG. 5B includes graphs representing the results of comparison between the transmission characteristics, the reflection characteristics, and the capacitance Q values of the filter apparatuses according to the second example and the second comparative example.

1.2.12 Comparison of Characteristics Between Filters According to Second Example and Second Comparative Example FIG. 5B includes graphs representing the results of comparison between the transmission characteristics, the reflection characteristics, and the capacitance Q values of the filters according to the second example and the second comparative example.

The band width ratios of the series arm resonant circuit and the parallel arm resonant circuit in the filter according to the second comparative example are higher than those in the filter 10B according to the second example. Accordingly, the sharpness (steepness) between the pass band and the attenuation band is degraded in the filter according to the second comparative example, as illustrated in part (a) of FIG. 5B, although the insertion loss in the pass band is good, as illustrated in part (b) of FIG. 5B.

In addition, as illustrated in Fig. part (c) of 5B, in the band at the high frequency side near the pass band, the attenuation pole at the high frequency side of the pass band, which is defined by the anti-resonant frequency of the series arm resonant circuit, is toward the high frequencies in the filter according to the second comparative example, compared with that in the filter 10B according to the second example. Accordingly, the return loss is reduced in the filter according to the second comparative example, compared with that in the filter 10B according to the second example. In contrast, in the band at the high frequency side spaced apart from the pass band, the capacitance Q value of the filter 10B according to the second example is higher than that of the filter according to the second comparative example and the return loss in the band at the high frequency side spaced apart from the pass band is reduced in the filter 10B according to the second example, compared with that in the filter according to the second comparative example.

Figure 5C:
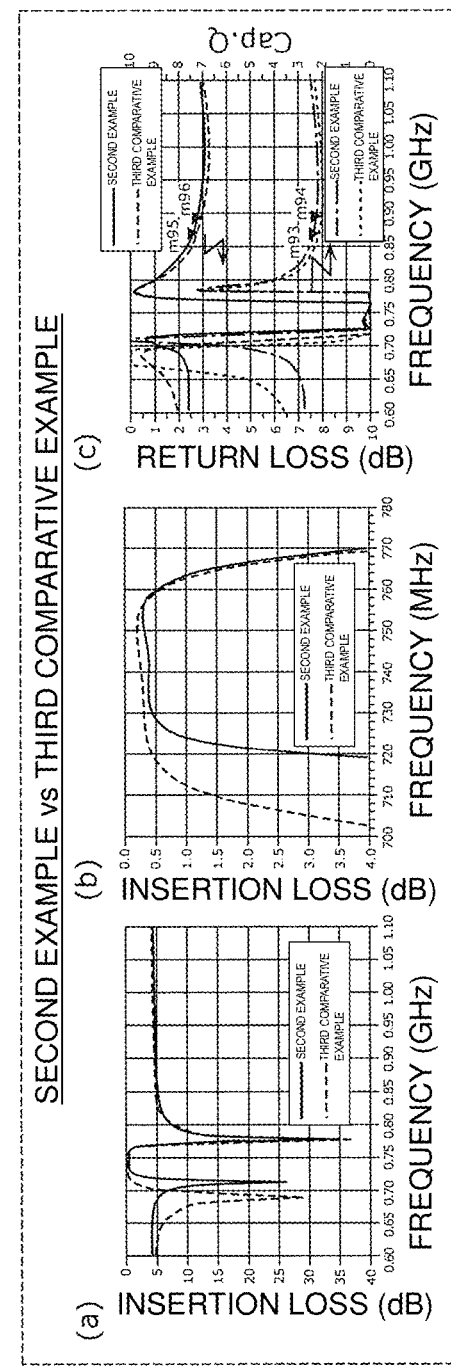
FIG. 5C includes graphs representing the results of comparison between the transmission characteristics, the reflection characteristics, and the capacitance Q values of the filter apparatuses according to the second example and the third comparative example.

1.2.13 Comparison of Characteristics Between the Filters According to Second Example and Third Comparative Example FIG. 5C includes graphs representing the results of comparison between the transmission characteristics, the reflection characteristics, and the capacitance Q values of the filters according to the second example and the third comparative example.

Although the band width ratio of the series arm resonant circuit in the filter according to the third comparative example is equal or substantially equal to that in the filter 10B according to the second example, the band width ratio of the parallel arm resonant circuit in the filter according to the third comparative example is higher than that in the filter 10B according to the second example. Accordingly, the sharpness (steepness) between the pass band and the attenuation band at the low frequency side of the pass band is degraded in the filter according to the third comparative example, as illustrated in Fig. part (a) of 5C, although the insertion loss in the pass band in the filter according to the third comparative example is good, as illustrated in part (b) of FIG. 5C.

In addition, as illustrated in part (c) of FIG. 5C, in the frequency band at the high frequency side of the pass band, the capacitance Q value of the filter 10B according to the second example is higher than that of the filter according to the third comparative example. This is because the radio-frequency signal input into the filter is subjected to the power distribution in the series arm resonator sib and the capacitor C2s. Accordingly, the return loss at the high frequency side of the pass band is reduced in the filter 10B according to the second example, compared with that in the filter according to the third comparative example.

Figure 5D:
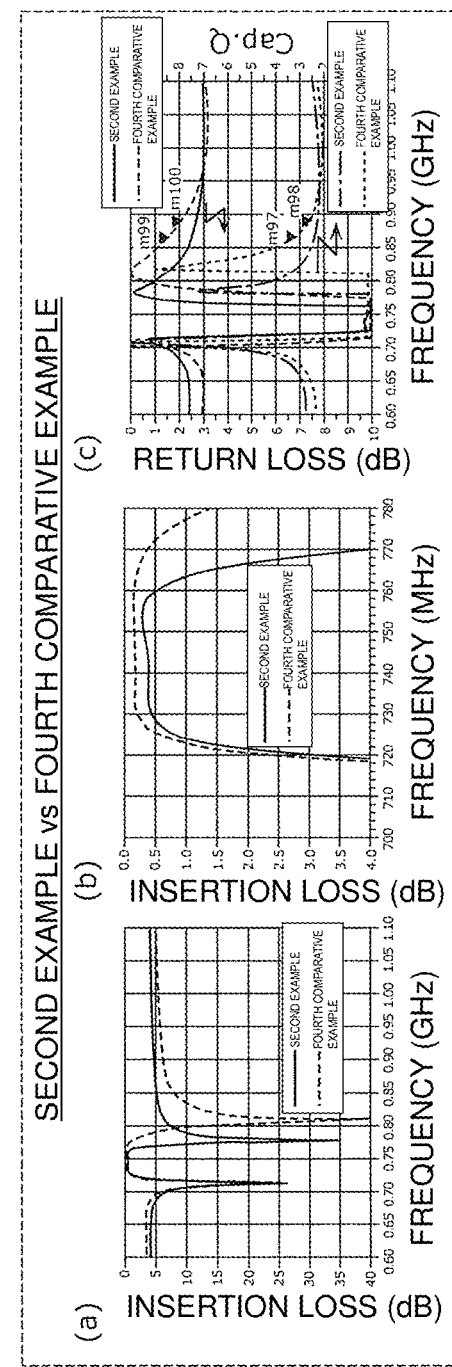
FIG. 5D includes graphs representing the results of comparison between the transmission characteristics, the reflection characteristics, and the capacitance Q values of the filter apparatuses according to the second example and the fourth comparative example.

1.2.14 Comparison of Characteristics Between the Filters According to Second Example and Fourth Comparative Example FIG. 5D includes graphs representing the results of comparison between the transmission characteristics, the reflection characteristics, and the capacitance Q values of the filters according to the second example and the fourth comparative example.

Although the band width ratio of the parallel arm resonant circuit in the filter according to the fourth comparative example is equal or substantially equal to that in the filter 10B according to the second example, the band width ratio of the series arm resonant circuit in the filter according to the fourth comparative example is higher than that in the filter 10B according to the second example. Accordingly, the sharpness (steepness) between the pass band and the attenuation band at the high frequency side of the pass band is degraded in filter according to the fourth comparative example, as illustrated in part (a) of FIG. 5D, although the insertion loss in the pass band in the filter according to the fourth comparative example is good, as illustrated in part (b) of FIG. 5D.

In addition, as illustrated in part (c) of FIG. 5D, in the band at the high frequency side near the pass band, the attenuation pole at the high frequency side of the pass band, which is defined by the anti-resonant frequency of the series arm resonant circuit, is toward the high frequencies in the filter according to the fourth comparative example, compared with that in the filter 10B according to the second example. Accordingly, the return loss is reduced in the filter according to the fourth comparative example, compared with that in the filter 10B according to the second example. In contrast, in the band at the high frequency side spaced apart from the pass band, the capacitance Q value of the series arm resonant circuit in the filter 10B according to the second example is higher than that in the filter according to the fourth comparative example and the return loss in the band at the high frequency side spaced apart from the pass band is reduced in the filter 10B according to the second example, compared with that in the filter according to the fourth comparative example.

Figure 6:
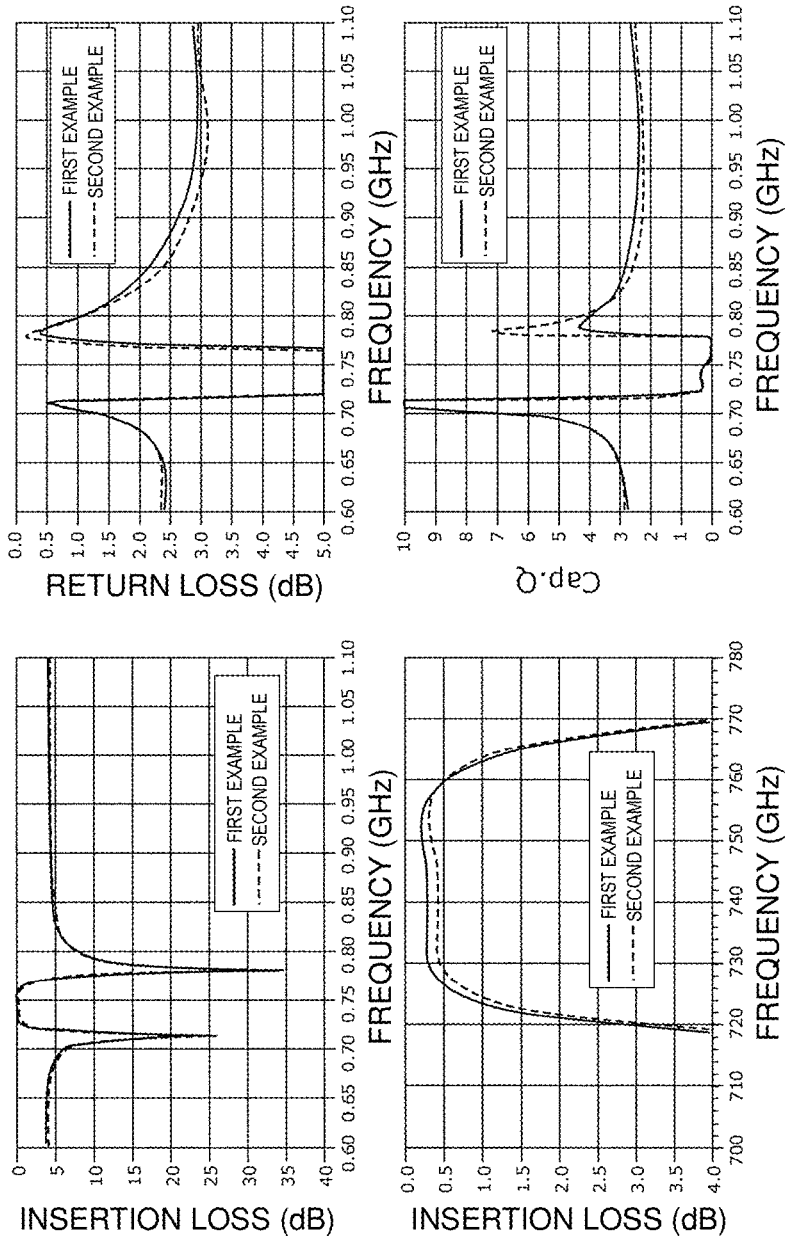
FIG. 6 includes graphs representing the results of comparison between the transmission characteristics, the reflection characteristics, and the capacitance Q values of the filter apparatuses according to the first example and the second example.

1.2.15 Comparison of Characteristics Between Filters According to First Example and Second Example FIG. 6 includes graphs representing the results of comparison between the transmission characteristics, the reflection characteristics, and the capacitance Q values of the filters according to the first example and the second example.

As represented in a graph on the upper left side in FIG. 6, the attenuation characteristic outside the pass band of the filter 10A according to the first example is equal or substantially equal to that of the filter 10B according to the second example. In contrast, as represented in a graph on the lower left side in FIG. 6, the insertion loss in the pass band is reduced in the filter 10A according to the first example, compared with that in the filter 10B according to the second example. In addition, as represented in graphs on the right side in FIG. 6, the capacitance Q value in the frequency band at the high frequency side of the pass band in the filter 10A according to the first example is higher than that in the filter 10B according to the second example and, thus, the return loss is reduced in the filter 10A according to the first example.

As described above, with the filter 10A according to the first example and the filter 10B according to the second example, the sharpness (steepness) between the pass band and the attenuation band at the high frequency side of the pass band is able to be ensured. In addition, the sharpness (steepness) between the pass band and the attenuation band at the low frequency side of the pass band is able to be ensured. Furthermore, the return loss at the high frequency side of the pass band is able to be reduced.

The insertion loss in the pass band in the filter 10A according to the first example is better than that in the filter 10B according to the second example, and the return loss in the frequency band at the high frequency side of the pass band is reduced in the filter 10A according to the first example, compared with that in the filter 10B according to the second example.

1.3 Structure of Filter 10

Figure 7:
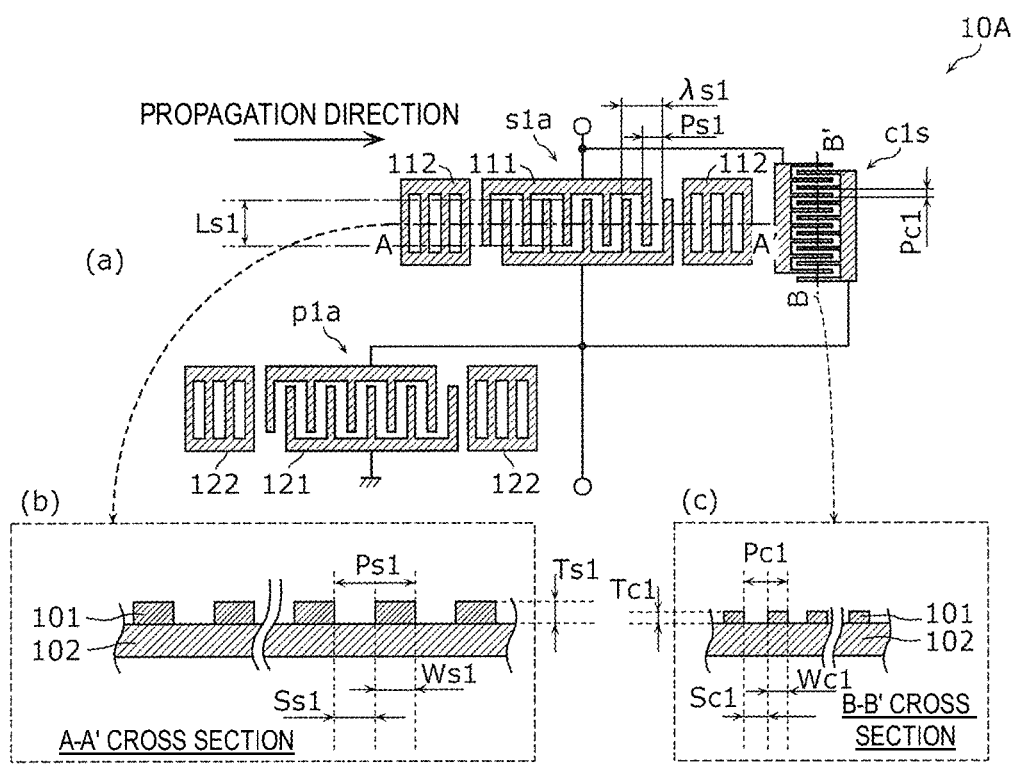
FIG. 7 includes diagrams schematically illustrating the electrode structure of the filter apparatus according to the first preferred embodiment of the present invention.

FIG. 7 includes diagrams schematically illustrating the electrode structure of the filter 10A according to the first example. Specifically, part (a) of FIG. 7 is a plan view, part (b) of FIG. 7 is a cross-sectional view taken along the A-A' line in part (a) of FIG. 7, and part (c) of FIG. 7 is a cross-sectional view taken along the B-B' line in part (a) of FIG. 7. The electrode structure illustrated in FIG. 7 describes a typical structure of the series arm resonator s1a, the parallel arm resonator p1a, and an interdigital capacitor electrode of the capacitor C1s, which define the filter 10A. Accordingly, the number, the lengths, and so on of electrode fingers defining an IDT electrode of each resonator and the interdigital capacitor electrode in the filter 10A are not limited to the number and the lengths illustrated in FIG. 7. The electrode structure of the filter 10A illustrated in FIG. 7 is applied to the filter 10B according to the second example although the connection relationship of the capacitor C2s in the filter 10B according to the second example is different from that in the filter 10A according to the first example.

As illustrated in FIG. 7, each resonator of the filter 10A is preferably, for example, an acoustic wave resonator using acoustic waves. Accordingly, since the filter 10A is defined by the IDT electrodes provided on a piezoelectric substrate 102, it is possible to provide a compact low-profile filter circuit having the transmission characteristics with a high sharpness.

The series arm resonator s1a includes an IDT electrode 111, a pair of reflectors 112, and the piezoelectric substrate 102. The parallel arm resonator p1a includes an IDT electrode 121, a pair of reflectors 122, and the piezoelectric substrate 102.

As illustrated in parts (a) and (b) of FIG. 7, the IDT electrode 111 in the series arm resonator s1a and the IDT electrode 121 in the parallel arm resonator p1a include an electrode film 101 and the electrode film 101 is provided on the piezoelectric substrate 102.

The IDT electrodes 111 and 121 each include a plurality of electrode fingers and a pair of busbar electrodes that are opposed to each other with the plurality of electrode fingers interposed therebetween. The IDT electrodes 111 and 121 are each defined by alternately connecting the plurality of electrode fingers to one and the other of the pair of busbar electrodes. The plurality of electrode fingers extend in a direction orthogonal or substantially orthogonal to the propagation direction of the acoustic waves and are periodically disposed along the propagation direction.

In the series arm resonator s1a and the parallel arm resonator p1a described above, the wavelength of the acoustic waves that are excited is determined by, for example, design parameters of the IDT electrodes 111 and 121. The design parameters of the IDT electrode 111 will now be described.

The wavelength of the acoustic waves is determined by a repetition period λs1 of the electrode fingers connected to one busbar electrode, among the plurality of electrode fingers. An electrode finger pitch (the pitch of the multiple electrode fingers, that is, an electrode finger period) Ps1 is equal or substantially equal to about ½ of the repetition period λs1 and is defined as Ps1=(Ws1+Ss1) where the line width of the electrode fingers is denoted by Ws1 and the space width between adjacent electrode fingers is denoted by Ss1. An intersecting width Ls1 of the IDT electrode 111 means the overlapping length of the electrode fingers when the electrode fingers connected to one of the pair of the busbar electrodes and the electrode fingers connected to the other thereof are viewed from the propagation direction of the acoustic waves. An electrode duty (duty ratio) means a line width portion of the plurality of electrode fingers and is defined as the ratio of the line width to a value calculated by adding the line width of the plurality of electrodes to the space width, that is, Ws1/(Ws1+Ss1). In other words, the electrode duty is defined as the ratio of the width of the plurality of electrodes to the electrode finger pitch (the pitch of the multiple electrode fingers), that is, Ws1/Ps1. The number of pairs means the number of the electrode fingers that are paired and is equal to about half of the total number of the electrode fingers. For example, when the number of pairs is denoted by Ns1 and the total number of electrode fingers is denoted by Ms1, Ms1=2Ns1+1. The film thickness of the electrode fingers is a thickness Ts1 of the electrode film 101 defining the electrode fingers. An electrostatic capacitance $C_0$ of the acoustic wave resonator is represented by Equation 1:

$$\text{Electrostatic capacity } C_0 = \frac{\varepsilon_0 \cdot \varepsilon_r \cdot \text{Number of pairs} \cdot \text{Intersecting width}}{2 \cdot (1 - \text{Electrode duty})} \quad \text{(Equation 1)}$$

In Equation 1, $\varepsilon_0$ denotes the permittivity in a vacuum and $\varepsilon r$ denotes the permittivity of the piezoelectric substrate 102. Next, the structure of the capacitor C1s will be described.

The capacitor C1s includes the piezoelectric substrate 102 and the interdigital capacitor electrode provided on the piezoelectric substrate 102. The interdigital capacitor electrode is composed of multiple electrode fingers. As illustrated in FIG. 7(a) and FIG. 7(c), the interdigital capacitor electrode includes the electrode film 101, similar to the IDT electrode 111. In other words, the interdigital capacitor electrode of the capacitor C1s is preferably provided on the same piezoelectric substrate 102 as that of the IDT electrode 111 of the series arm resonator s1a. The interdigital capacitor electrode and the IDT electrode 111 may be provided on different piezoelectric substrates.

The interdigital capacitor electrode includes a plurality of electrode fingers and a pair of busbar electrodes that are opposed to each other with the plurality of electrode fingers interposed therebetween. The interdigital capacitor electrode is defined by alternately connecting the plurality of electrode fingers to one and the other of the pair of busbar electrodes. The plurality of electrode fingers are disposed along the propagation direction of the acoustic waves and are periodically disposed along a direction orthogonal or substantially orthogonal to the propagation direction.

In the capacitor C1s described above, the characteristics including the capacitance value, the Q value, and so on are determined by, for example, design parameters of the interdigital capacitor electrode. The design parameters of the interdigital capacitor electrode will now be described.

An electrode finger pitch (the pitch of the electrode fingers, that is, an electrode finger period) Pc1 of the interdigital capacitor electrode is defined as Pc1=Wc1+Sc1 where the line width of the electrode fingers is denoted by Wc1 and the space width between adjacent electrode fingers is denoted by Sc1. An electrode duty (duty ratio) means a line width portion of the plurality of electrode fingers and is defined as the ratio of the line width to a value calculated by adding the line width of the multiple electrodes to the space width, that is, Wc1/(Wc1+Sc1). In other words, the electrode duty is defined as the ratio of the width of the multiple electrodes to the pitch of the multiple electrode fingers, that is, Wc1/Pc1. The number of pairs means the number of the electrode fingers that are paired and is equal to about half of the total number of the electrode fingers. For example, when the number of pairs is denoted by Nc1 and the total number of electrode fingers is denoted by Mc1, Mc1=2Nc1+1. The film thickness of the electrode fingers is a thickness Tc1 of the electrode film 101 defining the electrode fingers. An electrostatic capacitance $C_c$ of the interdigital capacitor electrode is represented by Equation 2:

$$\text{Electrostatic capacity } C_C = \frac{\varepsilon_0 \cdot \varepsilon_r \cdot \text{Number of pairs} \cdot \text{Intersecting width}}{2 \cdot (1 - \text{Electrode duty})} \quad \text{(Equation 2)}$$

In Equation 2, $\varepsilon_0$ denotes the permittivity in a vacuum and $\varepsilon r$ denotes the permittivity of the piezoelectric substrate 102.

The design parameters of the interdigital capacitor electrode of the capacitor C1s will now be compared with the design parameters of the IDT electrode 111 of the series arm resonator s1a connected to the capacitor C1s for description.

The electrode finger pitch of the capacitor C1s is narrower than the electrode finger pitch of the series arm resonator s1a. In other words, Pc1<Ps1. Here, the pitch of the multiple electrode fingers in the capacitor C1s is preferably about 80% or less, for example, of the pitch of the multiple electrode fingers in the series arm resonator s1a (that is, Pc1≤0.8×Ps1=0.4×λs1).

The film thickness of the plurality of electrode fingers in the capacitor C1s is smaller than the film thickness of the multiple electrode fingers in the series arm resonator s1a. In other words, Tc1<Ts1. Here, for manufacturing reasons, in the capacitor C1s, the film thickness Tc1 of the electrode fingers is preferably about 40% or less, for example, of the electrode finger pitch Pc1 (that is, Tc1≤0.40×Pc1). For the same reasons, in the series arm resonator s1a, the film thickness Ts1 of the electrode fingers is preferably about 40% or less, for example, of the electrode finger pitch Ps1 (that is, Ts1≤0.40×Ps1). Although the lower limit of the film thickness Tc1 is not specifically limited, for example, the lower limit of the film thickness Tc1 is preferably about 15% or more, for example, of the electrode finger pitch Pc1 (that is, 0.15×Pc1≤Tc1). Similarly, although the lower limit of the film thickness Ts1 is not specifically limited, for example, the lower limit of the film thickness Ts1 is preferably about 15% or more, for example, of the electrode finger pitch Ps1 (that is, 0.15×Ps1≤Ts1).

The electrode duty of the capacitor C1s is preferably greater than the electrode duty of the series arm resonator s1a. In other words, the capacitor C1s and the series arm resonator s1a preferably meet Wc1/Pc1>Ws1/Ps1. With such a configuration, since the capacitance value per unit area of the interdigital capacitor electrode is capable of being increased, it is possible to reduce the size and save the space.

In each element (each of the series arm resonator s1a, the parallel arm resonator p1a, and the capacitor C1s), the electrode finger pitch, the film thickness, the electrode duty, and so on are not necessarily uniform and may be non-uniform because of a variation caused by, for example, the manufacturing process or may be non-uniform because of adjustment of the characteristics or the likes. Accordingly, a portion of the interdigital electrode and the IDT electrode of the capacitor C1s and the series arm resonator s1a, respectively, may not meet the relationship of the electrode finger pitch, the film thickness, the electrode duty, and so on described above. In other words, it is sufficient for the relationship of the electrode finger pitch, the film thickness, and the electrode duty described above between the capacitor C1s and the series arm resonator s1a to be approximately established. For example, it is sufficient for the above relationship to be established between the average value of the capacitor C1s and the average value of the series arm resonator s1a.

1.4 Detailed Structure of Electrode Fingers

Next, the structure of the electrode fingers of the IDT electrode 111 and the electrode fingers of the interdigital capacitor electrode will be described, including the configuration of the piezoelectric substrate 102 on which the electrode fingers are provided and protective layers (described below). Although the electrode fingers of the IDT electrode 111 and the electrode fingers of the interdigital capacitor electrode are defined by the common electrode film 101, except that the IDT electrode 111 differs from the interdigital capacitor electrode in the film thickness in the present preferred embodiment, the electrode fingers of the IDT electrode 111 and the electrode fingers of the interdigital capacitor electrode may be defined by electrode films having different structures or compositions.

Figure 8A:
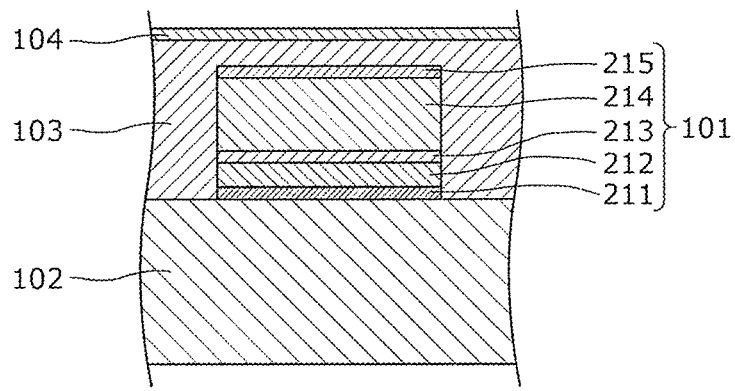
FIG. 8A is a cross-sectional view of the structure of an electrode film and around the electrode film in the first preferred embodiment of the present invention.

FIG. 8A is a cross-sectional view illustrating a first example of the structure of the electrode film 101 composing the electrode fingers of the IDT electrode 111 and the electrode fingers of the interdigital capacitor electrode and around the electrode film 101 in the first preferred embodiment.

As illustrated in FIG. 8A, in the present preferred embodiment, the electrode film 101 preferably includes, for example, a metal film 211 made of NiCr, a metal film 212 made of Pt, a metal film 213 made of Ti, a metal film 214 made of AlCu, and a metal film 215 made of Ti that are laminated in this order from the piezoelectric substrate 102 side.

Here, the piezoelectric substrate 102 is preferably made of $LiNbO_3$ piezoelectric single crystal, for example. It is sufficient for the piezoelectric substrate 102 to be a substrate at least partially having piezoelectricity. For example, the piezoelectric substrate 102 may preferably include a multi-layer body including a piezoelectric thin film (piezoelectric material) on the surface, a film having an acoustic velocity different from that of the piezoelectric thin film, a support substrate, and so on. The entire piezoelectric substrate 102 may have piezoelectricity. In this case, the piezoelectric substrate 102 is a piezoelectric substrate composed of one piezoelectric layer.

The electrode film 101 may preferably be covered with a second adjustment film that protects the electrode film 101 from the external environment and that adjusts the band width ratios (electromechanical coupling coefficients) of the series arm resonator s1a and the parallel arm resonator p1a. The second adjustment film preferably includes, for example, a protective layer 103 made of $SiO_2$ and a protective layer 104 made of SiN that are laminated in this order from the piezoelectric substrate 102 side in the present preferred embodiment. The second adjustment film also adjusts frequency temperature characteristics, improves the moisture resistance, and so on.

Figure 8B:
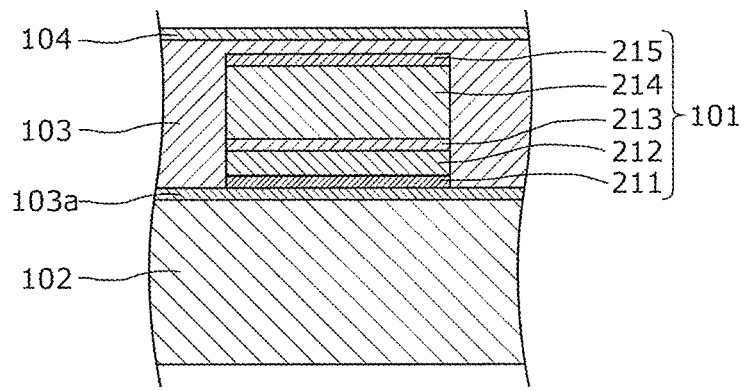
FIG. 8B is a cross-sectional view of another example of the structure of the electrode film and around the electrode film in the first preferred embodiment of the present invention.

FIG. 8B is a cross-sectional view illustrating a second example of the structure of the electrode film 101 composing the electrode fingers of the IDT electrode 111 and the electrode fingers of the interdigital capacitor electrode and around the electrode film 101 in the first preferred embodiment. As illustrated in FIG. 8B, a first adjustment film 103a that adjusts the band width ratios (the electromechanical coupling coefficients) of the series arm resonator s1a and the parallel arm resonator p1a may preferably be provided between the electrode film 101 and the piezoelectric substrate 102. The first adjustment film 103a is preferably made of, for example, $SiO_2$.

In the electrode finger structures illustrated in FIGS. 8A and 8B, the band width ratio (the electromechanical coupling coefficient) of the series arm resonator s1a or the parallel arm resonator p1a is capable of being decreased as the film thickness of the first adjustment film 103a is increased. In addition, the band width ratio (the electromechanical coupling coefficient) of the series arm resonator s1a or the parallel arm resonator p1a is capable of being decreased as the film thickness of the second adjustment film (the protective layers 103+104) is increased.

Figure 8C:
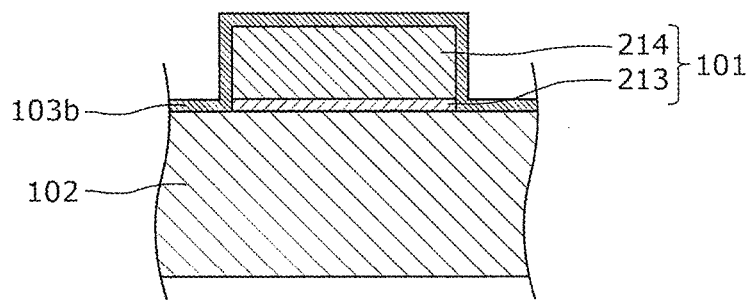
FIG. 8C is a cross-sectional view of another example of the structure of the electrode film and around the electrode film in the first preferred embodiment of the present invention.

The structure of the electrode film 101 is not limited to the structures in FIGS. 8A and 8B and the electrode film 101 may have a structure shown in FIG. 8C. The electrode film 101 illustrated in FIG. 8C includes the metal film 213 and the metal film 214 described above.

Here, the piezoelectric substrate 102 is preferably made of LiTaO$_3$ piezoelectric single crystal, for example. In addition, a protective layer 103b having a film thickness smaller than that of the protective layer 103 described above is provided.

These structures are only examples and the configuration of the electrode film 101 of the electrode fingers of the IDT electrode 111 and the electrode fingers of the interdigital capacitor electrode is not limited to those described above. For example, the electrode film 101 may be made of one metal-film layer, instead of the laminated structure of the metal films. The materials used for the respective metal films and the respective protective layers are not limited to the materials described above. In addition, the electrode film 101 may be made of, for example, metal, such as Ti, Al, Cu, Pt, Au, Ag, or Pd or alloy or may include multiple multilayer bodies made of the above metal or alloy. The piezoelectric substrate 102 may be made of, for example, KNbO$_3$ piezoelectric single crystal, crystal, or piezoelectric ceramics. The configurations of the protective layers and the adjustment films for the band width ratio (the electromechanical coupling coefficient) are not limited to the above configurations. The protective layers and the adjustment films for the band width ratio (the electromechanical coupling coefficient) may be made of, for example, a dielectric material, such as SiO$_2$, SiN, AlN, or polyimide, or may include a multilayer body of these materials or an insulating material. The protective layers 103 and 104 may not be formed.

1.5 Characteristics of Capacitor C1s

The filter 10A according to the first example is capable of having the advantages that both the Q value of the series arm resonator s1a and the Q value of the capacitor C1s are ensured by satisfying the above relationship of the electrode finger pitch and the film thickness of the series arm resonator s1a and the capacitor C1s.

This is because the characteristics of the capacitor C1s depends on the design parameters. The reason why the above advantages are achieved will now be described using a typical exemplary capacitor.

1.5.1 Relationship to Electrode Finger Pitch

The relationship between the electrode finger pitch and the characteristics will now be described using the typical exemplary capacitor. It is assumed here that the design parameters other than the electrode finger pitch are constant or substantially constant, the electrode duty is about 0.60 (that is, Wc1/Pc1=0.60), the ratio of the film thickness to the electrode finger pitch is about 0.20 (that is, Tc1=0.20×Pc1).

Figure 9A:
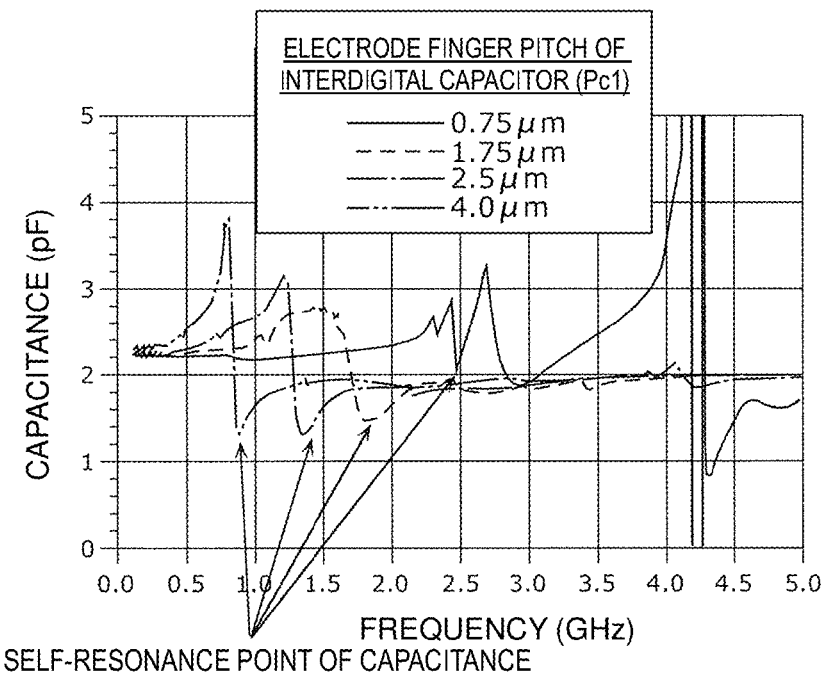
FIG. 9A is a graph representing the relationship between an electrode finger pitch of an interdigital capacitor and a capacitance value in a typical example.
Figure 9B:
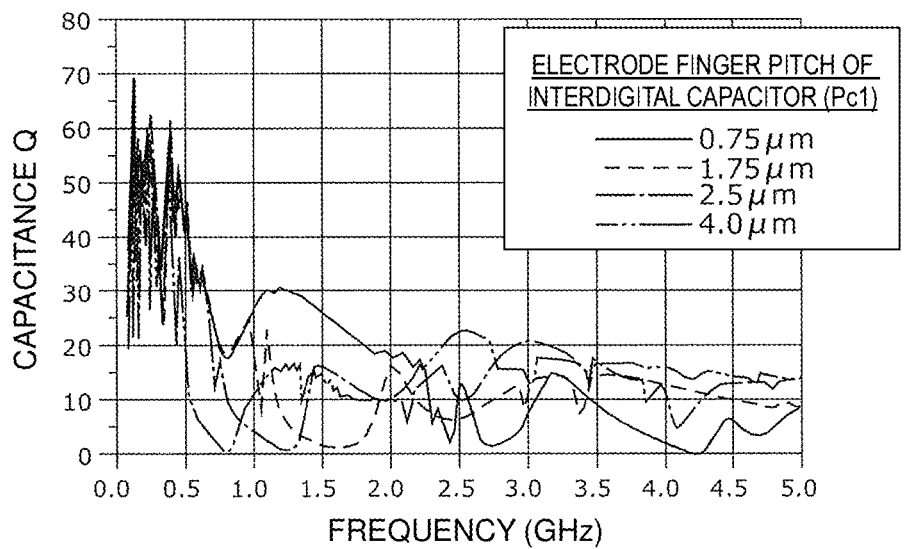
FIG. 9B is a graph representing the relationship between the electrode finger pitch of the interdigital capacitor and the capacitance Q in the typical example.

FIG. 9A is a graph representing the relationship between the electrode finger pitch Pc1 of the capacitor and the capacitance value in the typical example. FIG. 9B is a graph representing the relationship between the electrode finger pitch Pc1 of the capacitor and the Q value (the capacitance Q) in the typical example. Specifically, frequency characteristics when the electrode finger pitch Pc1 is set to about 0.75 µm, about 1.75 µm, about 2.50 µm, and about 4.00 µm are illustrated in these drawings.

As illustrated in FIG. 9A, the capacitance value is hardly varied even if the electrode finger pitch Pc1 is varied. The capacitance value here means the capacitance value (the electrostatic capacitance value) in a low frequency area in which the influence of self-resonance of the capacitor is able to be almost ignored.

The self-resonant frequency of the capacitor is shifted to the high side as the electrode finger pitch Pc1 is decreased, as illustrated in FIG. 9A. At this time, as illustrated in FIG. 9B, although the Q value (the capacitance Q) of the capacitor is generally decreased with the increasing frequency, the Q value (the capacitance Q) of the capacitor is locally decreased at the self-resonant frequency. Accordingly, shifting the self-resonant frequency of the interdigital capacitor to the high side of the pass band of the filter 10A by narrowing the electrode finger pitch Pc1 enables the Q value of the capacitor in the pass band to be increased.

In other words, the self-resonant frequency of the capacitor is shifted to the low side with the increasing electrode finger pitch Pc1. Accordingly, the self-resonant frequency may coincide with the resonant frequency or the anti-resonant frequency of the series arm resonator s1a connected to the capacitor without another acoustic wave resonator interposed therebetween. In other words, the resonant frequency or the anti-resonant frequency of the series arm resonator s1a may coincide with the frequency at which the capacitance Q is locally decreased. In this case, since the Q value at the resonant frequency or the anti-resonant frequency achieved from combined characteristics of the series arm resonator s1a and the capacitor is decreased in response to the decrease of the Q value of the capacitor, it is difficult to ensure the Q value that is required. Accordingly, shifting the self-resonant frequency of the capacitor C1s to the high side of the resonant frequency and the anti-resonant frequency of the series arm resonator s1a by narrowing the electrode finger pitch Pc1 to reduce or prevent the decrease in the Q value at the resonant frequency and the anti-resonant frequency of the combined characteristics of the series arm resonator s1a and the capacitor C1s enables the required Q value at the resonant frequency and the anti-resonant frequency to be ensured.

Since the size of the capacitor C1s is capable of being reduced while maintaining the capacitance value as the electrode finger pitch Pc1 is decreased, it is possible to reduce the size and save the space of the filter or the like including the capacitor C1s.

1.5.2 Relationship to Film Thickness of Electrode Finger

The relationship between the film thickness of the electrode fingers and the characteristics will now be described using the typical capacitor C1s. It is assumed here that the design parameters other than the film thickness of the electrode fingers are constant, the electrode duty is about 0.60 (that is, Wc1/Pc1=0.60), and the electrode finger pitch Pc1 is about 2.50 µm.

Figure 10A:
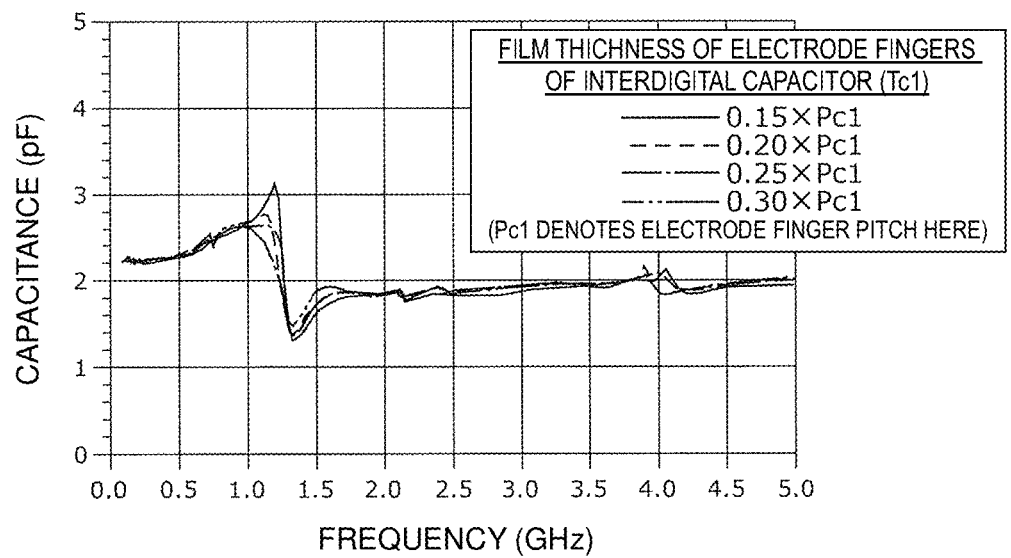
FIG. 10A is a graph representing the relationship between a film thickness of the interdigital capacitor and the capacitance value in the typical example.
Figure 10B:
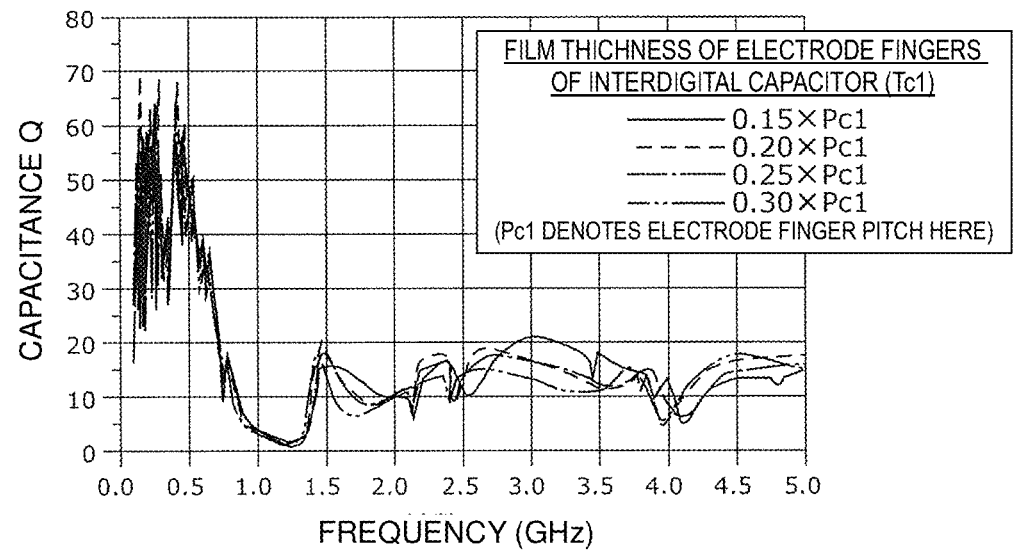
FIG. 10B is a graph representing the relationship between the film thickness of the interdigital capacitor and the capacitance Q in the typical example.

FIG. 10A is a graph representing the relationship between the film thickness Tc1 of the electrode fingers of the capacitor C1s and the capacitance value in the typical example. FIG. 10B is a graph representing the relationship between the film thickness Tc1 of the electrode fingers of the capacitor C1s and the Q value in the typical example. Specifically, the frequency characteristics when the ratio of the film thickness Tc1 to the electrode finger pitch Pc1 is set to about 0.15 µm, about 0.20 µm, about 0.25 µm, and about 0.30 µm are illustrated in these drawings.

As illustrated in these drawings, both of the capacitance value and the capacitance Q are not remarkably varied even when the film thickness Tc1 of the electrode fingers is varied. Accordingly, the film thickness Tc1 of the electrode fingers is able to be appropriately determined from the standpoint of the manufacturing.

For manufacturing reasons, the upper limit of the film thickness Tc1 of the electrode fingers is limited by the electrode finger pitch Pc1 and, specifically, is preferably designed so as to have a value of about 40% or less, for example, of the electrode finger pitch Pc1. However, since the variation in the line width Wc1 of the electrode fingers is increased if the film thickness Tc1 is too thick and the resistance of the electrode fingers is increased if the film thickness Tc1 is too thin, the film thickness Tc1 is preferably about 20%, for example, of the electrode finger pitch Pc1. About 20% is not limited to only 20% and includes an error range of a few percent.

1.5.3 Relationship to Electrode Duty

The relationship between the electrode duty (the duty ratio) and the characteristics will now be described using the typical capacitor C1s. It is assumed here that the design parameters other than the electrode duty are constant, the electrode finger pitch Pc1 is about 2.50 μm, and the ratio of the film thickness to the electrode finger pitch is about 0.20 (that is, Tc1=0.20×Pc1).

Figure 11A:
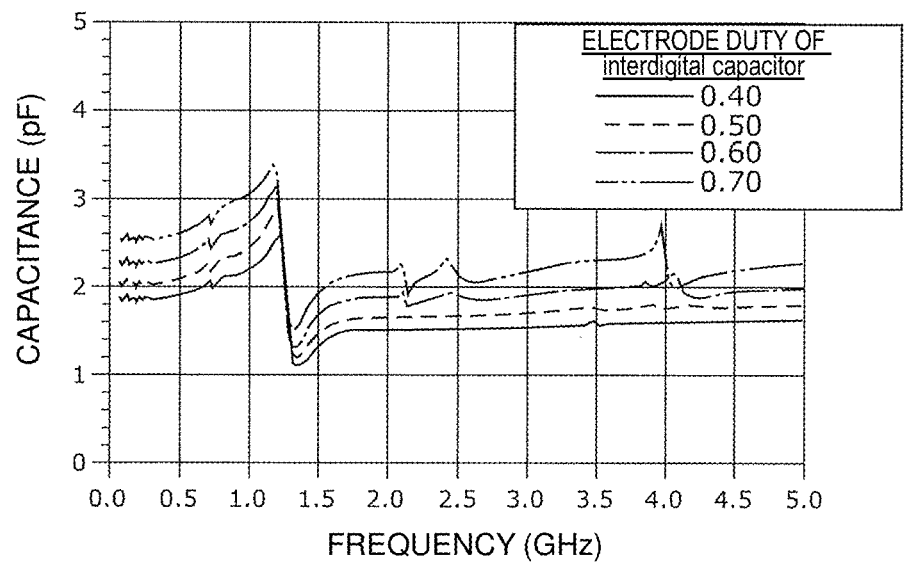
FIG. 11A is a graph representing the relationship between an electrode duty of the interdigital capacitor and the capacitance value in the typical example.
Figure 11B:
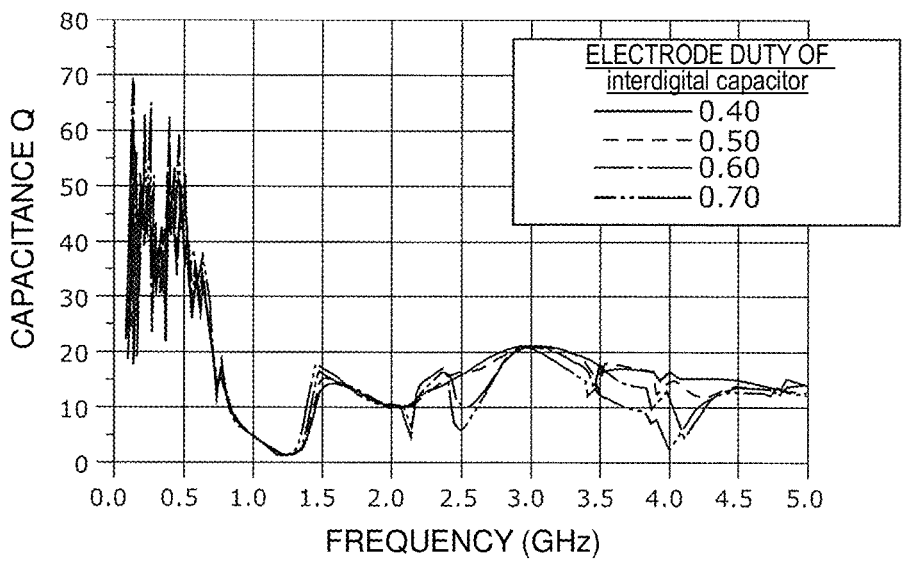
FIG. 11B is a graph representing the relationship between the electrode duty of the interdigital capacitor and the capacitance Q in the typical example.

FIG. 11A is a graph representing the relationship between the electrode duty of the electrode fingers of the capacitor C1s and the capacitance value in the typical example. FIG. 11B is a graph representing the relationship between the electrode duty of the electrode fingers of the capacitor C1s and the capacitance Q in the typical example. Specifically, the frequency characteristics when the electrode duty is set to about 0.40, about 0.50, about 0.60, and about 0.70 are illustrated in these drawings.

As illustrated in FIG. 11A, the capacitance value is increased as the electrode duty is increased. In contrast, as illustrated in FIG. 11B, the capacitance Q is not remarkably varied even when the electrode duty is varied.

Accordingly, since the capacitance value per unit area of the interdigital capacitor is capable of being increased with the increasing electrode duty, it is possible to reduce the size and save space.

1.6 Adjustment of Band Width Ratio

Adjustment of band width ratios BWRs of the series arm resonator and the parallel arm resonator having the acoustic wave resonator structure will now be described.

Figure 12:
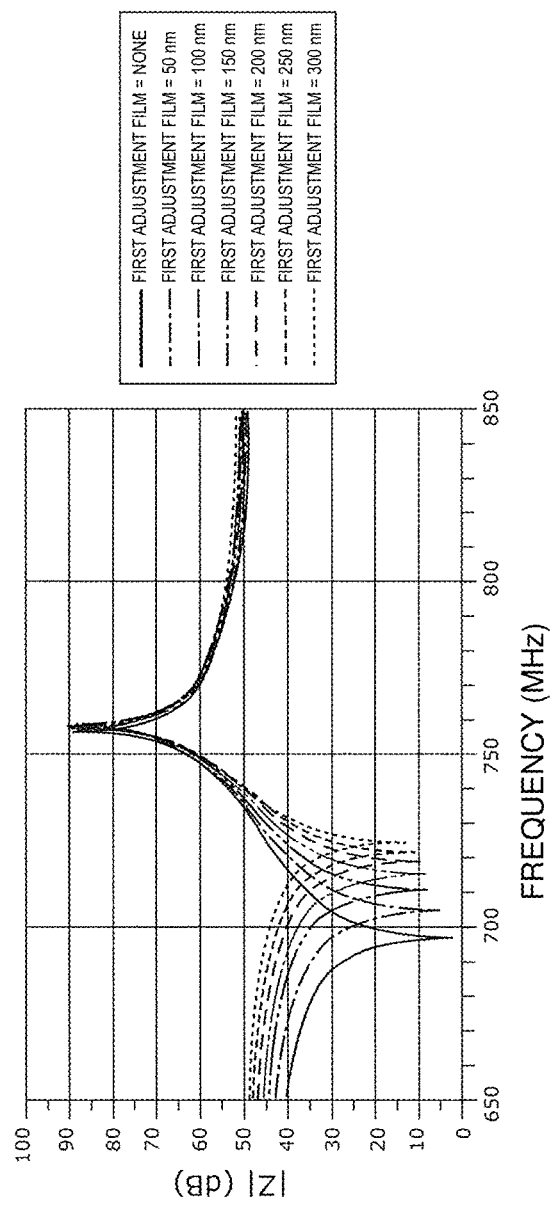
FIG. 12 is a graph representing the relationship between the film thickness of a first adjustment film and the impedance of an acoustic wave resonator.
Figure 13:
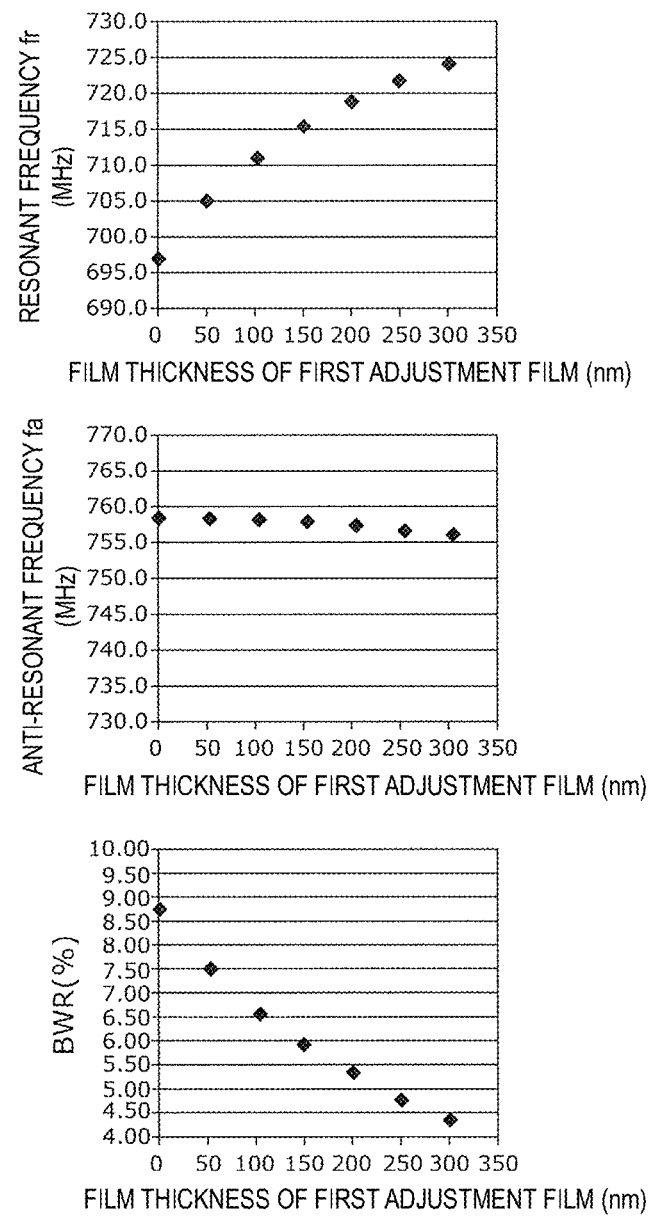
FIG. 13 includes graphs representing the relationship between the film thickness of the first adjustment film and a resonant frequency, an anti-resonant frequency, and a band width ratio of the acoustic wave resonator.

FIG. 12 is a graph representing the relationship between the film thickness of the first adjustment film of the electrode structure and the impedance of the acoustic wave resonator. FIG. 13 includes graphs representing the relationship between the film thickness of the first adjustment film and the resonant frequency, the anti-resonant frequency, and the band width ratio of the acoustic wave resonator. The frequency characteristics of resonant impedance of the acoustic wave resonator when the film thickness of the first adjustment film 103a illustrated in FIG. 8B is varied are illustrated in FIG. 12. Here, −10° Y-cut LiNbO$_3$ substrate is used as the piezoelectric substrate 102 and the film thickness of the IDT electrode is set to about 595 nm, for example. An upper graph in FIG. 13 represents the relationship between the film thickness of the first adjustment film and the resonant frequency fr. A middle graph in FIG. 13 represents the relationship between the film thickness of the first adjustment film and the anti-resonant frequency fa. A lower graph in FIG. 13 represents the relationship between the film thickness of the first adjustment film and the band width ratio BWR.

As illustrated in FIG. 12, when the film thickness of the first adjustment film is varied, the anti-resonant frequency fa is hardly varied but the resonant frequency fr is shifted. More specifically, as illustrated in FIG. 13, the resonant frequency fr is shifted toward the high frequencies and the band width ratio BWR is decreased as the film thickness of the first adjustment film is increased.

As the result of the above description, in the filter 10A according to the first example, (1) a configuration in which the first adjustment film of the IDT electrode of the series arm resonator s1a is thinner than the first adjustment film of the IDT electrode of the parallel arm resonator p1a and (2) a configuration in which the first adjustment film is not provided for the IDT electrode of the series arm resonator s1a are exemplified as the configuration in which the band width ratio of the series arm resonator s1a is higher than the band width ratio of the parallel arm resonator p1a.

Figure 14:
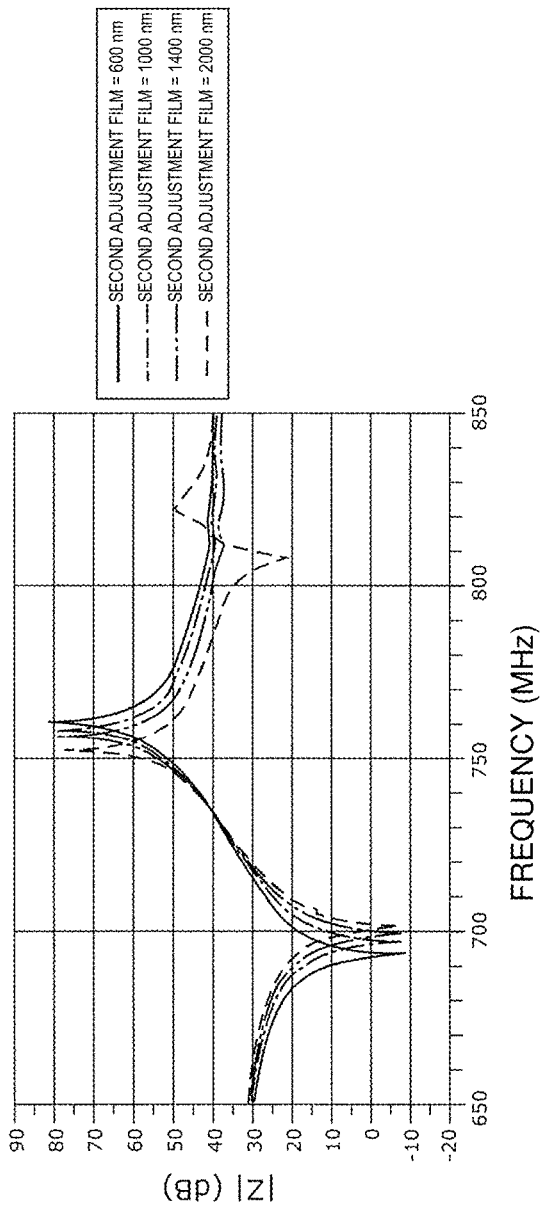
FIG. 14 is a graph representing the relationship between the film thickness of a second adjustment film and the impedance of the acoustic wave resonator.
Figure 15:
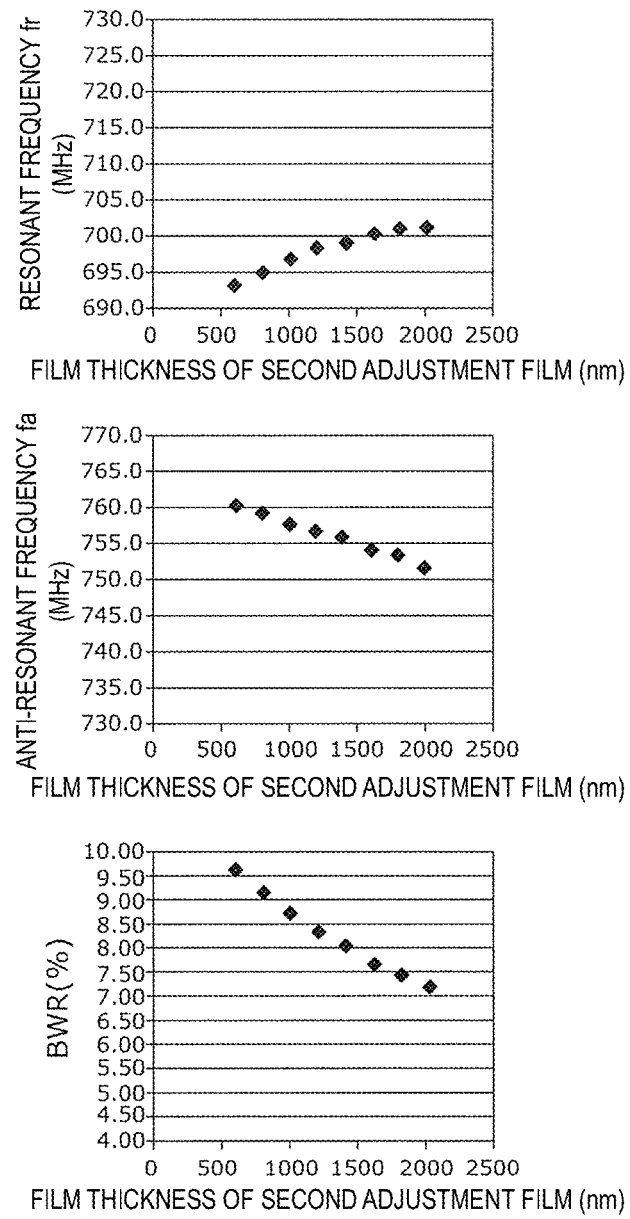
FIG. 15 includes graphs representing the relationship between the film thickness of the second adjustment film and the resonant frequency, the anti-resonant frequency, and the band width ratio of the acoustic wave resonator.

FIG. 14 is a graph representing the relationship between the film thickness of the second adjustment film of the electrode structure and the impedance of the acoustic wave resonator. FIG. 15 includes graphs representing the relationship between the film thickness of the second adjustment film and the resonant frequency, the anti-resonant frequency, and the band width ratio of the acoustic wave resonator. The frequency characteristics of the resonant impedance of the acoustic wave resonator when the film thickness of the second adjustment film (the protective layers 103+104) illustrated in FIGS. 8A and 8B is varied are illustrated in FIG. 14. Here, −10° Y-cut LiNbO$_3$ substrate is used as the piezoelectric substrate 102 and the film thickness of the IDT electrodes is set to about 595 nm, for example. An upper graph in FIG. 15 represents the relationship between the film thickness of the second adjustment film and the resonant frequency fr. A middle graph in FIG. 15 represents the relationship between the film thickness of the second adjustment film and the anti-resonant frequency fa. A lower graph in FIG. 15 represents the relationship between the film thickness of the second adjustment film and the band width ratio BWR.

As illustrated in FIG. 14, the anti-resonant frequency fa and the resonant frequency fr are shifted when the film thickness of the second adjustment film is varied. More specifically, as illustrated in FIG. 15, since the resonant frequency fr is shifted toward the high frequencies and the anti-resonant frequency fa is shifted toward the low frequencies as the film thickness of the second adjustment film is increased, the band width ratio BWR is decreased.

As the result of the above description, in the filter 10A according to the first example, (1) a configuration in which the second adjustment film of the IDT electrode of the series arm resonator s1a is thinner than the second adjustment film of the IDT electrode of the parallel arm resonator p1a and (2) a configuration in which the second adjustment film is not provided for the IDT electrode of the series arm resonator s1a are exemplified as the configuration in which the band width ratio of the series arm resonator s1a is made higher than the band width ratio of the parallel arm resonator p1a.

As described above, the first adjustment film and the second adjustment film are appropriately set depending on the required filter characteristics. Specifically, for example, since the second adjustment film also, for example, improves the frequency temperature characteristics and the moisture resistance, the second adjustment film is set in consideration of the frequency temperature characteristics and the moisture resistance necessary for the desired filter. The band width ratio is adjusted mainly based on the presence of the first adjustment film and the film thickness thereof.

Second Preferred Embodiment

Although the filter according to the first preferred embodiment includes the series arm resonant circuit including the series arm resonator and the capacitor connected in parallel to each other, a filter is described in a second preferred embodiment of the present invention, which includes a series arm resonant circuit to which a circuit element other than the series arm resonator and the capacitor is added.

2.1 Configuration of Filter 10D

Figure 16:
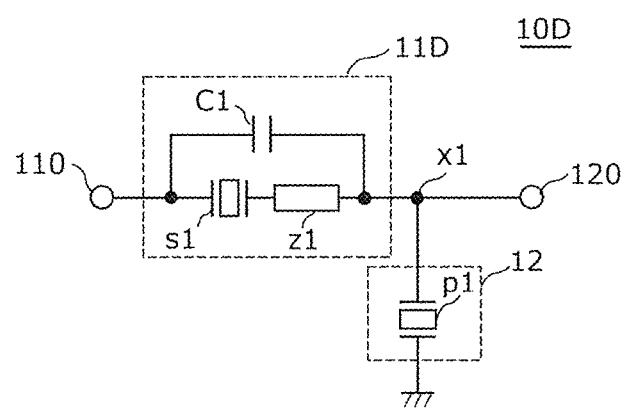
FIG. 16 is a circuit configuration diagram of a filter apparatus according to a second preferred embodiment of the present invention.

FIG. 16 is a circuit configuration diagram of a filter 10D according to a second preferred embodiment. The filter 10D illustrated in FIG. 16 includes a series arm resonant circuit 11D and the parallel arm resonant circuit 12 and the series arm resonant circuit 11D includes the series arm resonator s1, a capacitor C1, and an impedance element z1. The filter 10D illustrated in FIG. 16 differs from the filter 10A according to the first preferred embodiment only in that the filter 10D includes the impedance element z1. As for the filter 10D according to the present preferred embodiment, a description of the same portions as in the filter 10A according to the first preferred embodiment will be omitted and different portions from those in the filter 10A according to the first preferred embodiment will be mainly described.

The series arm resonator s1 is the first series arm resonator that is connected between the input/output terminal 110 and the input/output terminal 120 and that has a band width ratio wider than the band width ratio of the parallel arm resonant circuit 12.

The impedance element z1 is a first impedance element connected in series to the series arm resonator s1 and a capacitor (a second capacitor) or an inductor, for example, may preferably be used as the impedance element z1.

The capacitor C1 is the first capacitor connected in parallel to a circuit in which the series arm resonator s1 is connected in series to the impedance element z1.

With the above configuration, it is possible to reduce the return loss at the high frequency side of the pass band while ensuring the sharpness between the pass band and the attenuation band, as in the filter 10 according to the first preferred embodiment. In addition, it is possible to adjust a pass band width or the attenuation band by appropriately selecting the impedance element.

2.2 Resonance Analysis

Resonance characteristics of the filter 10D will now be described using an equivalent circuit.

2.2.1 Single Resonator

First, the resonance characteristic of a single resonator will be described.

Figure 17A:
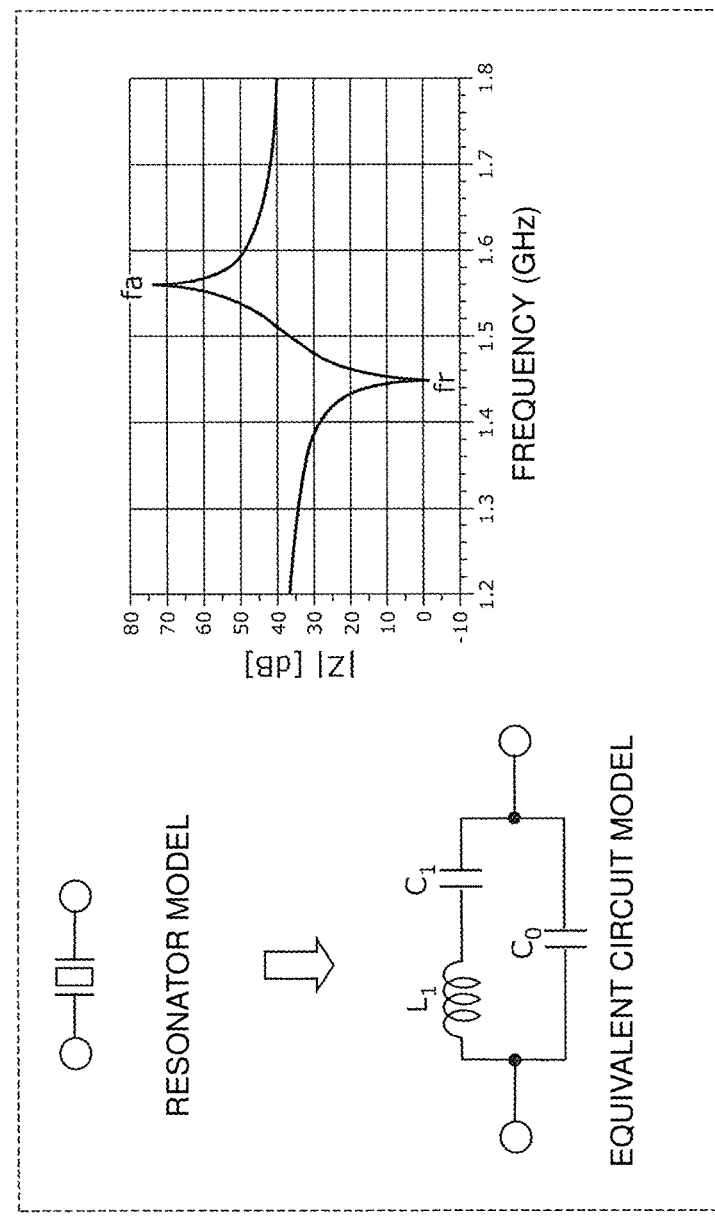
FIG. 17A is a diagram illustrating an equivalent circuit model of a resonator and a resonance characteristic of the resonator.

FIG. 17A is a diagram illustrating the equivalent circuit of one resonator and the resonance characteristic of the resonator. As illustrated in FIG. 17A, the resonator is represented by a parallel circuit (parallel connection circuit) including a series circuit (series connection circuit) including a capacitor $C_1$ and an inductor $L_1$, and a capacitor $C_0$. The capacitor $C_0$ is the electrostatic capacitance of the resonator.

In the above equivalent circuit, the resonant frequency fr of the resonator is determined by the series circuit of the capacitor $C_1$ and the inductor $L_1$. Since the resonant frequency fr of the resonator is the frequency at which the impedance of the equivalent circuit is zero, the resonant frequency fr of the resonator is represented by Equation 4 by solving Equation 3:

$$Z = 0 = j\omega L_1 + \frac{1}{j\omega C_1} \quad \text{(Equation 3)}$$

$$f_r = \frac{1}{2\pi\sqrt{L_1 C_1}} \quad \text{(Equation 4)}$$

Since the anti-resonant frequency fa of the resonator is the frequency at which admittance Y of the equivalent circuit is zero, the anti-resonant frequency fa of the resonator is represented by Equation 6 by solving Equation 5:

$$Y = \frac{1}{Z} = 0 = \frac{1}{\frac{1}{j\omega C_0}} + \frac{1}{j\omega L_1 + \frac{1}{j\omega C_1}} \quad \text{(Equation 5)}$$

$$f_a = \frac{\sqrt{1 + \frac{C_1}{C_0}}}{2\pi\sqrt{L_1 C_1}} = f_r\sqrt{1 + \frac{C_1}{C_0}} \quad \text{(Equation 6)}$$

According to Equation 4 and Equation 6, the anti-resonant frequency fa occurs at the high frequency side of the resonant frequency fr, as represented in a graph on the right side in FIG. 17A.

In other words, the resonator has one resonant frequency and one anti-resonant frequency positioned at the high frequency side of the resonant frequency.

2.2.2 Series Connection of Impedance Element to Resonator

Next, the resonance characteristics when the impedance element is connected in series to the resonator will be described using an equivalent circuit model.

Figure 17B:
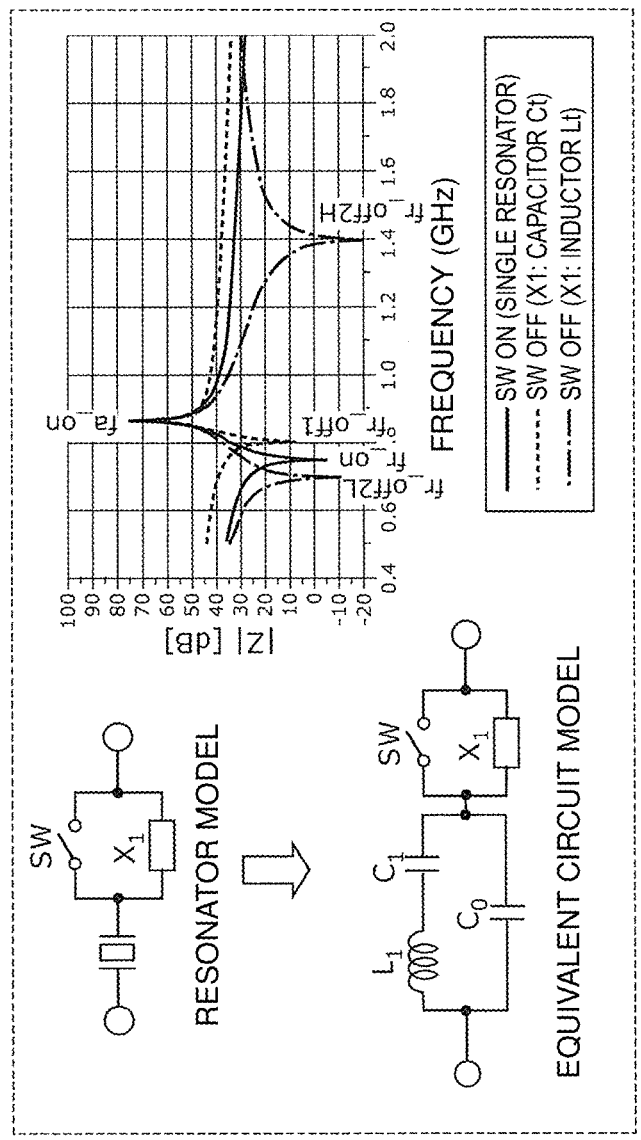
FIG. 17B is a diagram illustrating the equivalent circuit model when an impedance element is connected in series to the resonator and the resonance characteristics at that time.

FIG. 17B is a diagram illustrating the equivalent circuit when an impedance element $X_1$ is connected in series to the resonator and the resonance characteristics at that time. As illustrated in FIG. 17B, the resonator is represented by the parallel circuit including the series circuit including the capacitor $C_1$, and the inductor $L_1$ and the capacitor $C_0$. The capacitor $C_0$ is the electrostatic capacitance of the resonator. In addition, a parallel circuit of the impedance element $X_1$ and a switch SW is connected to the resonator. In the equivalent circuit illustrated in FIG. 17B, the switch SW is processed as an ideal switch the capacitance component of which is zero (that is, the impedance has an infinite value) when the switch SW is turned off (a non-conducting state) and the resistance component of which is zero (that is, the impedance is zero) when the switch SW is turned on (a conducting state).

First, the resonance characteristics of the equivalent circuit in the case in which the switch SW is turned on are described. Since the impedance element $X_1$ is short-circuited when the switch SW is turned on, a resonant frequency fr_on and an anti-resonant frequency fa_on are equal or substantially equal to the resonant frequency fr and the anti-resonant frequency fa, respectively, of the signal resonator in FIG. 17A and are represented by Equation 7 and Equation 8, respectively:

$$f_r\_on = \frac{1}{2\pi\sqrt{L_1 C_1}} \quad \text{(Equation 7)}$$

-continued $$f_a\_on = \frac{\sqrt{1+\frac{C_1}{C_0}}}{2\pi\sqrt{L_1 C_1}} = f_r\_on\sqrt{1+\frac{C_1}{C_0}} \quad \text{(Equation 8)}$$

Next, the case in which the switch SW is turned off is divided into (1) a case in which the impedance element $X_1$ is a capacitor and (2) a case in which the impedance element $X_1$ is an inductor for description.

(1) When the Impedance Element $X_1$ is a Capacitor Ct

Since a resonant frequency fr_off1 when the switch SW is turned off is the frequency at which impedance Z of the equivalent circuit is zero, the resonant frequency fr_off1 is represented by Equation 10 by solving Equation 9:

$$Z = 0 = \frac{1}{\frac{1}{\frac{1}{j\omega C_0} + \frac{1}{j\omega L_1 + \frac{1}{j\omega C_1}}}} + \frac{1}{j\omega C_t} \quad \text{(Equation 9)}$$

$$f_r\_off1 = \frac{\sqrt{\frac{C_0 + C_1 + C_t}{L_1 C_1 C_t + L_1 C_0 C_t}}}{2\pi} \quad \text{(Equation 10)}$$

Since an anti-resonant frequency fa_off1 when the switch SW is turned off is equal or substantially equal to the anti-resonant frequency fa_on when the switch SW is turned on and is represented by Equation 11:

$$f_a\_off1 = \frac{\sqrt{1+\frac{C_1}{C_0}}}{2\pi\sqrt{L_1 C_1}} \quad \text{(Equation 11)}$$

According to Equation 7, Equation 8, Equation 10, and Equation 11, when the impedance element $X_1$ is a capacitor, the anti-resonant frequency fa_on coincides with the anti-resonant frequency fa_off1 regardless of whether the switch SW is turned on or off, as represented in a graph on the right side in FIG. 17B. In contrast, the resonant frequency (fr_off1) is shifted to the high frequency side when the switch SW is turned off, compared with the resonant frequency (fr_on) when the switch SW is turned on.

(2) When the Impedance Element $X_1$ is an Inductor Lt

Since a resonant frequency fr_off2 when the switch SW is turned off is the frequency at which the impedance Z of the equivalent circuit is zero, the resonant frequency fr_off2 is represented by Equation 13 by solving Equation 12:

$$Z = 0 = \frac{1}{\frac{1}{\frac{1}{j\omega C_0} + \frac{1}{j\omega L_1 + \frac{1}{j\omega C_1}}}} + j\omega L_t \quad \text{(Equation 12)}$$

$$f_r\_off2 = \frac{\sqrt{\frac{-b \pm \sqrt{b^2-4ac}}{2a}}}{2\pi} \quad \text{(Equation 13)}$$

$$a = L_1 L_t C_0 C_1$$
$$b = -L_1 C_1 - L_t C_0 - L_t C_1$$
$$c = 1$$

In Equation 13, fr_off2L is the resonant frequency at the low frequency side when the switch SW is turned off and fr_off2H is the resonant frequency at the high frequency side when the switch SW is turned off.

In contrast, since an anti-resonant frequency fa_off2 when the switch SW is turned off is equal or substantially equal to the anti-resonant frequency fa_on when the switch SW is turned on and is represented by Equation 14:

$$f_a\_off2 = \frac{\sqrt{1+\frac{C_1}{C_0}}}{2\pi\sqrt{L_1 C_1}} \quad \text{(Equation 14)}$$

According to Equation 7, Equation 8, Equation 13, and Equation 14, when the impedance element $X_1$ is an inductor, the anti-resonant frequency fa_on coincides with the anti-resonant frequency fa_off2 regardless of whether the switch SW is turned on or off, as represented in the graph on the right side in FIG. 17B. In contrast, the resonant frequency (fr_off2L) is shifted to the low frequency side and the resonant frequency (fr_off2H) is added when the switch SW is turned off, compared with the resonant frequency (fr_on) when the switch SW is turned on.

2.2.3 Parallel Connection of Impedance Element to Resonator

Next, the resonance characteristics when the impedance element is connected in parallel to the resonator will now be described. A case in which the impedance element is the capacitor Ct is described here, and a description of a case in which the impedance element is an inductor is omitted herein. Since the equivalent circuit in this case results from parallel connection of the capacitor Ct to the equivalent circuit model of the resonator, illustrated in FIG. 17A, the equivalent circuit in this case is simply described.

When the impedance element $X_1$ is the capacitor Ct, a configuration is used in which the capacitor Ct is connected in parallel to the capacitor $C_0$ in the equivalent circuit illustrated in FIG. 17A. Accordingly, the resonant frequency in this case is represented by an equation in which $C_1$ in Equation 7 is replaced with combined capacitance ($C_0$+Ct) of the capacitor $C_0$ and the capacitor Ct and coincides with the resonant frequency of the single resonator. Equation 8 indicates that the anti-resonant frequency in this case is shifted to the low frequency side, compared with the anti-resonant frequency of the single resonator.

2.3 Transmission Characteristics of Filter 10D

First, the resonance characteristics of the series arm resonant circuit 11D in the filter 10D will be described.

Figure 18:
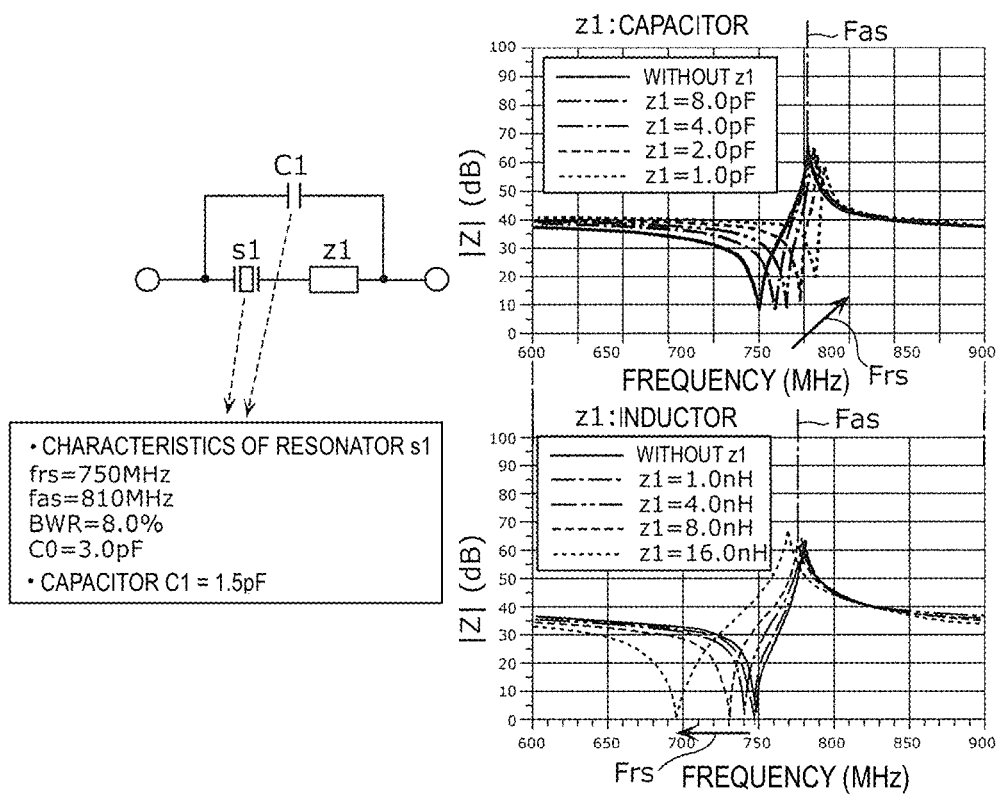
FIG. 18 includes graphs representing the impedance characteristics of a series arm resonant circuit in a filter according to the second preferred embodiment of the present invention (a third example).

FIG. 18 includes graphs representing the impedance characteristics of the series arm resonant circuit 11D in the filter 10D according to the second preferred embodiment (a third example). The resonance characteristics when the impedance element z1 is a capacitor are represented in an upper graph in FIG. 18, and the resonance characteristics when the impedance element z1 is an inductor are represented in a lower graph in FIG. 18.

As represented in the upper graph in FIG. 18, when the impedance element z1 is the second capacitor, the resonant frequency Frs of the series arm resonant circuit is represented by Equation 10 and is shifted to the high frequency side as the capacitance value of the second capacitor is decreased. Although an equation for the anti-resonant frequency Fas is omitted here because development of the equation is complicated, the anti-resonant frequency Fas is shifted to the high frequency side as the capacitance value of the second capacitor is decreased.

In contrast, as represented in the lower graph in FIG. 18, when the impedance element z1 is an inductor, the resonant frequency Frs of the series arm resonant circuit is represented by Equation 13 in the resonance analysis and is shifted to the low frequency side as the inductance value of the inductor is increased. Although an equation for the anti-resonant frequency Fas is omitted here because development of the equation in the resonance analysis is complicated, the anti-resonant frequency Fas is shifted to the low frequency side as the inductance value of the inductor is increased.

Figure 19:
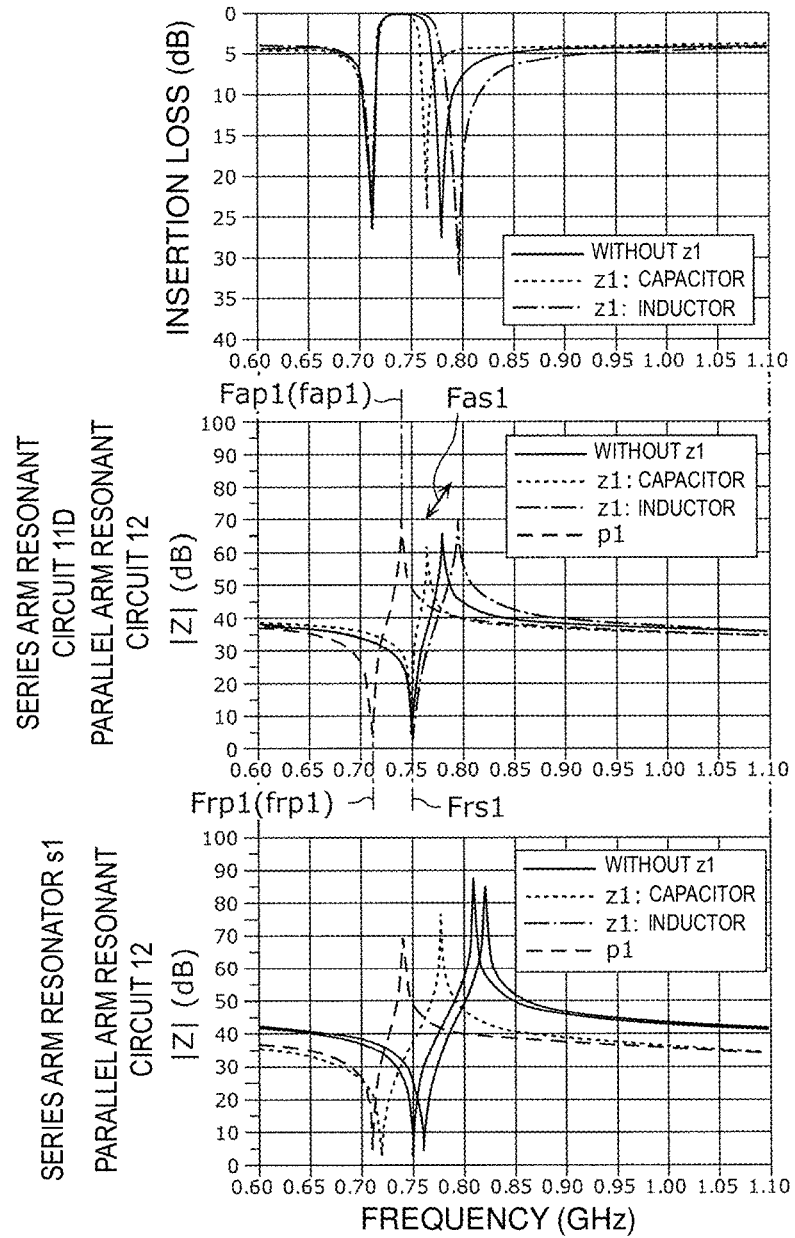
FIG. 19 includes graphs representing the transmission characteristics and the impedance characteristics of the filter according to the second preferred embodiment of the present invention (the third example).

FIG. 19 includes graphs representing the transmission characteristics and the impedance characteristics of the filter 10D according to the second preferred embodiment (the third example). An upper graph in FIG. 19 represents the transmission characteristics of the filter 10D when the impedance element z1 is not provided, when the impedance element z1 is a capacitor, and when the impedance element z1 is an inductor. A middle graph in FIG. 19 represents the resonance characteristics of the series arm resonant circuit 11D and the parallel arm resonant circuit 12 when the impedance element z1 is not provided, when the impedance element z1 is a capacitor, and when the impedance element z1 is an inductor. A lower graph in FIG. 19 represents the resonance characteristics (the impedance characteristics) of the series arm resonator s1 and the parallel arm resonant circuit 12 when the impedance element z1 is not provided, when the impedance element z1 is a capacitor, and when the impedance element z1 is an inductor.

Table 2 indicates the resonant frequencies, the anti-resonant frequencies, the band width ratios, the capacitance values, and the inductance values of the filter 10D according to the third example.

element z1 is a capacitor and the band width ratio is increased when the impedance element z1 is an inductor, compared with the band width ratio when the impedance element z1 is not provided. In order to adjust the resonant frequencies and the anti-resonant frequencies of the series arm resonant circuit 11D and the parallel arm resonant circuit 12 in the manner represented in the middle graph in FIG. 19, the resonant frequency and the anti-resonant frequency of the series arm resonator s1 is adjusted in the manner represented in the lower graph in FIG. 19.

Accordingly, as represented in the upper graph in FIG. 19, since the attenuation pole at the high frequency side of the pass band is capable of being shifted by appropriately selecting the impedance element, the pass band width or the attenuation band is able to be adjusted.

2.4 Configuration of Filter 10E According to First Modification (Fourth Example)

Figure 20:
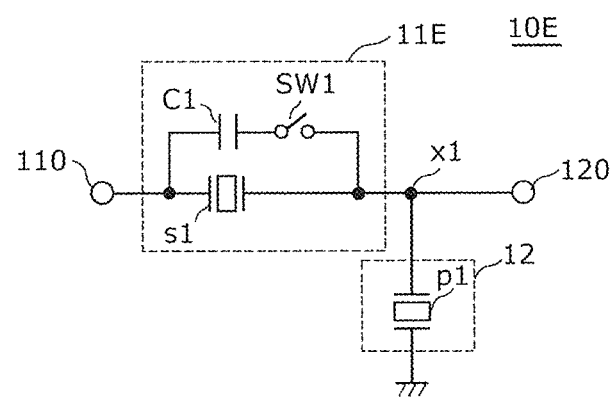
FIG. 20 is a circuit configuration diagram of a filter apparatus according to a first modification of the second preferred embodiment of the present invention (a fourth example).

FIG. 20 is a circuit configuration diagram of a filter 10E according to a first modification of the second preferred embodiment (a fourth example). The filter 10E illustrated in FIG. 20 includes a series arm resonant circuit 11E and the parallel arm resonant circuit 12, and the series arm resonant circuit 11E includes the series arm resonator s1, the capacitor C1, and a switch SW1. The filter 10E illustrated in FIG. 20 differs from the filter 10A according to the first example only in that the filter 10E includes the switch SW1. As for the filter 10E according to the present modification, a description of the same portions as in the filter 10A according to the first example will be omitted and portions different from those in the filter 10A according to the first example will be mainly described.

The series arm resonator s1 is the first series arm resonator that is connected between the input/output terminal 110 and the input/output terminal 120 and that has a band width ratio wider than the band width ratio of the parallel arm resonant circuit 12.

TABLE 2

|  |  | Resonant frequency fr (MHz) | Anti-resonant frequency fa (MHz) | Band width ratio BWR (%) | Capacitance value (pF) | Inductance value (nH) |
|---|---|---|---|---|---|---|
| Third example (Without z1) | Series arm resonator s1 | 750 | 810 | 8.00 | 1.5 | — |
|  | Capacitor C1 | — | — | — | 1.5 | — |
|  | Series arm resonant circuit 11D | 750 | 781 | 4.13 | 3.0 | — |
|  | Parallel arm resonator p1 | 712 | 740 | 4.00 | 3.0 | — |
|  | Parallel arm resonant circuit 12 |  |  |  |  |  |
| Third example (z1: Capacitor) | Series arm resonator s1 | 720 | 778 | 8.00 | 3.0 | — |
|  | Capacitor C1 | — | — | — | 1.5 | — |
|  | Series arm resonant circuit 11D | 749 | 764 | 2.00 | 4.5 | — |
|  | Parallel arm resonator p1 | 712 | 740 | 4.00 | 3.0 | — |
|  | Parallel arm resonant circuit 12 |  |  |  |  |  |
|  | Impedance element z1 | — | — | — | 3.0 | — |
| Third example (z1: Inductor) | Series arm resonator s1 | 760 | 821 | 8.00 | 1.5 | — |
|  | Capacitor C1 | — | — | — | 1.0 | — |
|  | Series arm resonant circuit 11D | 753 | 796 | 5.71 | 2.5 | — |
|  | Parallel arm resonator p1 | 712 | 740 | 4.00 | — | — |
|  | Parallel arm resonant circuit 12 |  |  |  |  |  |
|  | Impedance element z1 | — | — | — | — | 3.0 |

As represented in the middle graph in FIG. 19, the band width ratio of the series arm resonant circuit 11D is varied depending on the configuration of the impedance element z1. The band width ratio is decreased when the impedance The capacitor C1 is the first capacitor connected to the series arm resonator s1.

The switch SW1 is a first switch connected in series to the capacitor C1.

The series arm resonator s1 is connected in parallel to a circuit in which the capacitor C1 is connected in series to the switch SW1.

2.5 Transmission Characteristics of Filter 10E According to First Modification (Fourth Example)

Figure 21:
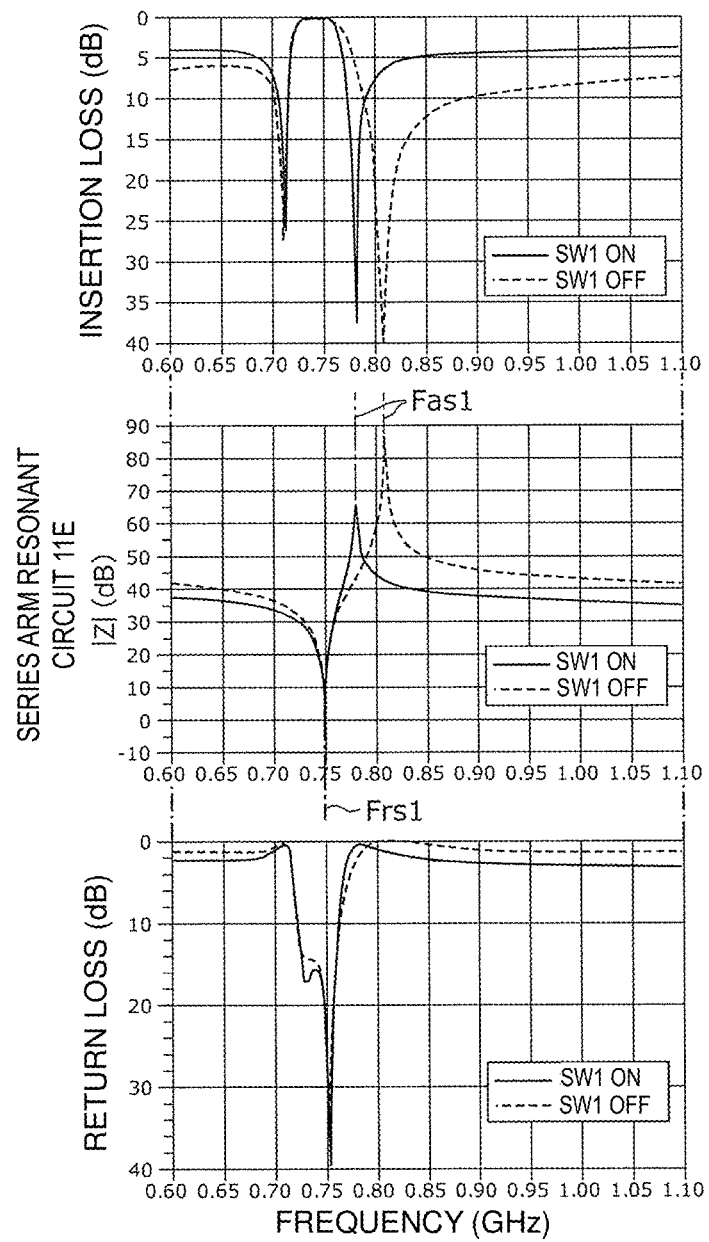
FIG. 21 includes graphs representing the transmission characteristics and the impedance characteristics of the filter according to the first modification of the second preferred embodiment of the present invention (the fourth example).

FIG. 21 includes graphs representing the transmission characteristics and the impedance characteristics of the filter 10E according to the first modification of the second preferred embodiment (the fourth example). An upper graph in FIG. 21 represents the transmission characteristics of the filter 10E when the switch SW1 is turned on and off. A middle graph in FIG. 21 represents the resonance characteristics of the series arm resonant circuit 11E when the switch SW1 is turned on and off. A lower graph in FIG. 21 represents the reflection characteristics of the filter 10E when the switch SW1 is turned on and off. Table 3 indicates the resonant frequencies, the anti-resonant frequencies, the band width ratios, and the capacitance values of the filter 10E according to the fourth example.

2.6 Configuration of Filter 10F According to Second Modification (Fifth Example)

Figure 22:
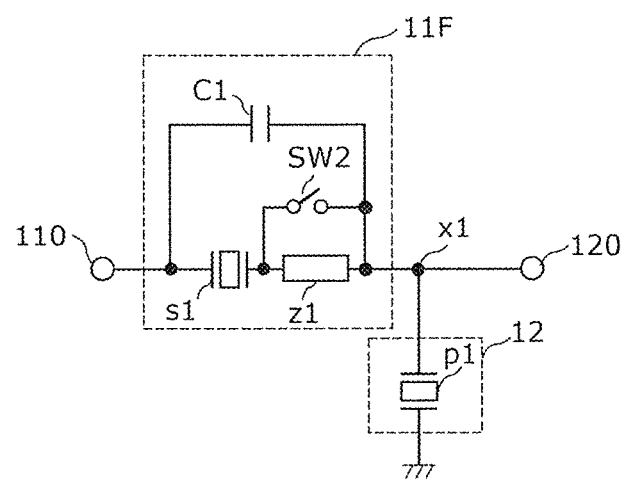
FIG. 22 is a circuit configuration diagram of a filter apparatus according to a second modification of the second preferred embodiment of the present invention (a fifth example).

FIG. 22 is a circuit configuration diagram of a filter 10F according to a second modification of the second preferred embodiment (a fifth example). The filter 10F illustrated in FIG. 22 includes a series arm resonant circuit 11F and the parallel arm resonant circuit 12 and the series arm resonant circuit 11F includes the series arm resonator s1, the capacitor C1, the impedance element z1, and a switch SW2. The filter 10F illustrated in FIG. 22 differs from the filter 10D according to the second preferred embodiment (the third example) only in that the filter 10F includes the switch SW2. As for the filter 10F according to the present modification, a description of the same portions as in the filter 10D according to the second preferred embodiment (the third example) will be omitted and portions different from those in the filter 10D according to the second preferred embodiment (the third example) will be mainly described.

The series arm resonator s1 is the first series arm resonator that is connected between the input/output terminal 110 and

TABLE 3

|  |  | Resonant frequency fr (MHz) | Anti-resonant frequency fa (MHz) | Band width ratio BWR (%) | Capacitance value (pF) |
|---|---|---|---|---|---|
| Fourth example | Series arm resonator s1 | 750 | 810 | 8.00 | 1.5 |
|  | Capacitor C1 | — | — | — | 1.5 |
|  | Series arm resonant circuit 11E(s1 + C1) | 750 | 781 | 4.13 | 3.0 |
|  | Parallel arm resonator p1 Parallel arm resonant circuit 12 | 712 | 740 | 4.00 | 3.0 |

In the circuit illustrated in FIG. 20, when the switch SW1 is turned on (the conducting state), the filter 10E has the same circuit configuration as that of the filter 10A according to the first preferred embodiment (the first example) and, as illustrated in FIG. 21, has the same transmission characteristics, resonance characteristics, and reflection characteristics as those in the first example illustrated in part (a) of FIG. 2A and FIG. 4. In other words, when the switch SW1 is switched to the on state, the sharpness (steepness) between the pass band and the attenuation band at the low frequency side and the high frequency side of the pass band is able to be ensured. In addition, the return loss at the high frequency side of the pass band is able to be reduced.

In contrast, when the switch SW1 is turned off (the non-conducting state), the anti-resonant frequency Fas1 of the series arm resonant circuit 11E is shifted to the high frequency side, as represented in the middle graph in FIG. 21, to shift the attenuation pole at the high frequency side of the pass band to the high frequency side. Accordingly, since the band width ratio of the series arm resonant circuit 11E is increased, the attenuation in the band at the high frequency side of the pass band is increased, as represented in the upper graph in FIG. 21. Consequently, the return loss at the high frequency side of the pass band is reduced, as represented in the lower graph in FIG. 21, compared with the case in which the switch SW1 is switched to the on state.

With the above configuration, switching between turning-on and turning-off of the switch SW1 enables the frequency of the attenuation pole at the high frequency side of the pass band to be varied while reducing the return loss at the high frequency side of the pass band.

the input/output terminal 120 and that has a band width ratio wider than the band width ratio of the parallel arm resonant circuit 12.

The capacitor C1 is the first capacitor connected to the series arm resonator s1.

The impedance element z1 is the first impedance element connected in series to the series arm resonator s1 and a capacitor (the second capacitor) or an inductor is exemplified as the impedance element z1.

The switch SW2 is a second switch connected in parallel to the impedance element z1.

A circuit in which the series arm resonator s1 is connected in series to the impedance element z1 is connected in parallel to the capacitor C1.

2.7 Transmission Characteristics of Filter 10F According to Second Modification (Fifth Example)

Figure 23:
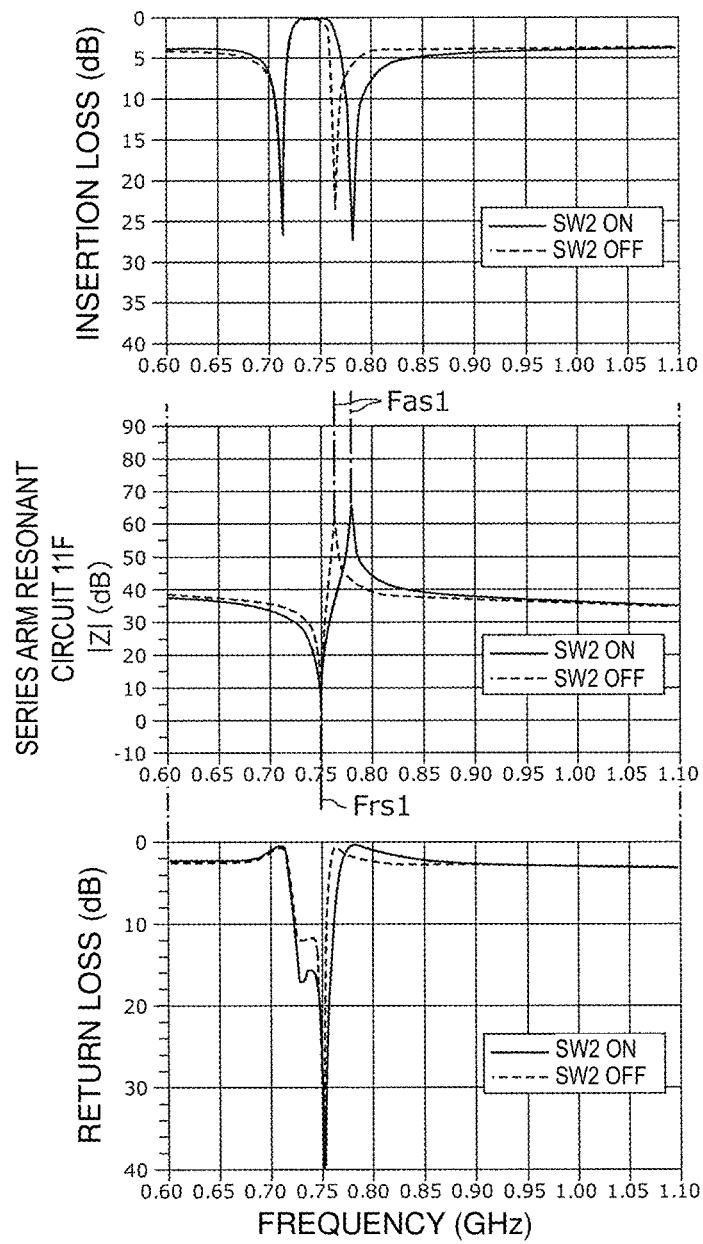
FIG. 23 includes graphs representing the transmission characteristics and the impedance characteristics of the filter according to the second modification of the second preferred embodiment of the present invention (the fifth example).

FIG. 23 includes graphs representing the transmission characteristics and the impedance characteristics of the filter 10F according to the second modification of the second preferred embodiment (the fifth example). An upper graph in FIG. 23 represents the transmission characteristics of the filter 10F when the switch SW2 is turned on and off. A middle graph in FIG. 23 represents the resonance characteristics of the series arm resonant circuit 11F when the switch SW2 is turned on and off. A lower graph in FIG. 23 represents the reflection characteristics of the filter 10F when the switch SW2 is turned on and off. In the present modification, the impedance element z1 is a capacitor.

Table 4 indicates the resonant frequencies, the anti-resonant frequencies, the band width ratios, and the capacitance values of the filter 10F according to the fifth example.

TABLE 4

|  |  | Resonant frequency fr (MHz) | Anti-resonant frequency fa (MHz) | Band width ratio BWR (%) | Capacitance value (pF) |
|---|---|---|---|---|---|
| Fifth example | Series arm resonator s1 | 720 | 778 | 8.00 | 3.0 |
|  | Capacitor C1 | — | — | — | 1.5 |
|  | Series arm resonant circuit 11F(s1 + C1) | 749 | 764 | 2.00 | 4.5 |
|  | Parallel arm resonator p1 | 712 | 740 | 4.00 | 3.0 |
|  | Parallel arm resonant circuit 12 |  |  |  |  |
|  | Impedance element z1 | — | — | — | 3.0 |

In the circuit illustrated in FIG. 22, when the switch SW2 is switched to the on state, the filter 10F has the same circuit configuration as that of the filter 10A according to the first example and, as illustrated in FIG. 23, has the same transmission characteristics, resonance characteristics, and reflection characteristics as those in the first example illustrated in part (a) of FIG. 2A and FIG. 4. In other words, when the switch SW2 is switched to the on state, the sharpness (steepness) between the pass band and the attenuation band at the low frequency side and the high frequency side of the pass band is able to be ensured. In addition, the return loss at the high frequency side of the pass band is able to be reduced.

In contrast, when the switch SW2 is switched to the off state, the filter 10F has the same circuit configuration as that of the filter 10D (the impedance element z1 is the capacitor) according to the second preferred embodiment (the third example) and, as illustrated in FIG. 23, has the same transmission characteristics, resonance characteristics, and reflection characteristics as those (z1: capacitor) in the third example illustrated in FIG. 19. In other words, compared with the case in which the switch SW2 is switched to the on state, the filter 10F maintains the advantages in that the attenuation pole at the high frequency side of the pass band is shifted to the low frequency side, as represented in the upper graph in FIG. 23, and the return loss at the high frequency side of the pass band is reduced, as represented in the lower graph in FIG. 23.

With the above configuration, switching between the conducting state and the non-conducting state of the switch SW2 enables the frequency of the attenuation pole at the high frequency side of the pass band to be varied while reducing the return loss at the high frequency side of the pass band.

2.8 Configuration of Filter 10G According to Third Modification (Sixth Example)

Figure 24:
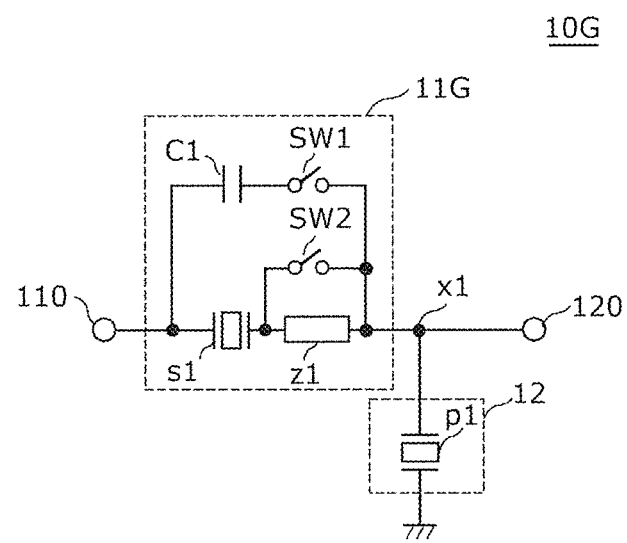
FIG. 24 is a circuit configuration diagram of a filter apparatus according to a third modification of the second preferred embodiment of the present invention (a sixth example).

FIG. 24 is a circuit configuration diagram of a filter 10G according to a third modification of the second preferred embodiment (a sixth example). The filter 10G illustrated in FIG. 24 includes a series arm resonant circuit 11G and the parallel arm resonant circuit 12, and the series arm resonant circuit 11G includes the series arm resonator s1, the capacitor C1, the impedance element z1, and the switches SW1 and SW2. The filter 10G illustrated in FIG. 24 differs from the filter 10D according to the second preferred embodiment (the third example) only in that the filter 10G includes the switches SW1 and SW2. As for the filter 10 according to the present modification, a description of the same portions as in the filter 10D according to the second preferred embodiment (the third example) will be omitted and portions different from those in the filter 10D according to the second preferred embodiment (the third example) will be mainly described.

The series arm resonator s1 is the first series arm resonator that is connected between the input/output terminal 110 and the input/output terminal 120 and that has a band width ratio wider than the band width ratio of the parallel arm resonant circuit 12.

The capacitor C1 is the first capacitor connected to the series arm resonator s1.

The impedance element z1 is the first impedance element connected in series to the series arm resonator s1 and a capacitor (the second capacitor) or an inductor is exemplified as the impedance element z1.

The switch SW1 is the first switch connected in series to the capacitor C1.

The switch SW2 is the second switch connected in parallel to the impedance element z1.

A circuit in which the series arm resonator s1 is connected in series to the impedance element z1 is connected in parallel to a circuit in which the capacitor C1 is connected in series to the switch SW1.

2.9 Transmission Characteristics of Filter 10G According to Third Modification (Sixth Example)

Figure 25:
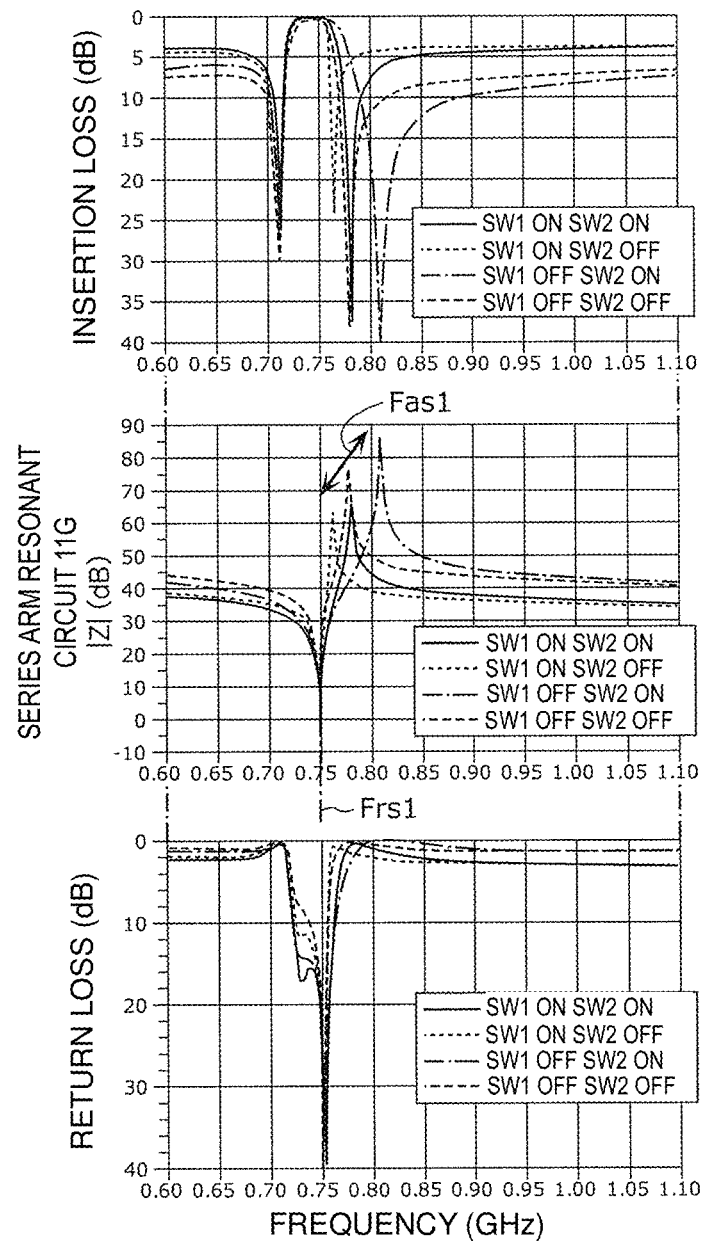
FIG. 25 includes graphs representing the transmission characteristics and the impedance characteristics of the filter according to the third modification of the second preferred embodiment of the present invention (the sixth example).

FIG. 25 includes graphs representing the transmission characteristics and the impedance characteristics of the filter 10G according to the third modification of the second preferred embodiment (the sixth example). An upper graph in FIG. 25 represents the transmission characteristics of the filter 10G when the switches SW1 and SW2 are turned on and off. A middle graph in FIG. 25 represents the resonance characteristics of the series arm resonant circuit 11G when the switches SW1 and SW2 are turned on and off. A lower graph in FIG. 25 represents the reflection characteristics of the filter 10G when the switches SW1 and SW2 are turned on and off. In the present modification, the impedance element z1 is a capacitor.

Table 5 indicates the resonant frequencies, the anti-resonant frequencies, the band width ratios, and the capacitance values of the filter 10G according to the sixth example.

TABLE 5

|  |  | Resonant frequency fr (MHz) | Anti-resonant frequency fa (MHz) | Band width ratio BWR (%) | Capacitance value (pF) |
|---|---|---|---|---|---|
| Sixth example | Series arm resonator s1 | 720 | 778 | 8.00 | 3.0 |
|  | Capacitor C1 | — | — | — | 1.5 |

TABLE 5-continued

| | Resonant frequency fr (MHz) | Anti-resonant frequency fa (MHz) | Band width ratio BWR (%) | Capacitance value (pF) |
|---|---|---|---|---|
| Series arm resonant circuit 11G(s1 + C1) | 749 | 764 | 2.00 | 4.5 |
| Parallel arm resonator p1 Parallel arm resonant circuit 12 | 712 | 740 | 4.00 | 3.0 |
| Impedance element z1 | — | — | — | 3.0 |

In the circuit illustrated in FIG. 24, when the switch SW1 is switched to the on state and the switch SW2 is switched to the on state, the filter 10G has the same circuit configuration as that of the filter 10A according to the first example. When the switch SW1 is switched to the on state and the switch SW2 is switched to the off state, the filter 10G has the same circuit configuration as that of the filter 10D according to the second preferred embodiment (the third example). When the switch SW1 is switched to the off state and the switch SW2 is switched to the on state, the filter 10G has the same circuit configuration as that of the filter according to the fourth comparative example. When the switch SW1 is switched to the off state and the switch SW2 is switched to the off state, the filter 10G has the same circuit configuration as that of the filter 10B according to the second example. In other words, the sharpness (steepness) between the pass band and the attenuation band at the low frequency side and the high frequency side of the pass band is able to be ensured and the return loss at the high frequency side of the pass band is able to be reduced by switching between the on state and the off state of the switches SW1 and SW2. As represented in the upper graph in FIG. 25, the frequency of the attenuation pole at the high frequency side of the pass band is able to be adjusted while reducing the return loss at the high frequency side of the pass band by switching between the on state and the off state of the switches SW1 and SW2.

Third Preferred Embodiment

Although the filters according to the first and second preferred embodiments each include the parallel arm resonant circuit including one parallel arm resonator, a filter is described in a third preferred embodiment of the present invention, which includes a parallel arm resonant circuit to which a circuit element other than the parallel arm resonator is added.

3.1 Configurations of Filters 10HA and 10HB

Figure 26A:
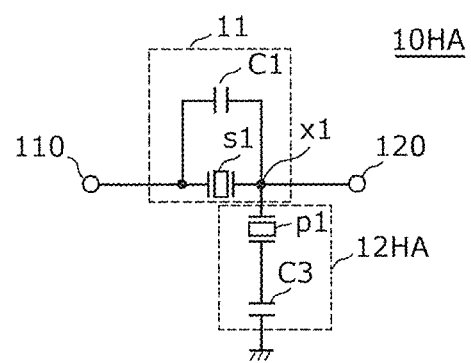
FIG. 26A is a circuit configuration diagram of a filter apparatus according to a third preferred embodiment of the present invention (a seventh example).

FIG. 26A is a circuit configuration diagram of a filter 10HA according to a third preferred embodiment (a seventh example). The filter 10HA illustrated in FIG. 26A includes the series arm resonant circuit 11 and a parallel arm resonant circuit 12HA. The series arm resonant circuit 11 includes the series arm resonator s1 and the capacitor C1. The parallel arm resonant circuit 12HA includes a parallel arm resonator p1 and a capacitor C3. The filter 10HA illustrated in FIG. 26A differs from the filter 10A according to the first example in the circuit configuration of the parallel arm resonant circuit 12HA. As for the filter 10HA according to the present preferred embodiment, a description of the same portions as in the filter 10A according to the first example will be omitted and portions different from those in the filter 10A according to the first example will be mainly described.

The parallel arm resonator p1 is a first parallel arm resonator that is connected between the node x1 on the path connecting the input/output terminal 110 to the input/output terminal 120 and the ground and that has a band width ratio lower than or equal to the band width ratio of the series arm resonator s1.

The capacitor C3 is a third capacitor connected in series to the parallel arm resonator p1.

Here, a resonant frequency frp1 of the parallel arm resonator p1 is lower than the resonant frequency frs1 of the series arm resonator and an anti-resonant frequency fap1 of the parallel arm resonator p1 is lower than the anti-resonant frequency fas1 of the series arm resonator s1. Since the resonant frequency of the parallel arm resonant circuit 12HA is shifted toward the high frequencies with respect to the resonant frequency of the parallel arm resonator p1 because the parallel arm resonant circuit 12HA is the circuit in which the parallel arm resonator p1 is connected in series to the capacitor C3, the band width ratio of the parallel arm resonant circuit 12HA is lower than the band width ratio of the parallel arm resonator p1.

With the above configuration, as in the filter 10 according to the first preferred embodiment, the return loss at the high frequency side of the pass band is able to be reduced while ensuring the sharpness between the pass band and the attenuation band. In particular, due to the capacitor C3 in the parallel arm resonant circuit 12HA, the sharpness between the pass band and the attenuation band at the low frequency side of the pass band is able to be further improved.

Figure 26B:
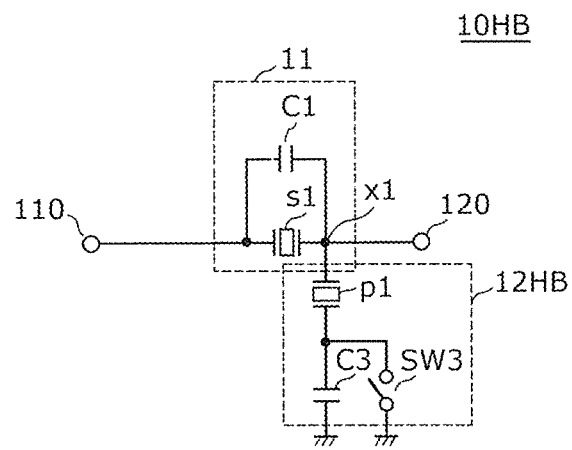
FIG. 26B is a circuit configuration diagram of a filter apparatus according to a first modification of the third preferred embodiment of the present invention (an eighth example).

FIG. 26B is a circuit configuration diagram of a filter 10HB according to a first modification of the third preferred embodiment (an eighth example). The filter 10HB illustrated in FIG. 26B includes the series arm resonant circuit 11 and a parallel arm resonant circuit 12HB. The filter 10HB according to the first modification (the eighth example) differs from the filter 10HA according to the third preferred embodiment (the seventh example) in that the filter 10HB includes a switch SW3 connected in parallel to the capacitor C3. In other words, the filter 10HB has the same configuration as that of the filter 10HA when the switch SW3 is switched to the off state and has the same configuration as that of the filter 10A according to the first example when the switch SW3 is switched to the on state. The capacitor C3 and the switch SW3 define a variable frequency circuit connected to the parallel arm resonator p1.

The constant of the capacitor C3 may be appropriately determined depending on the frequency specifications required for the filters 10HA and 10HB. The capacitor C3 may preferably be a variable capacitor, such as a varicap diode or a digitally tunable capacitor (DTC), for example.

3.2 Transmission Characteristics of Filters 10HA and 10HB

Figure 27:
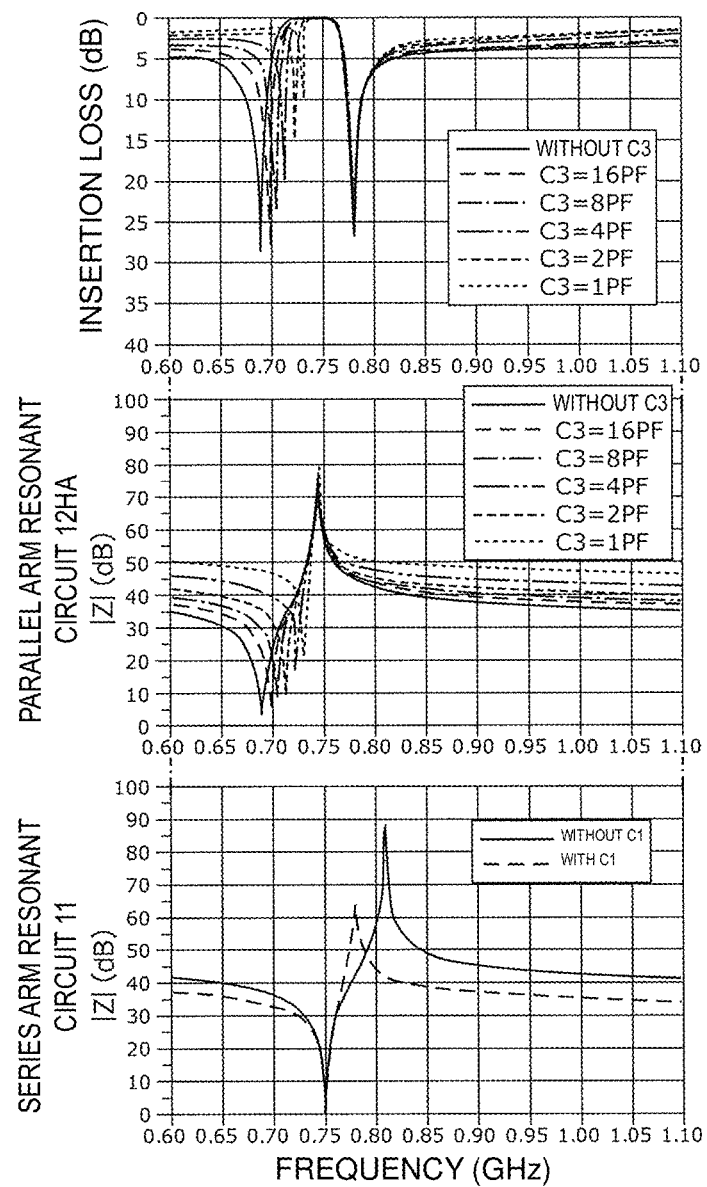
FIG. 27 includes graphs representing the transmission characteristics and the impedance characteristics of the filter apparatuses according to the third preferred embodiment of the present invention (the seventh example) and the first modification of the third preferred embodiment of the present invention (the eighth example).

FIG. 27 includes graphs representing the transmission characteristics and the impedance characteristics of the filter 10HA according to the third preferred embodiment (the seventh example) and the filter 10HB according to the first modification of the third preferred embodiment (the eighth example). In the filter 10HB according to the first modification of the third preferred embodiment (the eighth example), the capacitor C3 is short-circuited when the switch SW3 is turned on and the filter 10HB has the same characteristics as those when the capacitor C3 is not provided.

An upper graph in FIG. 27 represents the transmission characteristics of the filter 10HA and the filter 10HB with respect to the capacitance value of the capacitor C3. A middle graph in FIG. 27 represents the resonance characteristics of the parallel arm resonant circuit 12HA with respect to the capacitance value of the capacitor C3. A lower graph in FIG. 27 represents the resonance characteristics of the series arm resonant circuit 11 (and the single series arm resonator s1). Although the variations in the transmission characteristics and the impedance characteristics when the capacitance value of the capacitor C3 is varied are also displayed, the resonant frequency and the anti-resonant frequency of the parallel arm resonator p1 are varied in accordance with the variation of the capacitance value of the capacitor C3 so that the anti-resonant frequencies of the parallel arm resonant circuits 12HA and 12HB defining the pass band coincide with each other.

Table 6 indicates the resonant frequencies, the anti-resonant frequencies, the band width ratios, and the capacitance values of the filter 10HA according to the seventh example and the filter 10HB according to the eighth example.

TABLE 6

|  |  | Resonant frequency fr (MHz) | Anti-resonant frequency fa (MHz) | Band width ratio BWR (%) | Capacitance value (pF) |
|---|---|---|---|---|---|
| Seventh and eighth examples | Series arm resonator s1 | 750 | 810 | 8.00 | 1.5 |
|  | Capacitor C1 | — | — | — | 1.5 |
|  | Series arm resonant circuit 11(s1 + C1) | 750 | 791 | 4.13 | 3.0 |
|  | Parallel arm resonator p1 | 690 | 745 | 8.00 | 3.0 |
|  | Capacitor C3 |  |  |  | 16.0 |
|  | Parallel arm resonant circuit 12HA(p1 + C3) | 699 | 745 | 6.58 | 2.53 |
|  | Parallel arm resonator p1 | 690 | 745 | 8.00 | 3.0 |
|  | Capacitor C3 |  |  |  | 8.0 |
|  | Parallel arm resonant circuit 12HA(p1 + C3) | 705 | 745 | 5.67 | 2.18 |
|  | Parallel arm resonator p1 | 690 | 745 | 8.00 | 3.0 |
|  | Capacitor C3 |  |  |  | 4.0 |
|  | Parallel arm resonant circuit 12HA(p1 + C3) | 714 | 745 | 4.34 | 1.71 |
|  | Parallel arm resonator p1 | 690 | 745 | 8.00 | 3.0 |
|  | Capacitor C3 |  |  |  | 2.0 |
|  | Parallel arm resonant circuit 12HA(p1 + C3) | 724 | 745 | 2.90 | 1.20 |
|  | Parallel arm resonator p1 | 690 | 745 | 8.00 | 3.0 |
|  | Capacitor C3 |  |  |  | 1.0 |
|  | Parallel arm resonant circuit 12HA(p1 + C3) | 732 | 745 | 1.78 | 0.75 |

With the filter 10HA according to the seventh example, connecting the capacitor C3 in series to the parallel arm resonator p1 enables the attenuation pole at the low frequency side of the pass band to be shifted, as represented in the upper graph in FIG. 27. In other words, the sharpness between the pass band and the attenuation band at the low frequency side of the pass band is able to be adjusted.

With the filter 10HB according to the eighth example, the variable filter capable of varying the attenuation pole at the low frequency side of the pass band may be defined by switching between turning-on and turning-off of the switch SW3.

3.3 Configuration of Filter 10J According to Second Modification (Ninth Example)

Figure 28:
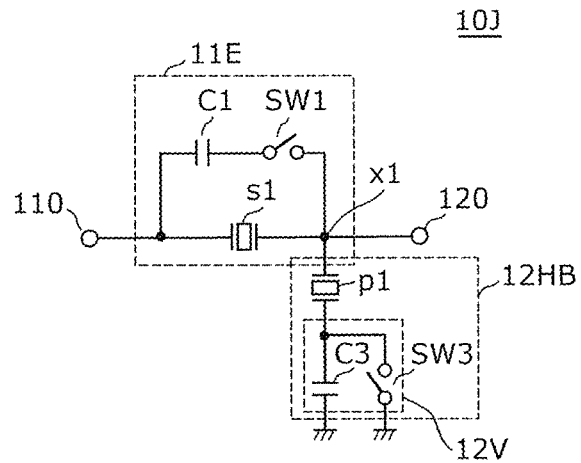
FIG. 28 is a circuit configuration diagram of a filter apparatus according to a second modification of the third preferred embodiment of the present invention (a ninth example).

FIG. 28 is a circuit configuration diagram of a filter 10J according to a second modification of the third preferred embodiment (a ninth example). The filter 10J illustrated in FIG. 28 includes the series arm resonant circuit 11E and the parallel arm resonant circuit 12HB. The filter 10J illustrated in FIG. 28 differs from the filter 10HB according to the first modification of the third preferred embodiment (the eighth example) only in that the series arm resonant circuit includes the switch SW1. The series arm resonant circuit 11E in the filter 10J has the same or substantially the same configuration as that of the filter 10E according to the first modification of the second preferred embodiment (the fourth example).

The filter 10J includes a variable frequency circuit 12V, which includes the capacitor C3 and the switch SW3 connected in parallel to the capacitor C3. The variable frequency circuit 12V is a first variable frequency circuit that is connected to the parallel arm resonator p1 and that is capable of varying at least one of the resonant frequency and the anti-resonant frequency of the parallel arm resonant circuit 12HB.

With the above configuration, as in the filter 10HB according to the first modification of the third preferred embodiment, the return loss at the high frequency side of the pass band is able to be reduced while ensuring the sharpness between the pass band and the attenuation band.

3.4 Transmission Characteristics of Filter 10J According to Second Modification (Ninth Example)

Figure 29:
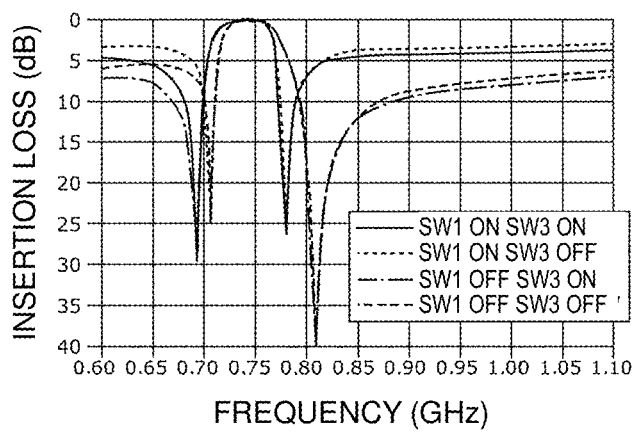
FIG. 29 is a graph representing the transmission characteristics of the filter apparatus according to the second modification of the third preferred embodiment of the present invention (the ninth example).

FIG. 29 is a graph representing the transmission characteristics of the filter 10J according to the second modification of the third preferred embodiment (the ninth example). As illustrated in FIG. 29, with the filter 10J, it is possible to provide a variable frequency filter capable of independently varying the frequencies of the attenuation poles at the low frequency side of the pass band and the high frequency side of the pass band and the sharpness between the pass band and the attenuation band by individually switching the switch SW1 and the switch SW3.

3.5 Configuration of Filter 10K According to Third Modification (Tenth Example)

Figure 30:
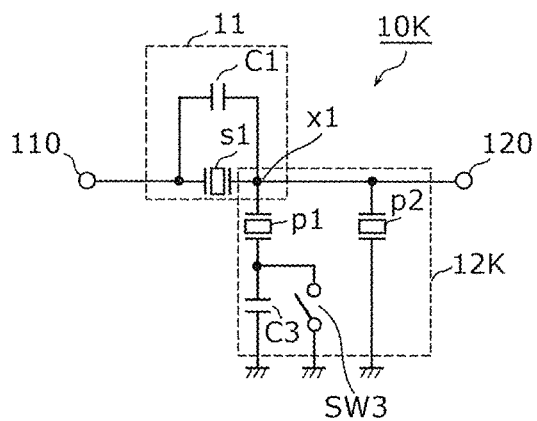
FIG. 30 is a circuit configuration diagram of a filter apparatus according to a third modification of the third preferred embodiment of the present invention (a tenth example).

FIG. 30 is a circuit configuration diagram of a filter 10K according to a third modification of the third preferred embodiment (a tenth example). The filter 10K illustrated in FIG. 30 includes the series arm resonant circuit 11 and a parallel arm resonant circuit 12K. The filter 10J illustrated in FIG. 30 differs from the filter 10HB according to the first modification of the third preferred embodiment (the eighth example) only in that the parallel arm resonant circuit 12K further includes a parallel arm resonator p2. As for the filter 10K according to the present modification, a description of the same portions as in the filter 10HB according to the first modification of the third preferred embodiment (the eighth example) will be omitted and portions different from those in the filter 10HB according to the first modification of the third preferred embodiment (the eighth example) will be mainly described.

The parallel arm resonator p1 is the first parallel arm resonator that is connected between the node x1 on the path connecting the input/output terminal 110 to the input/output terminal 120 and the ground, and that has a band width ratio lower than or equal to the band width ratio of the series arm resonator s1.

The parallel arm resonator p2 is a second parallel arm resonator connected between the node x1 and the ground.

A circuit in which the parallel arm resonator p1 is connected in series to the switch SW3 is connected in parallel to the parallel arm resonator p2 between the node x1 and the ground.

The resonant frequency of the parallel arm resonator p2 is higher than the resonant frequency of the parallel arm resonator p1, and the anti-resonant frequency of the parallel arm resonator p2 is higher than the anti-resonant frequency of the parallel arm resonator p1.

3.6 Resonance Analysis (Two Resonators are Connected in Parallel)

The characteristics when two resonators are connected in parallel to each other will now be described using an equivalent circuit.

Figure 31:
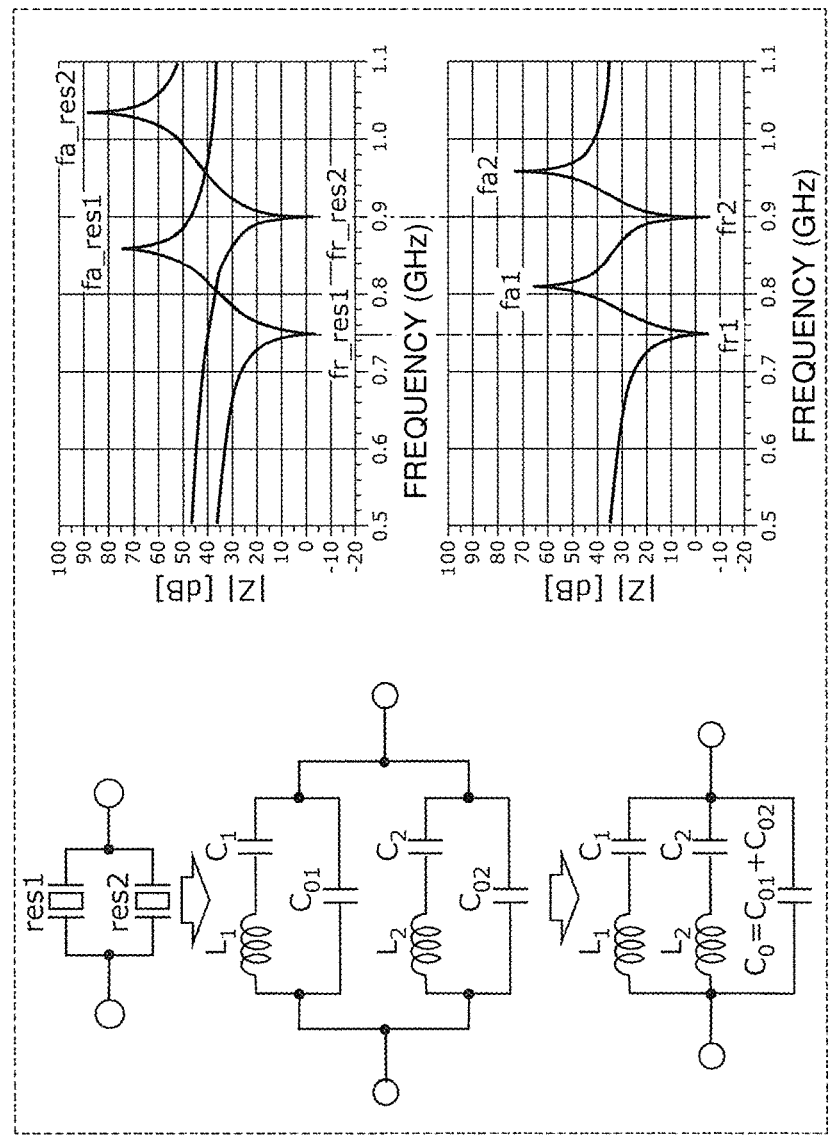
FIG. 31 includes diagrams illustrating the equivalent circuit model of two resonators that are connected in parallel to each other and the resonance characteristics of the two resonators.

FIG. 31 includes diagrams illustrating the equivalent circuit of two resonators that are connected in parallel to each other and the resonance characteristics of the two resonators. An equivalent circuit in which a resonator res1 is connected in parallel to a resonator res2 is illustrated in FIG. 31. The resonator res1 is represented by a parallel circuit including a series circuit of the capacitor $C_1$ and the inductor $L_1$ and a capacitor $C_{01}$, and the resonator res2 is represented by a parallel circuit including a series circuit of a capacitor $C_2$ and an inductor $L_2$ and a capacitor $C_{02}$. Here, the capacitors $C_{01}$ and $C_{02}$ are the electrostatic capacitance of the resonator res1 and the electrostatic capacitance of the resonator res2, respectively. The resonant circuit including the two resonators res1 and res2 is represented by an equivalent circuit illustrated in a lower left portion in FIG. 31. Specifically, the resonant circuit is represented by the series circuit of the capacitor $C_1$ and the inductor $L_1$, the series circuit of the capacitor $C_2$ and the inductor $L_2$, and the capacitor $C_0$ (=$C_{01}$+$C_{02}$).

In the above equivalent circuit, two resonant frequencies are specified. Resonant frequencies fr1 and fr2 are calculated as the resonant frequency of the series circuit of the capacitor $C_1$ and the inductor $L_1$ and the resonant frequency of the series circuit of the capacitor $C_2$ and the inductor $L_2$, respectively, as in the method of calculating the resonant frequency of the single resonator (Equation 3 and Equation 4). Specifically, the resonant frequencies fr1 and fr2 are determined by the series circuit of the capacitor $C_1$ and the inductor $L_1$ and the series circuit of the capacitor $C_2$ and the inductor $L_2$, respectively, and are represented by Equation 15:

$$f_r 1 = \frac{1}{2\pi\sqrt{L_1 C_1}} \quad f_r 2 = \frac{1}{2\pi\sqrt{L_2 C_2}} \quad \text{(Equation 15)}$$

In other words, the resonant frequencies fr1 and fr2 represented by the above equivalent circuit are equal or substantially equal to a resonant frequency fr_res1 of the resonator res1 and a resonant frequency fr_res2 of the resonator res2, respectively. Since the anti-resonant frequency of the above equivalent circuit is the frequency at which the admittance Y of the equivalent circuit is zero, the equivalent circuit has two anti-resonant frequencies (fa1 and fa2), as represented in Equation 17, by solving Equation 16:

$$Y = \frac{1}{Z} = 0 = j\omega C_0 + \frac{1}{j\omega L_1 + \frac{1}{j\omega C_1}} + \frac{1}{j\omega L_2 + \frac{1}{j\omega C_2}} \quad \text{(Equation 16)}$$

$$f_a 1 = \frac{\sqrt{\frac{-b - \sqrt{b^2 - 4ac}}{2a}}}{2\pi} \quad \text{(Equation 17)}$$

$$f_a 2 = \frac{\sqrt{\frac{-b + \sqrt{b^2 - 4ac}}{2a}}}{2\pi}$$

$$a = L_1 L_2 C_0 C_1 C_2$$

$$b = -L_1 C_0 C_1 - L_2 C_0 C_2 - L_1 C_1 C_2 - L_2 C_1 C_2$$

$$c = C_0 + C_1 + C_2$$

The anti-resonant frequencies fa1 and fa2 calculated from Equation 16 are different from the anti-resonant frequencies (are represented by fa_res1 and fa_res2 in the graph in FIG. 31) of the single resonator calculated from Equation 5. The anti-resonant frequency fa1 calculated from Equation 16 is lower than the anti-resonant frequency fa_res1 of the single resonator res1 and the anti-resonant frequency fa2 is lower than the anti-resonant frequency fa_res2 of the single resonator res2.

In addition, an equivalent circuit in which a capacitor (a variable frequency circuit) is connected in series to the resonators res1 and res2 will be analyzed.

First, a configuration in which a capacitor Cx is connected in series to the resonator res2, that is, a circuit (a circuit A) in which the resonator res1 is connected in parallel to a series circuit of the resonator res2 and the capacitor Cx is assumed.

(i) When a resonant frequency $fr_{res1}$ of the resonator res1 < a resonant frequency $fr_{res2}$ of the resonator res2, two resonant frequencies FrL (at the low frequency side) and FrH (at the high frequency side) of the circuit A are the frequencies at which the impedance of the circuit A is zero. Accordingly, the two resonant frequencies FrL (at the low frequency side) and FrH (at the high frequency side) of the circuit A are represented by Equation 20 and Equation 21 by solving Equation 18 and Equation 19:

$$Z_{rL} = 0 = j\omega_{rL} L_1 + \frac{1}{j\omega_{rL} C_1} \quad \text{(Equation 18)}$$

$$Z_{rH} = 0 = \frac{1}{\frac{1}{j\omega_{rH} C_{02}} + \frac{1}{j\omega_{rH} L_2 + \frac{1}{j\omega_{rH} C_2}}} + \frac{1}{j\omega_{rH} C_x} \quad \text{(Equation 19)}$$

$$F_{rL} = \frac{1}{2\pi\sqrt{L_1 C_1}} \quad \text{(Equation 20)}$$

$$F_{rH} = \frac{\sqrt{\frac{C_{02} + C_2 + C_x}{L_2 C_2 C_x + L_2 C_{02} C_2}}}{2\pi} \quad \text{(Equation 21)}$$

(ii) When the resonant frequency fr$_{res1}$>the resonant frequency fr$_{res2}$, the two resonant frequencies FrL (at the low frequency side) and FrH (at the high frequency side) of the circuit A are the frequencies at which the impedance of the circuit A is zero. Accordingly, the two resonant frequencies FrL (at the low frequency side) and FrH (at the high frequency side) of the circuit A are represented by Equation 24 and Equation 25 by solving Equation 22 and Equation 23:

$$Z_{rL} = 0 = \frac{1}{\frac{1}{\frac{1}{j\omega_{rL}C_{02}} + \frac{1}{j\omega_{rL}L_2 + \frac{1}{j\omega_{rL}C_2}}}} + \frac{1}{j\omega_{rL}C_x} \quad \text{(Equation 22)}$$

$$Z_{rH} = 0 = j\omega_{rH}L_1 + \frac{1}{j\omega_{rH}C_1} \quad \text{(Equation 23)}$$

$$F_{rL} = \frac{\sqrt{\frac{C_{02} + C_2 + C_x}{L_2 C_2 C_x + L_2 C_{02} C_2}}}{2\pi} \quad \text{(Equation 24)}$$

$$F_{rH} = \frac{1}{2\pi\sqrt{L_1 C_1}} \quad \text{(Equation 25)}$$

(iii) Since two anti-resonant frequencies FaL (at the low frequency side) and FaH (at the high frequency side) of the circuit A are the frequencies at which admittance Ya of the circuit A is zero, the two anti-resonant frequencies FaL (at the low frequency side) and FaH (at the high frequency side) of the circuit A are represented by Equation 27 by solving Equation 26:

$$Y_a = 0 = \frac{1}{\frac{1}{j\omega_a C_{01}} + \frac{1}{j\omega_a L_1 + \frac{1}{j\omega_a C_1}}} + $$

$$\frac{1}{\frac{1}{\frac{1}{j\omega_a C_{02}} + \frac{1}{j\omega_a L_2 + \frac{1}{j\omega_a C_2}}} + \frac{1}{j\omega_a C_x}} \quad \text{(Equation 26)}$$

$$F_{aL} = \frac{\sqrt{\frac{-B - \sqrt{B^2 - 4AC}}{2A}}}{2\pi} \quad \text{(Equation 27)}$$

$$F_{aH} = \frac{\sqrt{\frac{-B + \sqrt{B^2 - 4AC}}{2A}}}{2\pi}$$

$$A = L_1 L_2 C_1 C_2 (C_{01} C_{02} + C_{01} C_x + C_{02} C_x)$$

$$B = -C_{01} C_{02} (L_1 C_1 + L_2 C_2) - $$
$$C_1 C_2 (L_1 C_{01} + L_2 C_{02} + L_1 C_x + L_2 C_x) - $$
$$C_x (L_1 C_{01} C_1 + L_1 C_{02} C_1 + L_2 C_{01} C_2 + L_2 C_{02} C_2)$$

$$C = C_{01} C_x + C_{01} C_{02} + C_{02} C_x + $$
$$C_{02} C_1 + C_{01} C_2 + C_1 C_2 + + C_1 C_x + C_2 C_x$$

Next, a configuration in which the capacitor Cx is connected to the resonator res2 and a capacitor Cy is connected to the resonator res1, that is, a circuit (a circuit B) in which a series circuit of the resonator rest and the capacitor Cy is connected in parallel to a series circuit of the resonator res2 and the capacitor Cx is assumed.

(iv) When the resonant frequency fr$_{res1}$<the resonant frequency fr$_{res2}$, the two resonant frequencies FrL (at the low frequency side) and FrH (at the high frequency side) of the circuit B are the frequencies at which the impedance of the circuit B is zero. Accordingly, the two resonant frequencies FrL (at the low frequency side) and FrH (at the high frequency side) of the circuit B are represented by Equation 30 and Equation 31 by solving Equation 28 and Equation 29:

$$Z_{rL} = 0 = \frac{1}{\frac{1}{\frac{1}{j\omega_{rL}C_{01}} + \frac{1}{j\omega_{rL}L_1 + \frac{1}{j\omega_{rL}C_1}}}} + \frac{1}{j\omega_{rL}C_y} \quad \text{(Equation 28)}$$

$$Z_{rH} = 0 = \frac{1}{\frac{1}{\frac{1}{j\omega_{rH}C_{02}} + \frac{1}{j\omega_{rH}L_2 + \frac{1}{j\omega_{rH}C_2}}}} + \frac{1}{j\omega_{rH}C_x} \quad \text{(Equation 29)}$$

$$F_{rL} = \frac{\sqrt{\frac{C_{01} + C_1 + C_y}{L_1 C_1 C_y + L_1 C_{01} C_1}}}{2\pi} \quad \text{(Equation 30)}$$

$$F_{rH} = \frac{\sqrt{\frac{C_{02} + C_2 + C_x}{L_2 C_2 C_x + L_2 C_{02} C_2}}}{2\pi} \quad \text{(Equation 31)}$$

(v) When the resonant frequency fr$_{res1}$>the resonant frequency fr$_{res2}$, the two resonant frequencies FrL (at the low frequency side) and FrH (at the high frequency side) of the circuit B are the frequencies at which the impedance of the circuit B is zero. Accordingly, the two resonant frequencies FrL (at the low frequency side) and FrH (at the high frequency side) of the circuit B are represented by Equation 34 and Equation 35 by solving Equation 32 and Equation 33:

$$Z_{rL} = 0 = \frac{1}{\frac{1}{\frac{1}{j\omega_{rL}C_{02}} + \frac{1}{j\omega_{rL}L_2 + \frac{1}{j\omega_{rL}C_2}}}} + \frac{1}{j\omega_{rL}C_x} \quad \text{(Equation 32)}$$

$$Z_{rH} = 0 = \frac{1}{\frac{1}{\frac{1}{j\omega_{rH}C_{01}} + \frac{1}{j\omega_{rH}L_1 + \frac{1}{j\omega_{rH}C_1}}}} + \frac{1}{j\omega_{rH}C_y} \quad \text{(Equation 33)}$$

$$F_{rL} = \frac{\sqrt{\frac{C_{02} + C_2 + C_x}{L_2 C_2 C_x + L_2 C_{02} C_2}}}{2\pi} \quad \text{(Equation 34)}$$

$$F_{rH} = \frac{\sqrt{\frac{C_{01} + C_1 + C_y}{L_1 C_1 C_y + L_1 C_{01} C_1}}}{2\pi} \quad \text{(Equation 35)}$$

(vi) Since the two anti-resonant frequencies FaL (at the low frequency side) and FaH (at the high frequency side) of the circuit B are the frequencies at which the admittance Ya of the circuit B is zero, the two anti-resonant frequencies FaL (at the low frequency side) and FaH (at the high frequency side) of the circuit B are represented by Equation 37 by solving Equation 36:

$$Y_a = 0 = \cfrac{1}{\cfrac{1}{\cfrac{1}{\cfrac{1}{j\omega_a C_{01}} + j\omega_a L_1 + \cfrac{1}{j\omega_a C_1}} + \cfrac{1}{j\omega_a C_y}}} + \cfrac{1}{\cfrac{1}{\cfrac{1}{\cfrac{1}{j\omega_a C_{02}} + j\omega_a L_2 + \cfrac{1}{j\omega_a C_2}} + \cfrac{1}{j\omega_a C_x}}} \quad \text{(Equation 36)}$$

Figure 32:
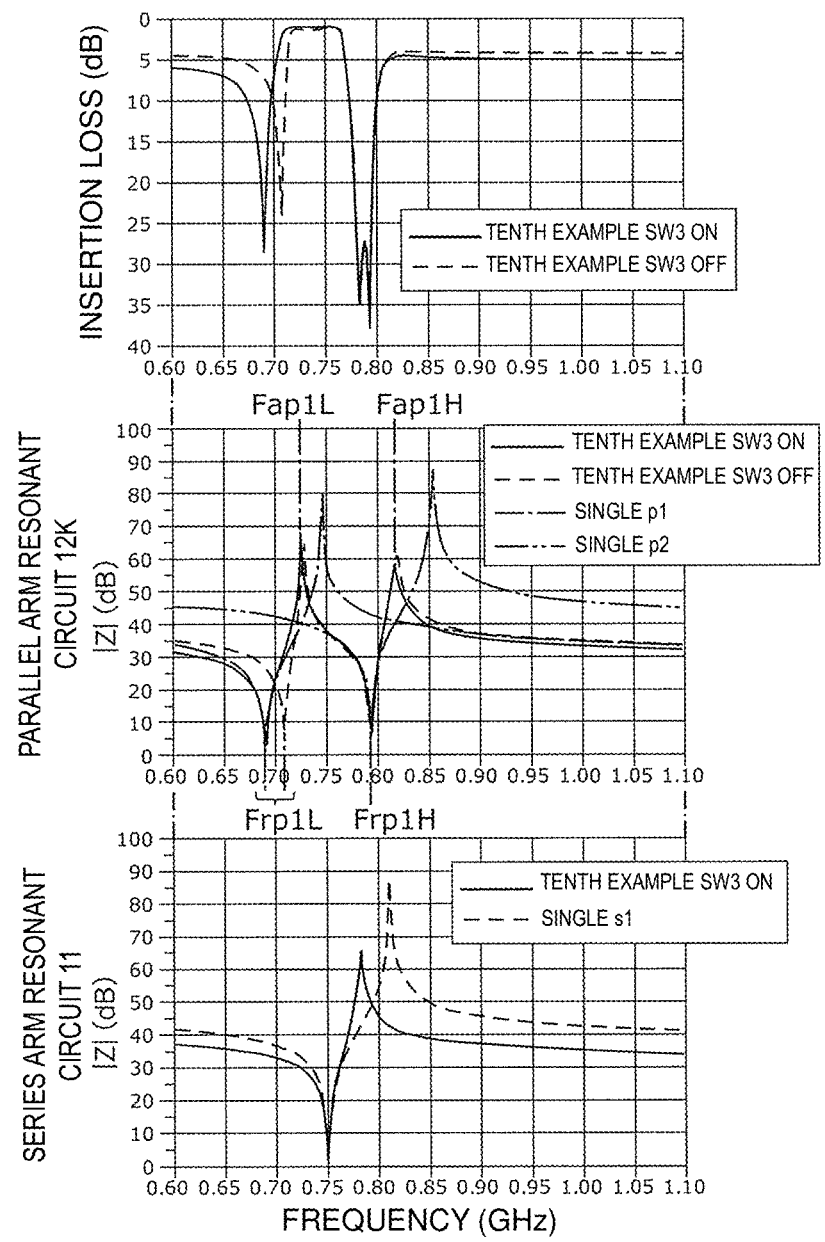
FIG. 32 includes graphs representing the transmission characteristics and the impedance characteristics of the filter apparatus according to the third modification of the third preferred embodiment of the present invention (the tenth example).

10K according to the third modification of the third preferred embodiment (the tenth example). An upper graph in FIG. 32 represents the transmission characteristics of the filter 10K when the switch SW3 is turned on and off. A middle graph in FIG. 32 represents the resonance characteristics of the parallel arm resonant circuit 12K when the switch SW3 is turned on and off. A lower graph in FIG. 32 represents the resonance characteristics of the series arm resonant circuit 11 (and the single series arm resonator s1).

Figure 33:
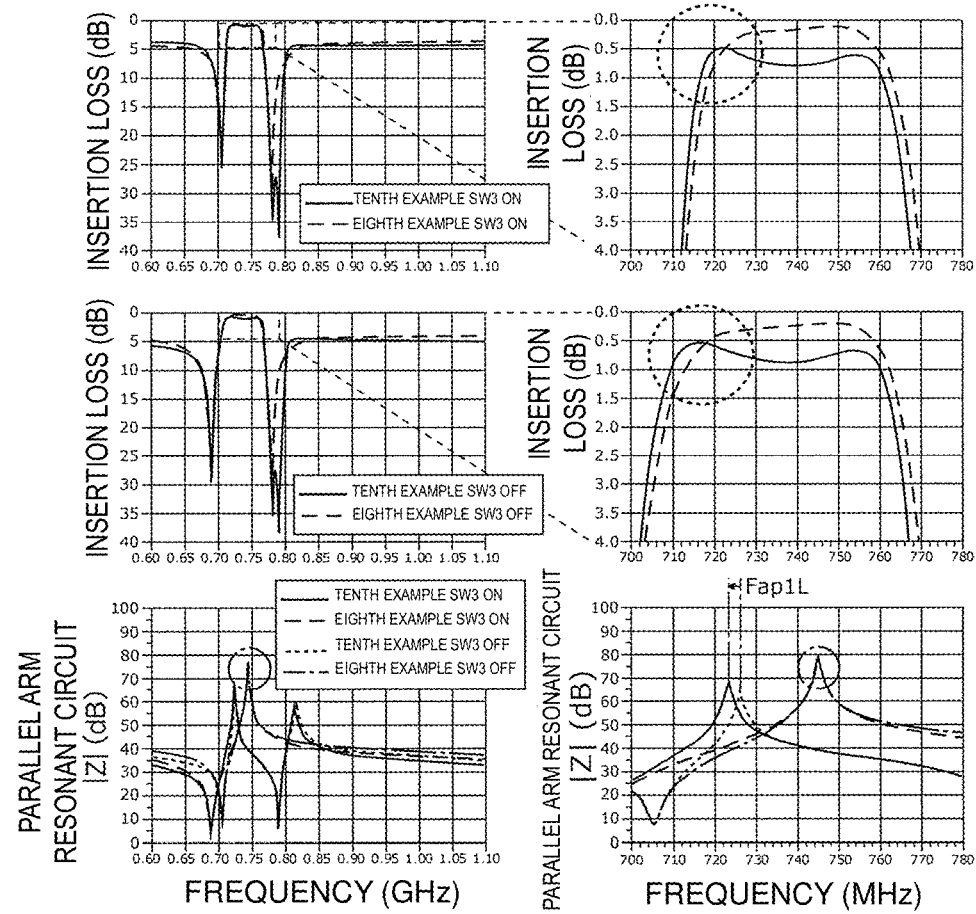
FIG. 33 includes graphs representing the results of comparison between the transmission characteristics and the impedance characteristics of the filter apparatuses according to the first modification of the third preferred embodiment (the eighth example) and the third modification of the third preferred embodiment of the present invention (the tenth example).

FIG. 33 includes graphs representing the results of comparison between the transmission characteristics and the impedance characteristics of the filter 10HB according to the first modification of the third preferred embodiment (the eighth example) and the filter 10K according to the third modification of the third preferred embodiment (the tenth example).

Table 7 indicates the resonant frequencies, the anti-resonant frequencies, the band width ratios, and the capacitance values of the filter 10K according to the tenth example.

TABLE 7

|  |  | Resonant frequency fr (MHz) | Anti-resonant frequency fa (MHz) | Band width ratio BWR (%) | Capacitance value (pF) |
|---|---|---|---|---|---|
| Tenth example | Series arm resonator s1 | 750 | 810 | 8.00 | 1.5 |
|  | Capacitor C1 | — | — | — | 1.5 |
|  | Series arm resonant circuit 11(s1 + C1) | 750 | 781 | 4.13 | 3.0 |
| SW3 ON | Parallel arm resonator p1 | 690 | 745 | 8.00 | 3.0 |
|  | Parallel arm resonator p2 | 790 | 853 | 8.00 | 1.0 |
|  | Capacitor C3 | — | — | — | — |
|  | Parallel arm resonant circuit 12K(p1 + C3 + p2) | 690 | 724 | 4.86 | 4.0 |
|  |  | 790 | 814 | 3.04 |  |
| SW3 OFF | Parallel arm resonator p1 | 690 | 745 | 8.00 | 3.0 |
|  | Parallel arm resonator p2 | 790 | 853 | 8.00 | 1.0 |
|  | Capacitor C3 | — | — | — | 8.0 |
|  | Parallel arm resonant circuit 12K(p1 + C3 + p2) | 706 | 726 | 2.91 | 3.18 |
|  |  | 790 | 817 | 3.42 |  |

-continued $$F_{aL} = \cfrac{\sqrt{\cfrac{-B - \sqrt{B^2 - 4AC}}{2A}}}{2\pi} \quad \text{(Equation 37)}$$

$$F_{aH} = \cfrac{\sqrt{\cfrac{-B + \sqrt{B^2 - 4AC}}{2A}}}{2\pi}$$

$A = L_1 L_2 C_{01} C_{02} C_1 C_2 (C_y + C_x) + L_1 L_2 C_1 C_2 C_x C_y (C_{01} + C_{02})$ $B = C_x C_y (L_1 C_{01} C_1 + L_2 C_{02} C_2 + L_2 C_{01} C_2 + L_1 C_{02} C_1) +$
$\quad C_{01} C_{02} (L_1 C_1 C_y + L_2 C_2 C_x + L_2 C_2 C_y + L_1 C_1 C_x) +$
$\quad C_1 C_2 (L_1 C_{01} C_y + L_2 C_{02} C_x + L_2 C_x C_y +$
$\quad\quad L_2 C_{02} C_y + L_1 C_x C_y + L_1 C_{01} C_x)$ $C = C_x C_y (L_2 C_{01} C_2 + L_1 C_{02} C_1) +$
$\quad C_{01} C_{02} (L_2 C_2 C_y + L_1 C_1 C_x) +$
$\quad C_1 C_2 (L_2 C_x C_y + L_2 C_{02} C_y + L_1 C_x C_y + L_1 C_{01} C_x)$ 3.7 Transmission Characteristics of Filter 10K According to Third Modification (Tenth Example)

FIG. 32 includes graphs representing the transmission characteristics and the impedance characteristics of the filter The shift of the resonance characteristics of the parallel arm resonant circuit 12K based on switching between turning-on and turning-off of the switch SW3 in the filter 10K according to the present modification is described based on the resonance analysis described above.

Specifically, when the switch SW3 is turned on, the parallel arm resonator p1 is connected in parallel to the parallel arm resonator p2. Accordingly, the parallel arm resonant circuit 12K has two resonant frequencies (resonant frequencies Frp1L and Frp1H) and two anti-resonant frequencies (anti-resonant frequencies Fap1L and Fap1H). The resonant frequencies Frp1L and Frp1H are represented by Equation 15, and the resonant frequencies Frp1L and Frp1H of the parallel arm resonant circuit 12K are the same or substantially the same as the resonant frequency of the parallel arm resonator p1 and the resonant frequency of the parallel arm resonator p2, respectively. The anti-resonant frequencies Fap1L and Fap1H of the parallel arm resonant circuit 12K are represented by Equation 17 and are lower than the anti-resonant frequency of the parallel arm resonator p1. The anti-resonant frequency Fap1H of the parallel arm resonant circuit 12K is lower than the anti-resonant frequency of the parallel arm resonator p2.

In contrast, when the switch SW3 is turned off, the circuit in which the parallel arm resonator p1 is connected in series to the capacitor C3 is connected in parallel to the parallel arm resonator p2. Accordingly, the resonant frequency Frp1H of the parallel arm resonant circuit 12K is represented by Equation and is the same or substantially the same as the resonant frequency of the parallel arm resonator p2. The resonant frequency Frp1L of the parallel arm resonant circuit 12K is represented by Equation 24 and is shifted to the high frequency side of the resonant frequency of the parallel arm resonator p1. The anti-resonant frequencies Fap1L and Fap1H are represented by Equation 27. The anti-resonant frequency Fap1L is higher than the resonant frequency Frp1L and is lower than the resonant frequency Frp1H. The anti-resonant frequency Fap1H is higher than the resonant frequency Frp1H.

Here, both the resonant frequency Frp1L defining the attenuation pole at the low frequency side of the pass band and the anti-resonant frequency Fap1L defining the pass band are switched depending on whether the switch SW3 is turned on or off. Accordingly, since both the frequency of the attenuation pole at the low frequency side of the pass band and a cutoff frequency at the low pass side are switched toward the low frequencies or the high frequencies, both the attenuation band near the attenuation pole and the pass band are capable of being switched toward the low frequencies or the high frequencies, thus varying the frequencies without degrading the loss in the pass band.

With the filter 10K according to the tenth example, connecting the capacitor C3 in series to the parallel arm resonator p1 enables the attenuation pole at the low frequency side of the pass band to be shifted, as illustrated in the upper graph in FIG. 32. In other words, the sharpness between the pass band and the attenuation band at the low frequency side of the pass band is able to be adjusted. In addition, it is possible to provide the variable filter that varies the attenuation pole at the low frequency side of the pass band by switching between turning-on and turning-off of the switch SW3.

Furthermore, as illustrated in upper right graphs in FIG. 33, in the filter 10HB according to the first modification of the third preferred embodiment (the eighth example), the anti-resonant frequency of the parallel arm resonant circuit 12HB is not varied depending on whether the switch SW3 is turned on or off. In contrast, in the filter 10K according to the tenth example, the anti-resonant frequency Fap1L of the parallel arm resonant circuit 12K is shifted to the low frequency side when the switch SW3 is switched to the on state. Accordingly, as illustrated in the upper right graph and the middle right graph in FIG. 33, since the anti-resonant frequency Fap1L defining the pass band is capable of being varied, compared with the filter 10HB according to the first modification of the third preferred embodiment (the eighth example), the cutoff frequency at the low frequency side of the pass band is able to be varied. Accordingly, the variable frequency filter based on the switching of the switch SW3 is able to be provided without increasing the insertion loss at the low pass side.

3.8 Configuration of Filter 10L According to Fourth Modification (Eleventh Example)

Figure 34:
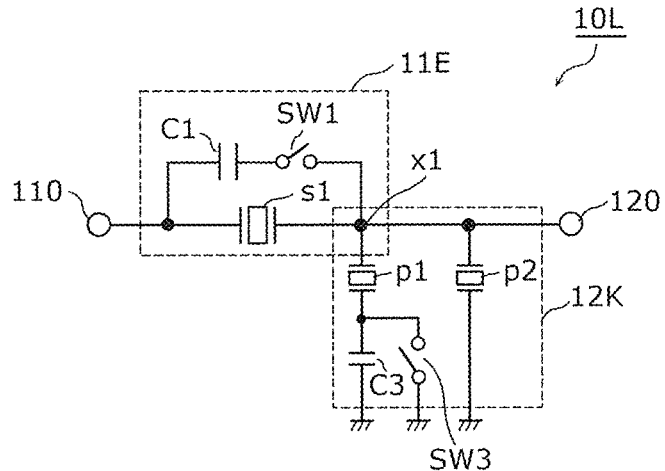
FIG. 34 is a circuit configuration diagram of a filter apparatus according to a fourth modification of the third preferred embodiment of the present invention (an eleventh example).

FIG. 34 is a circuit configuration diagram of a filter 10L according to a fourth modification of the third preferred embodiment (an eleventh example). The filter 10L illustrated in FIG. 34 includes the series arm resonant circuit 11E and the parallel arm resonant circuit 12K. The filter 10L illustrated in FIG. 34 differs from the filter 10K according to the third modification of the third preferred embodiment (the tenth example) only in that the series arm resonant circuit includes the switch SW1. The series arm resonant circuit 11E in the filter 10L has the same or substantially the same configuration as that of the filter 10E according to the first modification of the second preferred embodiment (the fourth example).

With the above configuration, it is possible to provide the variable filter that varies the attenuation pole at the low frequency side of the pass band by switching between turning-on and turning-off of the switch SW3 without increasing the insertion loss at the low pass side.

3.9 Transmission Characteristics of Filter 10L According to Fourth Modification (Eleventh Example)

Figure 35:
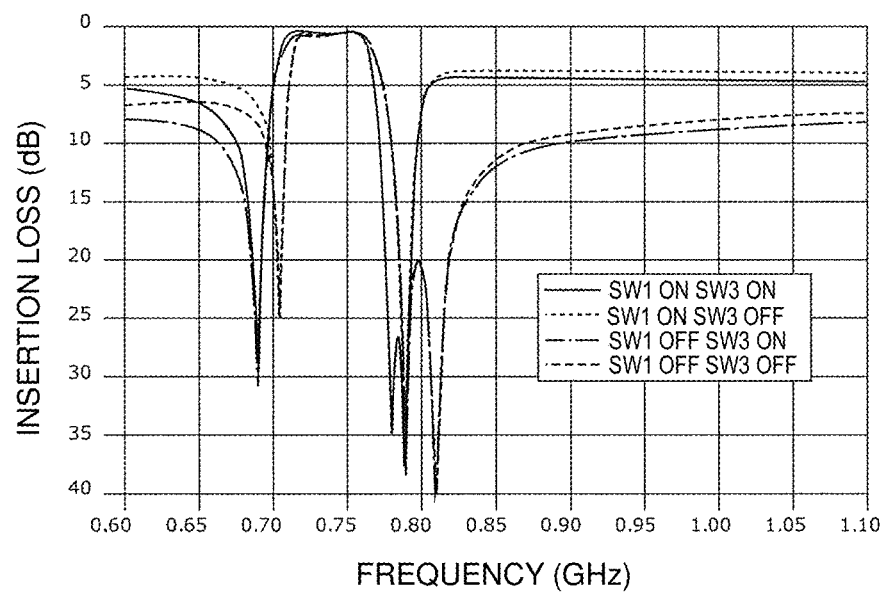
FIG. 35 is a graph representing the transmission characteristics of the filter apparatus according to the fourth modification of the third preferred embodiment of the present invention (the eleventh example).

FIG. 35 is a graph representing the transmission characteristics of the filter 10L according to the fourth modification of the third preferred embodiment (the eleventh example). As illustrated in FIG. 35, with the filter 10L, it is possible to provide a variable filter capable of independently varying the attenuation poles at the low frequency side of the pass band and the high frequency side of the pass band and the sharpness between the pass band and the attenuation band by individually switching the switch SW1 and the switch SW3.

3.10 Configuration of Filter 10M According to Fifth Modification (Twelfth Example)

Figure 36:
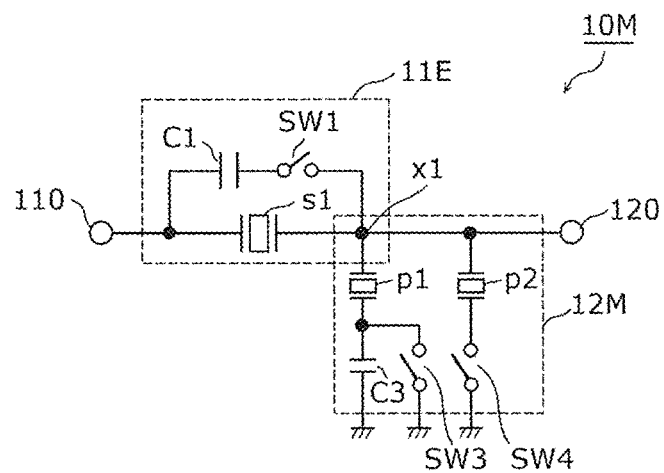
FIG. 36 is a circuit configuration diagram of a filter apparatus according to a fifth modification of the third preferred embodiment of the present invention (a twelfth example).

FIG. 36 is a circuit configuration diagram of a filter 10M according to a fifth modification of the third preferred embodiment (a twelfth example). The filter 10M illustrated in FIG. 36 includes the series arm resonant circuit 11E and a parallel arm resonant circuit 12M. The filter 10M illustrated in FIG. 36 differs from the filter 10L according to the fourth modification of the third preferred embodiment (the eleventh example) only in that the parallel arm resonant circuit 12M further includes a switch SW4. The series arm resonant circuit 11E in the filter 10M has the same or substantially the same configuration as that of the filter 10E according to the first modification of the second preferred embodiment (the fourth example). As for the filter 10M according to the present modification, a description of the same portions as in the filter 10L according to the fourth modification of the third preferred embodiment (the eleventh example) will be omitted and portions different from those in the filter 10L according to the fourth modification of the third preferred embodiment (the eleventh example) will be mainly described.

The parallel arm resonant circuit 12M includes the parallel arm resonators p1 and p2, the capacitor C3, and the switches SW3 and SW4.

The switch SW4 is a fourth switch connected in series to the parallel arm resonator p2.

3.11 Transmission Characteristics of Filter 10M According to Fifth Modification (Twelfth Example)

Figure 37:
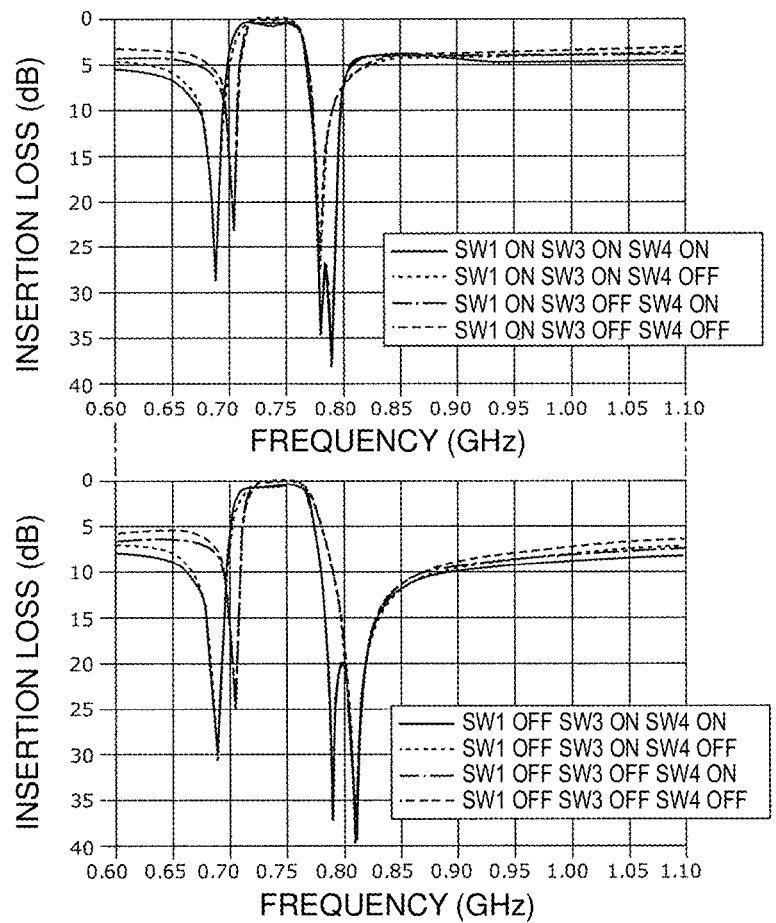
FIG. 37 includes graphs representing the transmission characteristics of the filter apparatus according to the fifth modification of the third preferred embodiment of the present invention (the twelfth example).

FIG. 37 includes graphs representing the transmission characteristics of the filter 10M according to the fifth modification of the third preferred embodiment (the twelfth example).

First, when the switch SW3 is turned off and the switch SW4 is turned off, the parallel arm resonant circuit 12M is a series circuit including the parallel arm resonator p1 and the capacitor C3. The parallel arm resonant circuit 12M has one resonant frequency Frp1 represented by Equation 10 and the resonant frequency occurs at the high frequency side of the resonant frequency frp1 of the parallel arm resonator p1. The parallel arm resonant circuit 12M has one anti-resonant frequency Fap1 represented by Equation 11 and the anti-resonant frequency is equal or substantially equal to the anti-resonant frequency fap1 of the parallel arm resonator p1.

Next, when the switch SW3 is turned on and the switch SW4 is turned off, the parallel arm resonant circuit 12M is a circuit including only the parallel arm resonator p1. The parallel arm resonant circuit 12M has one resonant frequency Frp1 represented by Equation 4 and the resonant frequency is equal or substantially equal to the resonant frequency frp1 of the parallel arm resonator p1. The parallel arm resonant circuit 12M has one anti-resonant frequency Fap1 represented by Equation 6 and the anti-resonant frequency is equal or substantially equal to the anti-resonant frequency fap1 of the parallel arm resonator p1.

Next, when the switch SW3 is turned off and the switch SW4 is turned on, the parallel arm resonant circuit 12M is a parallel circuit including the series circuit including the parallel arm resonator p1 and the capacitor C3 and the parallel arm resonator p2. The parallel arm resonant circuit 12M has the two resonant frequencies represented by Equation 24 and Equation 25. Among the two resonant frequencies, the resonant frequency Frp1L at the low frequency side occurs at the high frequency side of the resonant frequency frp1 of the parallel arm resonator p1 and the resonant frequency Frp1H at the high frequency side is equal or substantially equal to the resonant frequency frp2 of the parallel arm resonator p2. The parallel arm resonant circuit 12M has the two anti-resonant frequencies represented by Equation 27. Among the two anti-resonant frequencies, the anti-resonant frequency Fap1L at the low frequency side occurs between the two resonant frequencies of the parallel arm resonant circuit 12M and the anti-resonant frequency Fap1H at the high frequency side occurs at the high frequency side of the resonant frequency Frp1H at the high frequency side of the parallel arm resonant circuit 12M.

Next, when the switch SW3 is turned on and the switch SW4 is turned on, the parallel arm resonant circuit 12M is a parallel circuit including the parallel arm resonator p1 and the parallel arm resonator p2. The parallel arm resonant circuit 12M has the two resonant frequencies represented by Equation 15. Among the two resonant frequencies, the resonant frequency Frp1L at the low frequency side is equal or substantially equal to that of the parallel arm resonator p1 and the resonant frequency Frp1H at the high frequency side is equal or substantially equal to the resonant frequency frp2 of the parallel arm resonator p2. The parallel arm resonant circuit 12M has the two anti-resonant frequencies represented by Equation 17. Among the two anti-resonant frequencies, the anti-resonant frequency Fap1L at the low frequency side occurs between the two resonant frequencies of the parallel arm resonant circuit 12M and the anti-resonant frequency Fap1H at the high frequency side occurs at the high frequency side of the resonant frequency Frp1H at the high frequency side of the parallel arm resonant circuit 12M.

Switching between turning-on and turning-off of the switches in the above manner enables the filter 10M to define a variable filter in which the attenuation poles at the low frequency side of the pass band and the high frequency side of the pass band and the sharpness between the pass band and the attenuation band are independently varied by individually switching the switches SW1, SW3, and SW4, as illustrated in FIG. 37.

3.12 Configuration of Filter 10N According to Sixth Modification (Thirteenth Example)

Figure 38:
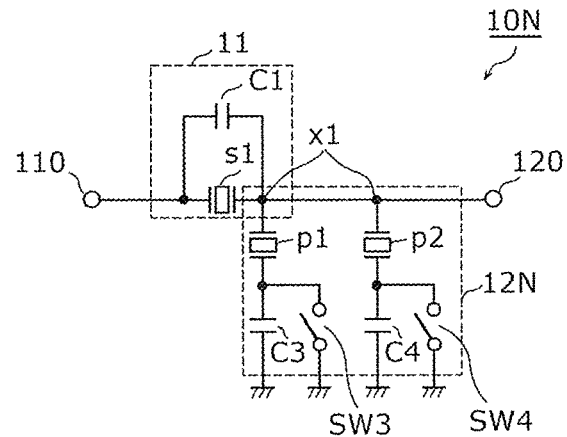
FIG. 38 is a circuit configuration diagram of a filter apparatus according to a sixth modification of the third preferred embodiment of the present invention (a thirteenth example).

FIG. 38 is a circuit configuration diagram of a filter 10N according to a sixth modification of the third preferred embodiment (a thirteenth example). The filter 10N illustrated in FIG. 38 includes the series arm resonant circuit 11 and a parallel arm resonant circuit 12N. The filter 10N illustrated in FIG. 38 differs from the filter 10M according to the fifth modification of the third preferred embodiment (the twelfth example) only in that the series arm resonant circuit 11 does not include the switch SW1 and that the parallel arm resonant circuit 12N further includes a capacitor C4. As for the filter 10N according to the present modification, a description of the same portions as in the filter 10M according to the fifth modification of the third preferred embodiment (the twelfth example) will be omitted and portions different from those in the filter 10M according to the fifth modification of the third preferred embodiment (the twelfth example) will be mainly described.

The series arm resonant circuit 11 includes the series arm resonator s1 and the capacitor C1.

The parallel arm resonant circuit 12N includes the parallel arm resonators p1 and p2, the capacitors C3 and C4, and the switches SW3 and SW4.

The capacitor C4 is a fourth capacitor connected in parallel to the switch SW4.

The filter 10N includes the first variable frequency circuit and a second variable frequency circuit. The first variable frequency circuit includes the capacitor C3 and the switch SW3 connected in parallel to the capacitor C3. The second variable frequency circuit includes the capacitor C4 and the switch SW4 connected in parallel to the capacitor C4. The first variable frequency circuit is the first variable frequency circuit that is connected to the parallel arm resonator p1 and that varies at least one of the resonant frequency and the anti-resonant frequency of the parallel arm resonant circuit 12N. The second variable frequency circuit is the second variable frequency circuit that is connected to the parallel arm resonator p2 and that varies at least one of the resonant frequency and the anti-resonant frequency of the parallel arm resonant circuit 12N.

3.13 Transmission Characteristics of Filter 10N According to Sixth Modification (Thirteenth Example)

Figure 39:
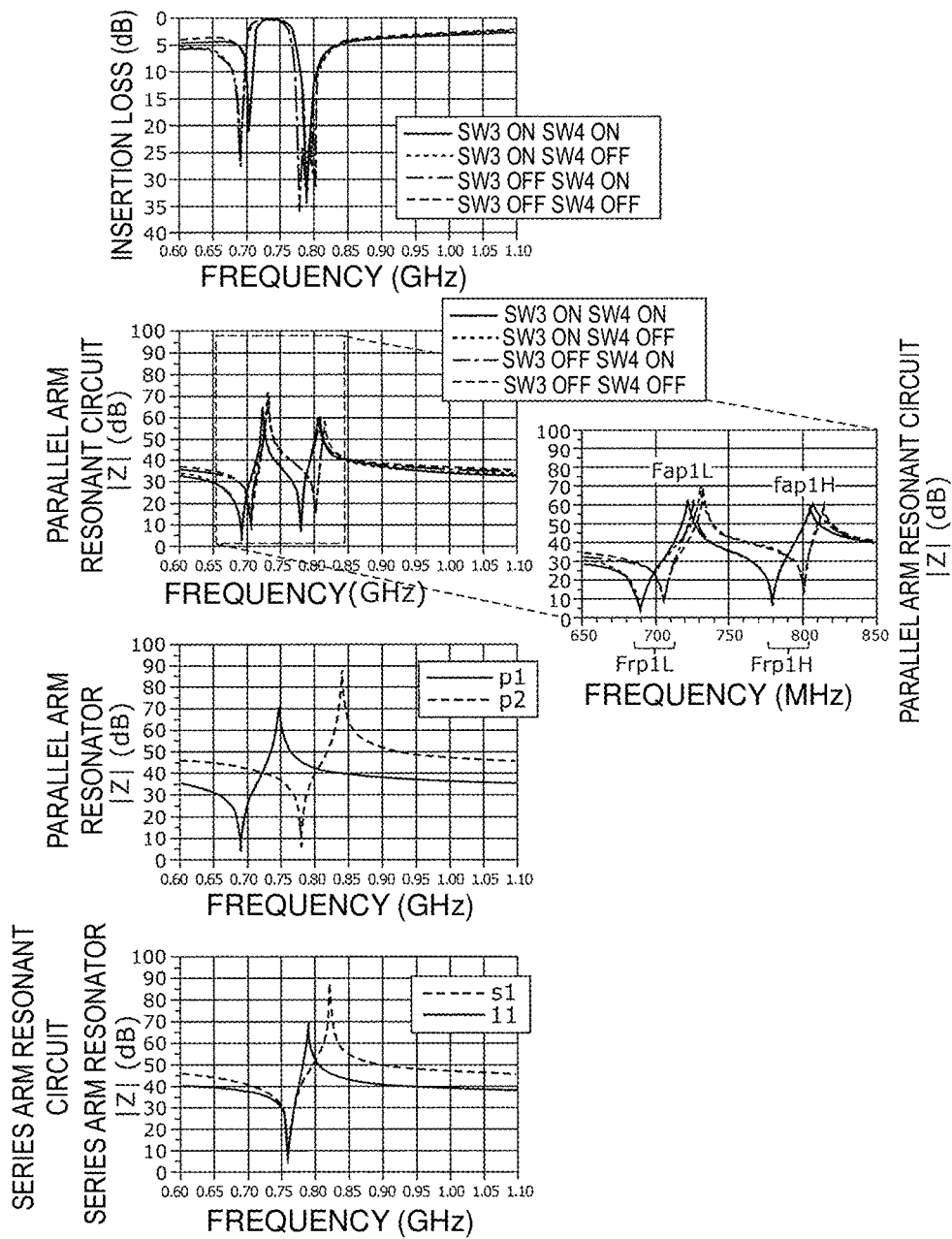
FIG. 39 includes graphs representing the transmission characteristics and the impedance characteristics of the filter apparatus according to the sixth modification of the third preferred embodiment of the present invention (the thirteenth example).

FIG. 39 includes graphs representing the transmission characteristics of the filter 10N according to the sixth modification of the third preferred embodiment (the thirteenth example). A top graph in FIG. 39 represents the transmission characteristics of the filter 10N when the switches SW3 and SW4 are turned on and off. A second top graph in FIG. 39 represents the resonance characteristics of the parallel arm resonant circuit 12N when the switches SW3 and SW4 are turned on and off. A second bottom graph and a bottom graph in FIG. 39 represent the resonance characteristics of the parallel arm resonator and the series arm resonant circuit 11 (and the single series arm resonator s1), respectively.

Table 8 indicates the resonant frequencies, the anti-resonant frequencies, the band width ratios, and the capacitance values of the filter 10N according to the thirteenth example.

TABLE 8

| | | Resonant frequency fr (MHz) | Anti-resonant frequency fa (MHz) | Band width ratio BWR (%) | Capacitance value (pF) |
|---|---|---|---|---|---|
| Tenth example | Series arm resonator s1 | 760 | 821 | 8.00 | 1.5 |
| | Capacitor C1 | — | — | — | 1.5 |
| | Series arm resonant circuit 11(s1 + C1) | 760 | 791 | 4.08 | 3.0 |
| SW3 ON | Parallel arm resonator p1 | 690 | 745 | 8.00 | 3.0 |
| SW4 ON | Parallel arm resonator p2 | 780 | 842 | 8.00 | 1.0 |
| | Capacitor C3 | — | — | — | — |
| | Capacitor C4 | — | — | — | — |
| | Parallel arm resonant circuit 12N (p1 + C3/p2 + C4) | 690 | 723 | 4.78 | 4.0 |
| | | 780 | 805 | 3.21 | |
| SW3 ON | Parallel arm resonator p1 | 690 | 745 | 8.00 | 3.0 |
| SW4 OFF | Parallel arm resonator p2 | 780 | 842 | 8.00 | 1.0 |
| | Capacitor C3 | — | — | — | — |
| | Capacitor C4 | — | — | — | 2.0 |
| | Parallel arm resonant circuit 12N (p1 + C3/p2 + C4) | 690 | 731 | 5.94 | 3.67 |
| | | 801 | 813 | 1.50 | |
| SW3 OFF | Parallel arm resonator p1 | 690 | 745 | 8.00 | 3.0 |
| SW4 ON | Parallel arm resonator p2 | 780 | 842 | 8.00 | 1.0 |
| | Capacitor C3 | — | — | — | 8.0 |
| | Capacitor C4 | — | — | — | — |
| | Parallel arm resonant circuit 12N (p1 + C3/p2 + C4) | 706 | 725 | 2.69 | 3.18 |
| | | 780 | 807 | 3.46 | |
| SW3 OFF | Parallel arm resonator p1 | 690 | 745 | 8.00 | 3.0 |
| SW4 OFF | Parallel arm resonator p2 | 780 | 842 | 8.00 | 1.0 |
| | Capacitor C3 | — | — | — | 8.0 |
| | Capacitor C4 | — | — | — | 2.0 |
| | Parallel arm resonant circuit 12N (p1 + C3/p2 + C4) | 706 | 732 | 3.68 | 2.85 |
| | | 801 | 815 | 1.75 | |

In the filter 10N according to the present modification, the resonant frequency Frp1L at the low frequency side, among the two resonant frequencies of the parallel arm resonant circuit 12N, defines one attenuation pole at the low frequency side of the pass band. The anti-resonant frequency Fap1L at the low frequency side, among the two anti-resonant frequencies of the parallel arm resonant circuit 12N, and the resonant frequency Frs1 of the series arm resonant circuit 11 define the pass band. The resonant frequency Frp1H at the high frequency side, among the two resonant frequencies of the parallel arm resonant circuit 12N, and the anti-resonant frequency Fas1 of the series arm resonant circuit 11 define the two attenuation poles at the high frequency side of the pass band.

First, when the switch SW3 is turned off and the switch SW4 is turned off, the parallel arm resonant circuit 12N is a circuit in which the series circuit of the parallel arm resonator p1 and the capacitor C3 and the series circuit of the parallel arm resonator p2 and the capacitor C4 are connected in parallel to each other. The parallel arm resonant circuit 12N has the two resonant frequencies represented by Equation 30 and Equation 31. Among the two resonant frequencies, the resonant frequency Frp1L at the low frequency side occurs at the high frequency side of the resonant frequency of the parallel arm resonator p1 and the resonant frequency Frp1H at the high frequency side occurs at the high frequency side of the resonant frequency of the parallel arm resonator p2. The parallel arm resonant circuit 12N has the two anti-resonant frequencies represented by Equation 37. Among the two anti-resonant frequencies, the anti-resonant frequency Fap1L at the low frequency side occurs between the resonant frequencies Frp1L and Frp1H of the parallel arm resonant circuit 12N and the anti-resonant frequency Fap1H occurs at the high frequency side of the resonant frequency Frp1H of the parallel arm resonant circuit 12N.

Next, when the switch SW3 is turned on and the switch SW4 is turned off, the parallel arm resonant circuit 12N is a circuit in which the parallel arm resonator p1 is connected in parallel to the series circuit of the parallel arm resonator p2 and the capacitor C4. The parallel arm resonant circuit 12N has the two resonant frequencies represented by Equation 20 and Equation 21. Among the two resonant frequencies, the resonant frequency Frp1L at the low frequency side is equal or substantially equal to the resonant frequency frp1 of the parallel arm resonator p1 and the resonant frequency Frp1H at the high frequency side occurs at the high frequency side of the resonant frequency frp2 of the parallel arm resonator p2. The parallel arm resonant circuit 12N has the two anti-resonant frequencies represented by Equation 27. Among the two anti-resonant frequencies, the anti-resonant frequency Fap1L at the low frequency side occurs between the resonant frequencies Frp1L and Frp1H of the parallel arm resonant circuit 12N and the anti-resonant frequency Fap1H occurs at the high frequency side of the resonant frequency Frp1H of the parallel arm resonant circuit 12N.

Next, when the switch SW3 is turned off and the switch SW4 is turned on, the parallel arm resonant circuit 12N is a circuit in which the series circuit including the parallel arm resonator p1 and the capacitor C3 is connected in parallel to the parallel arm resonator p2. The parallel arm resonant circuit 12N has the two resonant frequencies represented by Equation 24 and Equation 25. Among the two resonant frequencies, the resonant frequency Frp1L at the low frequency side occurs at the high frequency side of the resonant frequency frp1 of the parallel arm resonator p1 and the resonant frequency Frp1H at the high frequency side is equal or substantially equal to the resonant frequency frp2 of the parallel arm resonator p2. The parallel arm resonant circuit 12N has the two anti-resonant frequencies represented by Equation 27. Among the two anti-resonant frequencies, the anti-resonant frequency Fap1L at the low frequency side occurs between the resonant frequencies Frp1L and Frp1H of the parallel arm resonant circuit 12N and the anti-resonant frequency Fap1H occurs at the high frequency side of the resonant frequency Frp1H of the parallel arm resonant circuit 12N.

Next, when the switch SW3 is turned on and the switch SW4 is turned on, the parallel arm resonant circuit 12N is a circuit in which the parallel arm resonator p1 is connected in parallel to the parallel arm resonator p2. The parallel arm resonant circuit 12N has the two resonant frequencies represented by Equation 15. Among the two resonant frequencies, the resonant frequency Frp1L at the low frequency side is equal or substantially to the resonant frequency frp1 of the parallel arm resonator p1 and the resonant frequency Frp1H at the high frequency side is equal or substantially equal to the resonant frequency frp2 of the parallel arm resonator p2. The parallel arm resonant circuit 12N has the two anti-resonant frequencies represented by Equation 17. Among the two anti-resonant frequencies, the anti-resonant frequency Fap1L at the low frequency side occurs between the resonant frequencies Frp1L and Frp1H of the parallel arm resonant circuit 12N and the anti-resonant frequency Fap1H occurs at the high frequency side of the resonant frequency Frp1H of the parallel arm resonant circuit 12N.

Due to the switching between turning-on and turning-off of the switches in the above-described manner, the resonant frequency Frp1L and the anti-resonant frequency Fap1L of the parallel arm resonant circuit 12N, which have the influence on the attenuation pole at the low frequency side of the pass band and the insertion loss at the low pass end, are varied based on switching between turning-on and turning-off of the switch SW3, as illustrated in the second top graph FIG. 39. In addition, the resonant frequency Frp1H and the anti-resonant frequency Fap1L of the parallel arm resonant circuit 12N, which have the influence on the attenuation pole at the high frequency side of the pass band and the insertion loss at the low pass end, are varied based on switching between turning-on and turning-off of the switch SW4. In other words, both the anti-resonant frequency Fap1L determining the pass band and the resonant frequencies Frp1L and Frp1H determining the attenuation pole are varied based on the switching of the switches SW3 and SW4. Accordingly, it is possible to provide the variable frequency filter based on the switching of the switches SW3 and SW4 without increasing the insertion loss in the pass band.

3.14 Configuration of Filter 10P According to Seventh Modification (Fourteenth Example)

Figure 40:
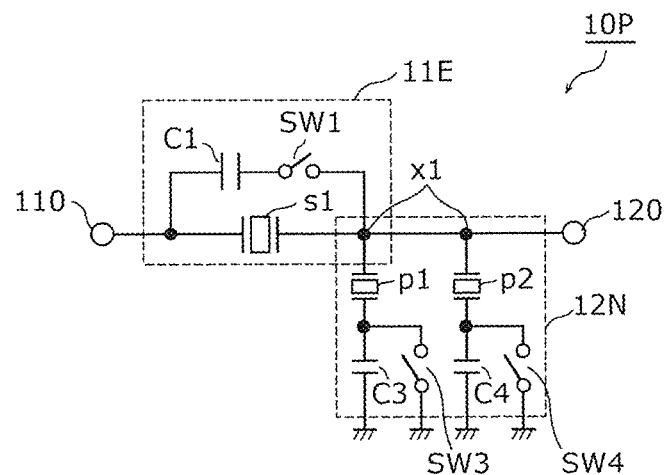
FIG. 40 is a circuit configuration diagram of a filter apparatus according to a seventh modification of the third preferred embodiment of the present invention (a fourteenth example).

FIG. 40 is a circuit configuration diagram of a filter 10P according to a seventh modification of the third preferred embodiment (a fourteenth example). The filter 10P illustrated in FIG. 40 includes the series arm resonant circuit 11E and the parallel arm resonant circuit 12N. The filter 10P illustrated in FIG. 40 differs from the filter 10N according to the sixth modification of the third preferred embodiment (the thirteenth example) only in that the series arm resonant circuit includes the switch SW1. The series arm resonant circuit 11E in the filter 10P has the same or substantially the same configuration as that of the filter 10E according to the first modification of the second preferred embodiment (the fourth example).

3.15 Transmission Characteristics of Filter 10P According to Seventh Modification (Fourteenth Example)

Figure 41:
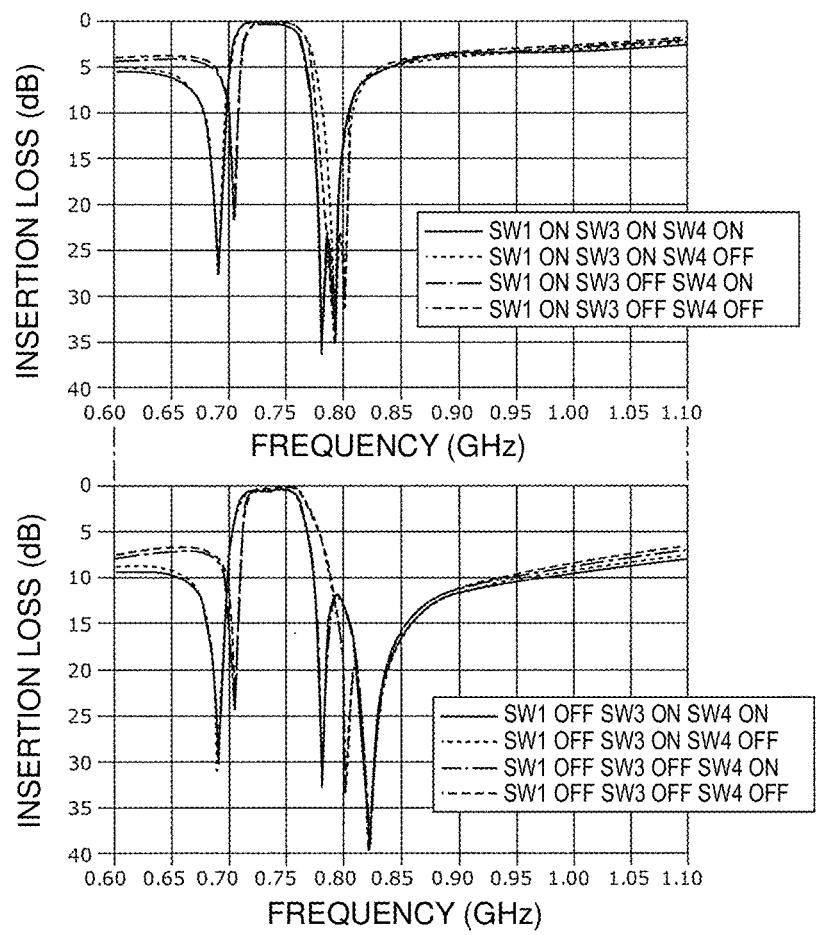
FIG. 41 includes graphs representing the transmission characteristics of the filter apparatus according to the seventh modification of the third preferred embodiment of the present invention (the fourteenth example).

FIG. 41 includes graphs representing the transmission characteristics of the filter 10P according to the seventh modification of the third preferred embodiment (the fourteenth example). As illustrated in FIG. 41, the filter 10P is capable of defining a variable filter in which the attenuation poles at the low frequency side of the pass band and the high frequency side of the pass band and the sharpness between the pass band and the attenuation band are independently varied by individually switching the switches SW1, SW3, and SW4. In addition, it is possible to provide the variable frequency filter based on the switching of the switches SW1, SW3, and SW4 without increasing the insertion loss in the pass band.

3.16 Configuration of Filter 10Q According to Eighth Modification (Fifteenth Example)

Figure 42:
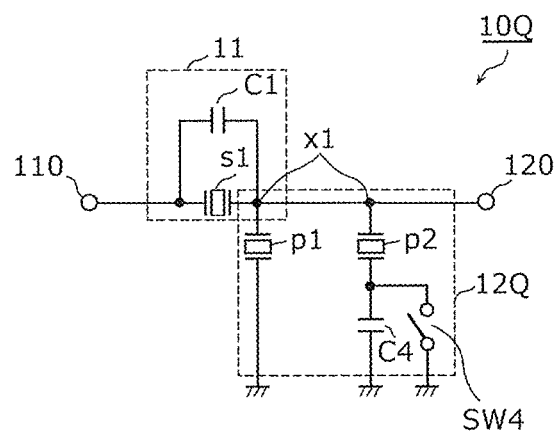
FIG. 42 is a circuit configuration diagram of a filter apparatus according to an eighth modification of the third preferred embodiment of the present invention (a fifteenth example).

FIG. 42 is a circuit configuration diagram of a filter 10Q according to an eighth modification of the third preferred embodiment (a fifteenth example). The filter 10Q illustrated in FIG. 42 includes the series arm resonant circuit 11 and a parallel arm resonant circuit 12Q. The filter 10Q illustrated in FIG. 42 differs from the filter 10N according to the sixth modification of the third preferred embodiment (the thirteenth example) only in that the parallel arm resonant circuit 12Q does not include the capacitor C3 and the switch SW3. In other words, the circuit configuration of the filter 10Q according to the present modification is the same or substantially the same as the circuit configuration when the switch SW3 in the filter 10N according to the sixth modification is switched to the on state.

The filter 10Q includes the second variable frequency circuit, and the second variable frequency circuit includes the capacitor C4 and the switch SW4 connected in parallel to the capacitor C4. The second variable frequency circuit is the second variable frequency circuit that is connected to the parallel arm resonator p2 and that varies at least one of the resonant frequency and the anti-resonant frequency of the parallel arm resonant circuit 12Q.

3.17 Transmission Characteristics of Filter 10Q According to Eighth Modification (Fifteenth Example)

Figure 43:
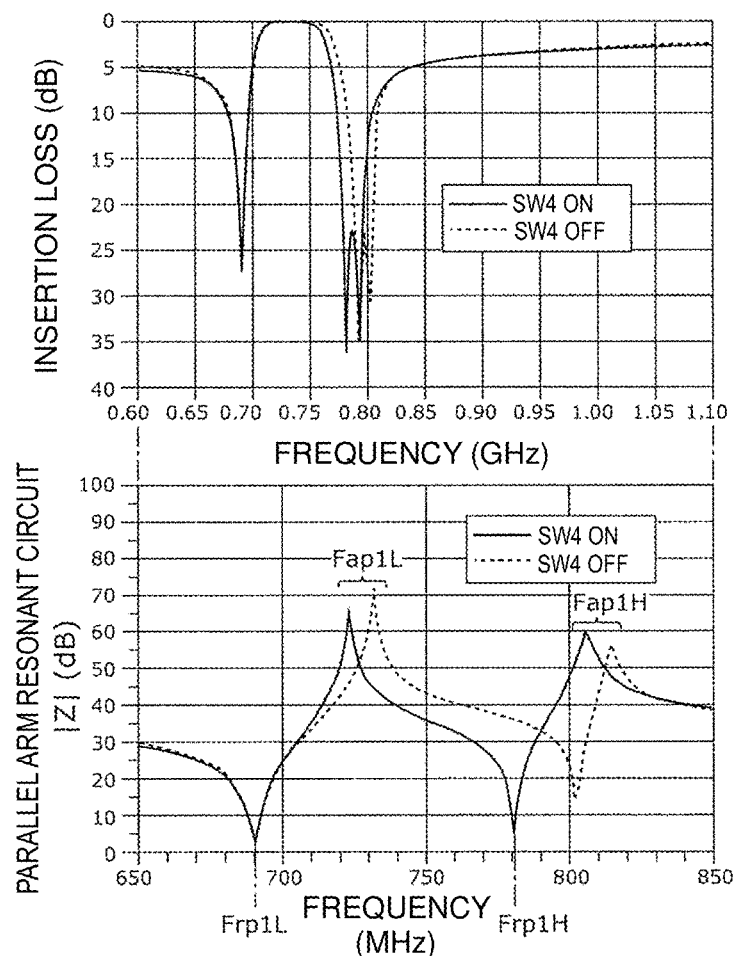
FIG. 43 includes graphs representing the transmission characteristics and the impedance characteristics of the filter apparatus according to the eighth modification of the third preferred embodiment of the present invention (the fifteenth example).

FIG. 43 includes graphs representing the transmission characteristics of the filter 10P according to the eighth modification of the third preferred embodiment (the fifteenth example).

An upper graph in FIG. 43 represents the transmission characteristics of the filter 10Q when the switch SW4 is turned on and off. A lower graph in FIG. 43 represents the resonance characteristics of the parallel arm resonant circuit 12Q when the switch SW4 is turned on and off. The transmission characteristics and the resonance characteristics illustrated in FIG. 43 are the same or substantially the same as the transmission characteristics and the resonance characteristics when the switch SW3 is switched to the on state, among the transmission characteristics and the resonance characteristics of the filter 10N illustrated in FIG. 39.

Specifically, as illustrated in the lower graph in FIG. 43, the resonant frequency Frp1H and the anti-resonant frequency Fap1L of the parallel arm resonant circuit 12Q, which have the influence on the attenuation pole at the high frequency side of the pass band and the insertion loss at the high pass end, are varied based on switching between turning-on and turning-off of the switch SW4. Accordingly, it is possible to provide the variable frequency filter based on the switching of the switch SW4 without increasing the insertion loss at the high pass end.

3.18 Configuration of Filter 10R According to Ninth Modification (Sixteenth Example)

Figure 44:
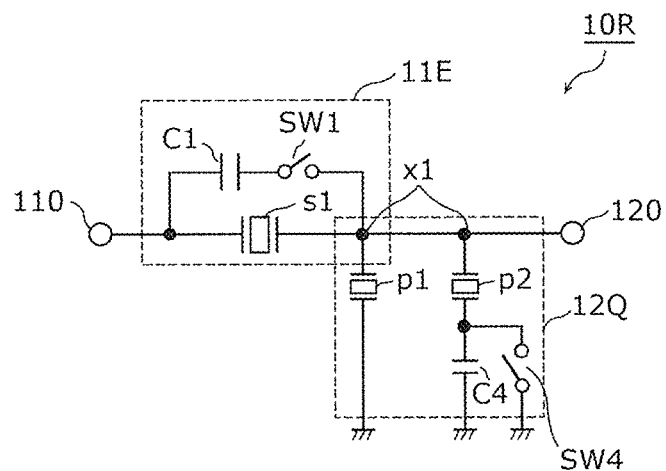
FIG. 44 is a circuit configuration diagram of a filter apparatus according to a ninth modification of the third preferred embodiment of the present invention (a sixteenth example).

FIG. 44 is a circuit configuration diagram of a filter 10R according to a ninth modification of the third preferred embodiment (a sixteenth example). The filter 10R illustrated in FIG. 44 includes the series arm resonant circuit 11E and the parallel arm resonant circuit 12Q. The filter 10R illustrated in FIG. 44 differs from the filter 10Q according to the eighth modification of the third preferred embodiment (the fifteenth example) only in that the series arm resonant circuit includes the switch SW1. The series arm resonant circuit 11E in the filter 10R has the same or substantially the same configuration as that of the filter 10E according to the first modification of the second preferred embodiment (the fourth example).

3.19 Transmission Characteristics of Filter 10R According to Ninth Modification (Sixteenth Example)

Figure 45:
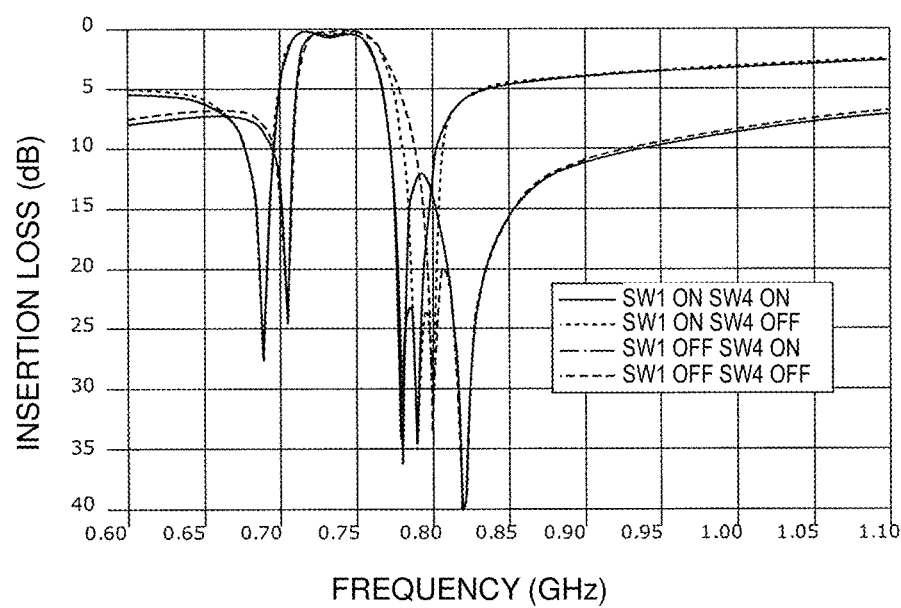
FIG. 45 is a graph representing the transmission characteristics of the filter apparatus according to the ninth modification of the third preferred embodiment of the present invention (the sixteenth example).

FIG. 45 is a graph representing the transmission characteristics of the filter 10R according to the ninth modification of the third preferred embodiment (the sixteenth example). As illustrated in FIG. 45, the filter 10R is capable of defining a variable filter in which the attenuation poles at the low frequency side of the pass band and the high frequency side of the pass band and the sharpness between the pass band and the attenuation band are independently varied by individually switching the switches SW1 and SW4. In addition, it is possible to provide the variable frequency filter based on the switching of the switches SW1 and SW4 without increasing the insertion loss at the high pass end.

Fourth Preferred Embodiment

The configurations of the radio-frequency filters described above may be applied to a configuration including multiple series arm resonators. In the present preferred embodiment, such a radio-frequency filter will be described using a seventeenth example of a preferred embodiment of the present invention.

4.1 Configuration

Figure 46A:
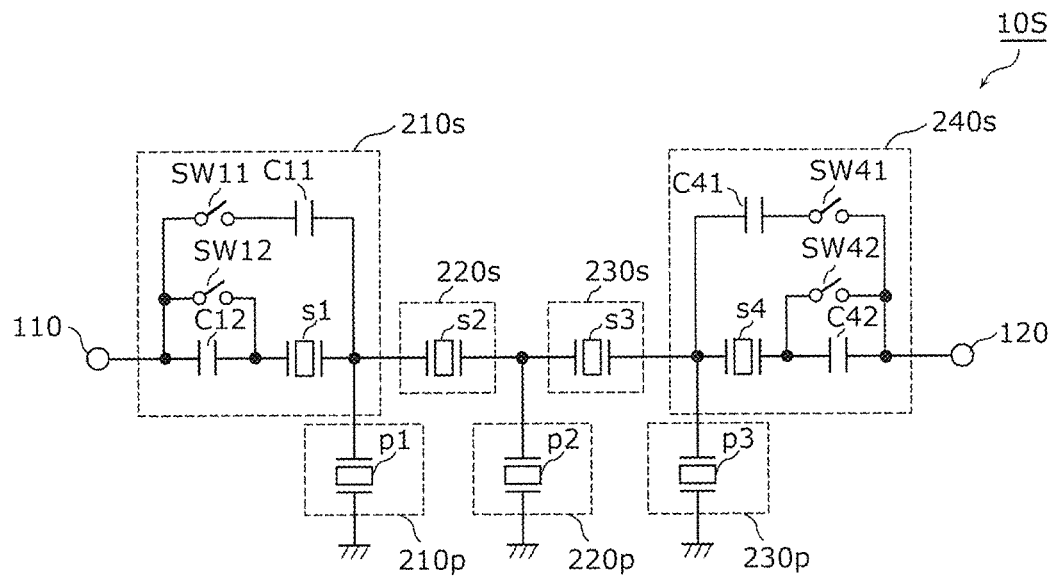
FIG. 46A is a circuit configuration diagram of a filter apparatus according to a fourth preferred embodiment of the present invention (a seventeenth example).

FIG. 46A is a circuit configuration diagram of a filter 10S according to a fourth preferred embodiment of the present invention (the seventeenth example).

The filter 10S illustrated in FIG. 46A is a ladder filter circuit including a plurality of series arm resonant circuits (four series arm resonant circuits 210s, 220s, 230s, and 240s in the present example) provided on the path connecting the input/output terminal 110 (the first input/output terminal) to the input/output terminal 120 (the second input/output terminal) and one or more parallel arm resonant circuits (three parallel arm resonant circuits 210p, 220p, and 230p in the present example). Specifically, the filter 10S is a variable frequency band pass filter that includes four series arm resonators s1 to s4, parallel arm resonators p1, p2, and p3, switches SW11, SW12, SW41, and SW42, and capacitors C11, C12, C41, and C42, and that uses multiple bands as the pass bands. The numbers of the series arm resonant circuits and the parallel arm resonant circuits are not limited to those described above.

Among the series arm resonant circuits 210s, 220s, 230s, and 240s, the series arm resonant circuit 210s closest to the input/output terminal 110 and the series arm resonant circuit 240s closest to the input/output terminal 120 preferably correspond to the series arm resonant circuit 11G in the filter 10G according to any of the first to third preferred embodiments (the third modification of the second preferred embodiment (the sixth example) here). Accordingly, the switches SW11 and SW41 correspond to the switch SW1 in the series arm resonant circuit 11G, the switches SW12 and SW42 correspond to the switch SW2 in the series arm resonant circuit 11G, the capacitors C11 and C41 correspond to the capacitor C1 in the series arm resonant circuit 11G, and the capacitors C12 and C42 correspond to the impedance element z1 in the series arm resonant circuit 11G. The parallel arm resonant circuits 210p, 220p, and 230p correspond to the parallel arm resonant circuit 12 in the filters according to the first to third preferred embodiments. Accordingly, the parallel arm resonators p1, p2, and p3 preferably correspond to the parallel arm resonator p1 in the parallel arm resonant circuit 12. In other words, in the filter 10S, the configuration corresponding to the filter 10G according to the third modification of the second preferred embodiment (the sixth example) is preferably provided so as to be closest to the input/output terminal 110 and the configuration corresponding to the filter 10G according to the third modification of the second preferred embodiment (the sixth example) is preferably provided so as to be closest to the input/output terminal 120.

The configuration of the filter 10S is not limited to that described above. For example, it is sufficient for at least one of the plurality of series arm resonant circuits to correspond to the series arm resonant circuit of any of the first to third preferred embodiments. Only the series arm resonant circuit closest to one input/output terminal may correspond to the series arm resonant circuit of any of the first to third preferred embodiments, and the series arm circuit different from the series arm resonant circuit closest to the input/output terminal may also correspond to the series arm resonant circuit of any of the first to third preferred embodiments.

A parallel arm resonant circuit may be provided, which connects a node on a path between the input/output terminal (the input/output terminal 110 or the input/output terminal 120) and the series arm resonant circuit closest to the input/output terminal to the ground. In addition, the parallel arm resonant circuit may include a variable frequency circuit.

Since the filter 10S configured in the above manner includes the configuration of the filter of any of the first to third preferred embodiments, the return loss at the high frequency side of the pass band is reduced while ensuring the sharpness between the pass band and the attenuation band.

4.2 Structure

Figure 46B:
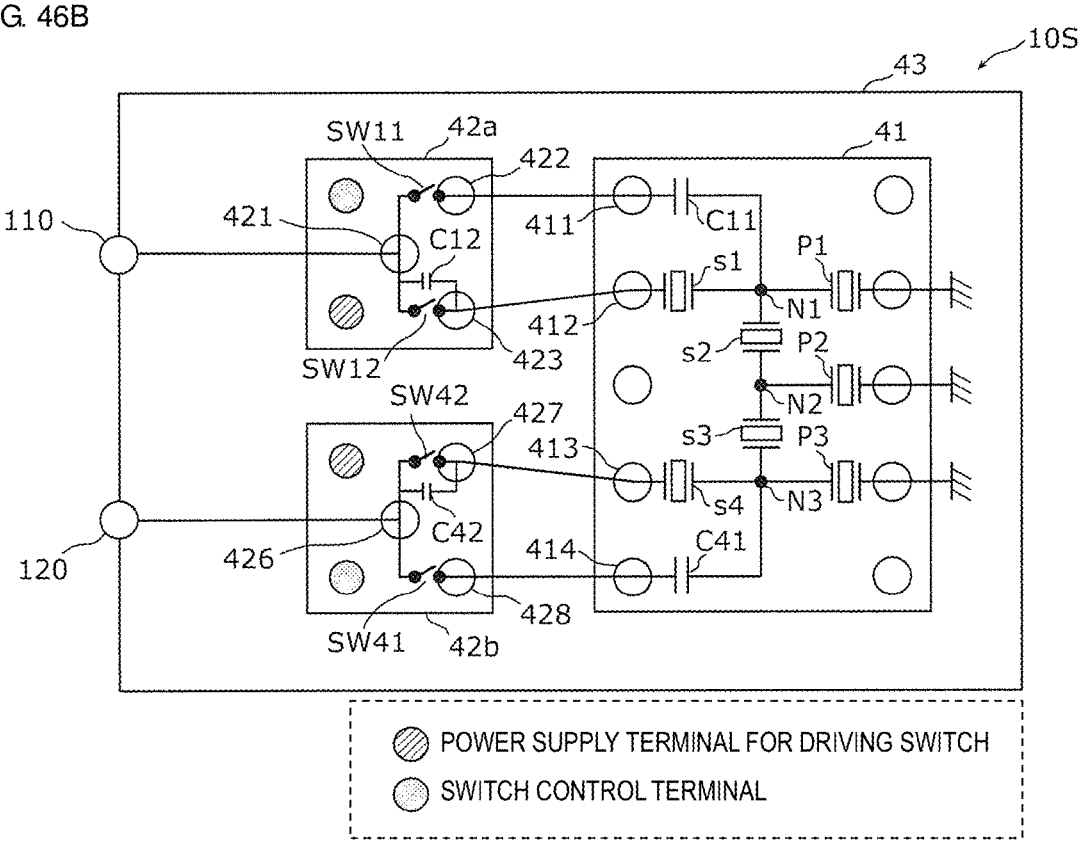
FIG. 46B is a plan view describing the structure of the filter apparatus according to the fourth preferred embodiment of the present invention (the seventeenth example).

FIG. 46B is a plan view describing the structure of the filter 10S according to the fourth preferred embodiment (the seventeenth example).

As illustrated in FIG. 46B, in the present example, the plurality of resonators (the series arm resonators s1 to s4 and the parallel arm resonators p1 to p3) and the capacitors C11 and C41 are provided on one resonator package 41 (chip), and the other elements (the switches SW11, SW12, SW41, and SW42) and the capacitors C12 and C42 are defined by packages 42a and 42b different from the resonator package 41. These packages 41, 42a, and 42b are installed on a wiring substrate 43. In other words, the resonators are provided on a package different from those of the switches.

The packages 41, 42a, and 42b include surface electrodes (circles in FIG. 46B, also referred to as "lands" or "pads") to mount the packages 41, 42a, and 42b on the wiring substrate 43 on their bottom surfaces. In FIG. 46B, for simplicity, the circuit elements and the wiring provided in the respective packages are schematically illustrated and the surface electrodes on the bottom surfaces are illustrated by penetrating through the inside of the packages 41, 42a, and 42b.

The wiring substrate 43 includes external connection electrodes (circles in FIG. 46B) defining the input/output terminal 110 and the input/output terminal 120. The external connection electrodes are preferably, for example, surface electrodes to mount the wiring substrate 43 on a mother board or the like, connectors with which the wiring substrate 43 is connected to other electronic components, or a portion of a wiring pattern with which other electronic components are connected to the package 42a or the package 42b when the other electronic components are installed on the wiring substrate 43.

As is apparent from FIG. 46B, in the package 42a, one terminal of the switch SW1 and one terminal of the switch SW12 are commonly used, which are connected to the input/output terminal 110 as a common terminal 421 of the package 42a. The other terminal of the switch SW12 is connected to a second terminal 423 of the package 42a. The other terminal of the switch SW11 is connected to a first terminal 422 of the package 42a. The capacitor C12 is connected in parallel to the switch SW12.

In the package 42b, one terminal of the switch SW41 and one terminal of the switch SW42 are commonly used, which are connected to the input/output terminal 120 as a common terminal 426 of the package 42b. The other terminal of the switch SW41 is connected to a second terminal 428 of the package 42b. The other terminal of the switch SW42 is connected to a first terminal 427 of the package 42b. The capacitor C42 is connected in parallel to the switch SW42.

In the resonator package 41, the capacitor C11 is connected between a first terminal 411 of the package 41 and a node N1, and the series arm resonator s1 is connected between a second terminal 412 of the package 41 and the node N1. The series arm resonant circuit 220s (the series arm resonator s2) is connected between the node N1 and a node N2 of the package 41, and the series arm resonant circuit 230s (the series arm resonator s3) is connected between the node N2 and a node N3. The series arm resonator s4 is connected between a third terminal 413 of the package 41 and the node N3, and the capacitor C41 is connected between a fourth terminal 414 of the package 41 and the node N3. The parallel arm resonant circuit 210p (the parallel arm resonator p1) is connected between the node N1 of the package 41 and a ground terminal, the parallel arm resonant circuit 220p (the parallel arm resonator p2) is connected between the node N2 and the ground terminal, and the parallel arm resonant circuit 230p (the parallel arm resonator p3) is connected between the node N3 and the ground terminal.

The wiring substrate 43 connects the first terminal 422 of the package 42a to the first terminal 411 of the package 41, connects the second terminal 423 of the package 42a to the second terminal 412 of the package 41, connects the first terminal 427 of the package 42b to the third terminal 413 of the package 41, and connects the second terminal 428 of the package 42b to the fourth terminal 414 of the package 41. In the case in which one terminal of the switch provided on the series arm is connected to one of the input/output terminals 110 and 120 in the above manner, the switches are closer to one of the input/output terminals, compared with a resonator group, when the packages 42a and 42b including the switches are separated from the package 41 including the resonator group. Accordingly, the numbers of the terminals in the resonator package 41 and the switch packages 42a and 42b are capable of being reduced to reduce the size of the filter 10S.

In the circuit configuration illustrated in FIG. 46A, at least one of the parallel arm resonators p1 to p3 may be provided separately from the resonator package and the switches SW11, SW12, SW41, and SW42 and the capacitors C11, C12, C41, and C42 may be packaged in a combination different from the above combination.

Fifth Preferred Embodiment 5.1 Circuit Configuration of Multiplexer According to Eighteenth Example A multiplexer (duplexer) will be described in the present preferred embodiment, in which the radio-frequency filter according to any of the first to fourth preferred embodiments is applied to a transmission-side filter or a reception-side filter.

Figure 47A:
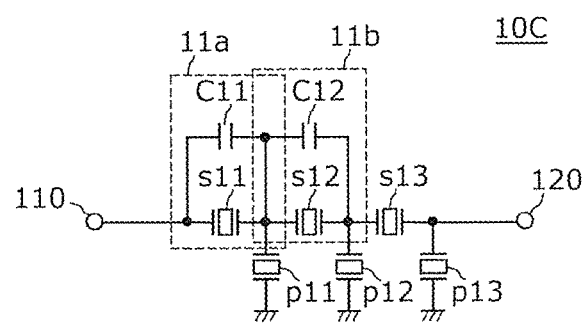
FIG. 47A is a circuit configuration diagram of a filter apparatus applied to a multiplexer according to a fifth preferred embodiment of the present invention (an eighteenth example).
Figure 47B:
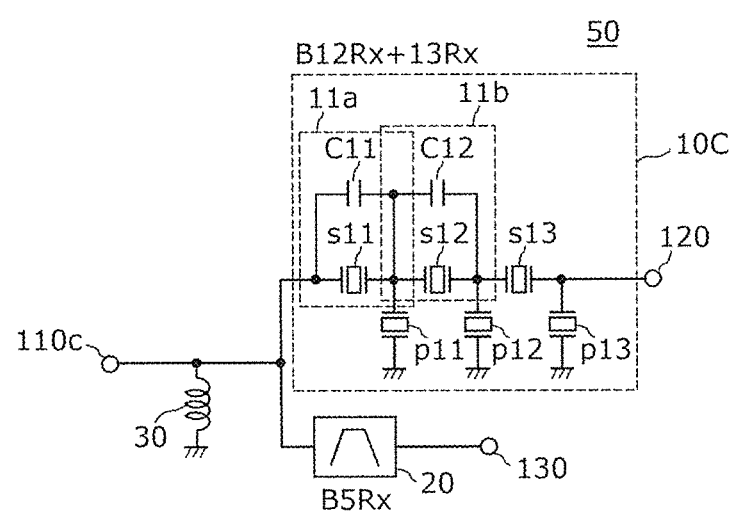
FIG. 47B is a circuit configuration diagram of the multiplexer according to the fifth preferred embodiment of the present invention (the eighteenth example).

FIG. 47A is a circuit configuration diagram of a filter 10C applied to a multiplexer 50 according to a fifth preferred embodiment of the present invention (an eighteenth example) and FIG. 47B is a circuit configuration diagram of the multiplexer 50 according to the fifth preferred embodiment. The multiplexer 50 illustrated in FIG. 47B preferably includes the filter 10C for Band (12+13)Rx of Long Term Evolution (LTE) standard, a filter 20 for Band5Rx, and a matching inductor 30. The filter 10C is connected to a common terminal 110c and the input/output terminal 120, and the filter 20 is connected to the common terminal 110c and an input/output terminal 130.

The filters 10C and 20 may not be directly connected to the common terminal 110c. For example, the filters 10C and 20 may be indirectly connected to the common terminal 110c by providing a switch having one or more conducting states, a phase circuit, or a branch circuit, such as a divider, for example, between the common terminal 110c and the filters 10C and 20.

The filter 10C is preferably a ladder filter circuit including a plurality of series arm resonant circuits (series arm resonant circuits 11a and 11b and a circuit composed of a series arm resonator s13 in the present preferred embodiment) provided on the path connecting the input/output terminal 110 (the first input/output terminal) to the input/output terminal 120 (the second input/output terminal) and one or more parallel arm resonant circuits (three parallel arm resonant circuits p11, p12, and p13 in the present preferred embodiment), as illustrated also in FIG. 47A. Specifically, the filter 10C is preferably a band pass filter that includes the three series arm resonators s11 to s13 and that further includes the three parallel arm resonators p11 to p13 and the capacitors C11 and C12. The numbers of the series arm resonant circuits and the parallel arm resonant circuits are not limited to those described above.

Here, preferably, the series arm resonant circuits 11a and 11b of the filter 10C have the same or substantially the same configuration as that of the series arm resonant circuit 11 in the filter 10A according to the first example and the parallel arm resonator p11 of the filter 10C has the same or substantially the same configuration as that of the parallel arm resonator p1a in the filter 10A according to the first example. Specifically, the series arm resonators s11 and s12 in the filter 10C each correspond to the series arm resonator s1a in the filter 10A and the capacitors C11 and C12 in the filter 10C each correspond to the capacitor C1s in the filter 10A. It is sufficient for the filter 10C to include the configuration of the filter according to any of the first to third preferred embodiments.

The filter 20 is a first filter having a pass band at the high frequency side of the pass band of the filter 10C.

5.2 Circuit Configuration of Multiplexer According to Fifth Comparative Example

Figure 48A:
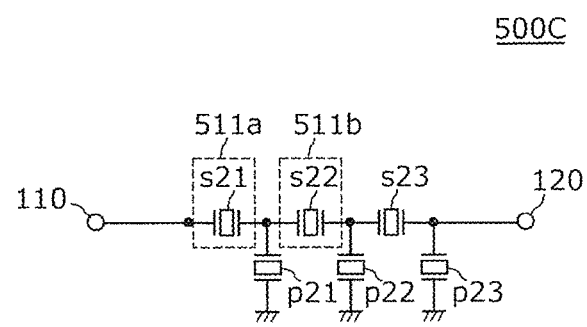
FIG. 48A is a circuit configuration diagram of a filter applied to a multiplexer according to a fifth comparative example.
Figure 48B:
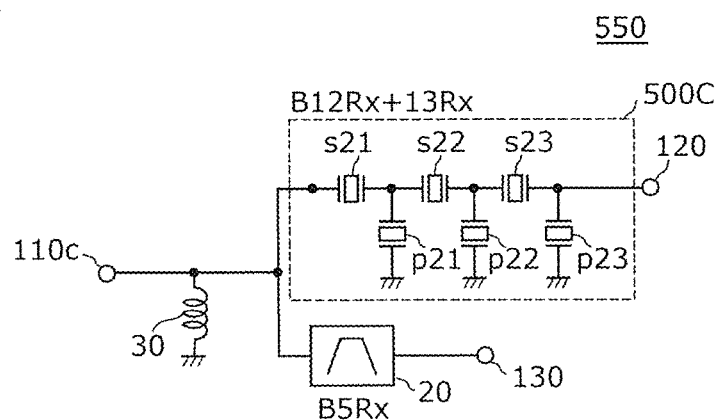
FIG. 48B is a circuit configuration diagram of the multiplexer according to the fifth comparative example.

FIG. 48A is a circuit configuration diagram of a filter 500C applied to a multiplexer 550 according to a fifth comparative example and FIG. 48B is a circuit configuration diagram of the multiplexer 550 according to the fifth comparative example. The multiplexer 550 illustrated in FIG. 48B includes the filter 500C for Band (12+13)Rx of LTE standard, the filter 20 for Band5Rx, and the matching inductor 30. The filter 500C is connected to the common terminal 110c and the input/output terminal 120, and the filter 20 is connected to the common terminal 110c and an input/output terminal 130.

The filter 500C is a ladder filter circuit including a plurality of series arm resonators s21 to s23 provided on the path connecting the input/output terminal 110 (the first input/output terminal) to the input/output terminal 120 (the second input/output terminal) and a plurality of parallel arm resonators p21 to p23, as illustrated also in FIG. 48A.

Here, the series arm resonators s21 to s23 of the filter 500C each have the same or substantially the same configuration as that of the series arm resonator s2a in the filter according to the first comparative example and the parallel arm resonators p21 to p23 of the filter 500C each have the same or substantially the same configuration as that of the parallel arm resonator p2a in the filter according to the first comparative example. The filter 20 is a filter having a pass band at the high frequency side of the pass band of the filter 500C.

5.3 Comparison of Characteristics Between Multiplexers According to Eighteenth Example and Fifth Comparative Example The characteristics of the single filter 10C of the multiplexer 50 are compared with the characteristics of the single filter 500C of the multiplexer 550.

Figure 49:
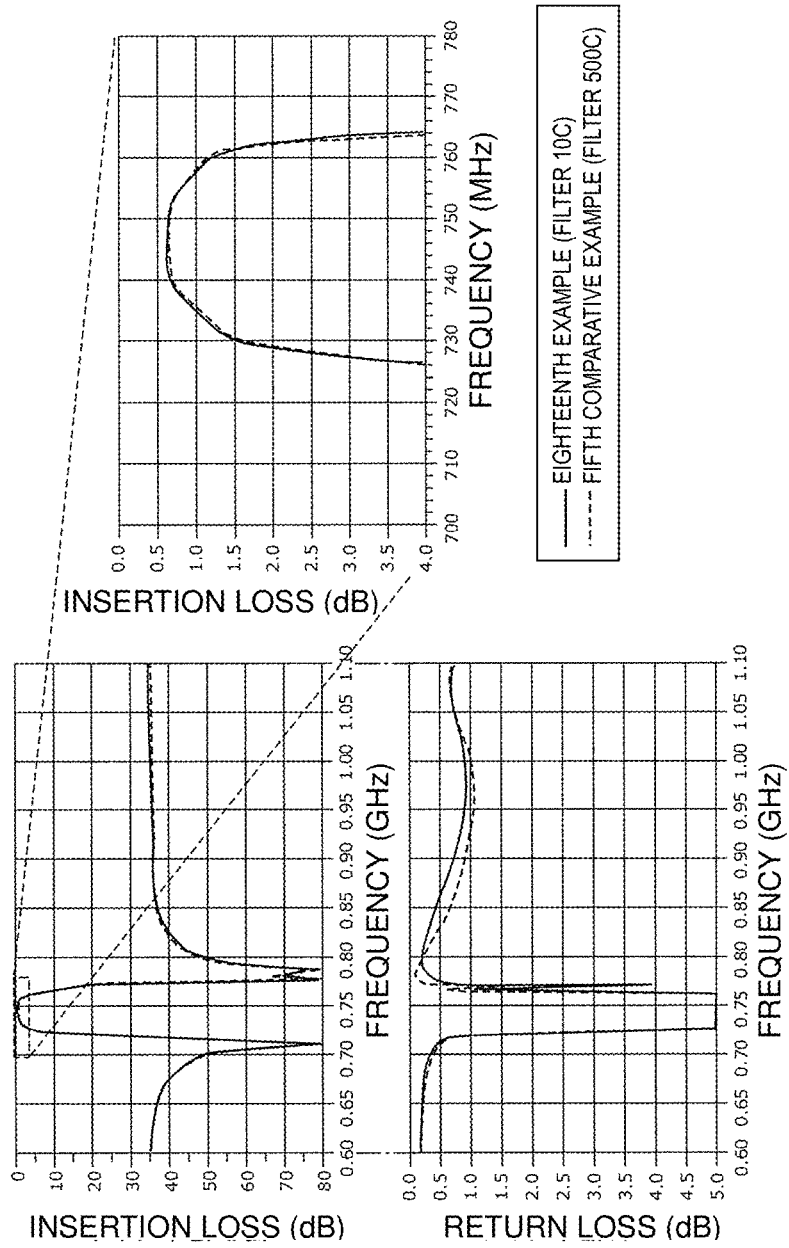
FIG. 49 includes graphs representing the results of comparison between the transmission characteristics and the reflection characteristics of the filter apparatus according to the fifth preferred embodiment of the present invention (the eighteenth example) and the filter according to the fifth comparative example.

FIG. 49 includes graphs representing the results of a comparison between the transmission characteristics and the reflection characteristics of the filter 10C according to the fifth preferred embodiment (the eighteenth example) and the filter 500C according to the fifth comparative example.

Since the filter 10C according to the eighteenth example includes the filter 10A according to the first example and the filter 500C according to the fifth comparative example includes the filter according to the first comparative example, the resonant frequencies, the anti-resonant frequencies, and the band width ratios of the series arm resonant circuits and the parallel arm resonant circuits in the filter 10A according to the first example are equal or substantially equal to those in the filter 500C according to the fifth comparative example. As represented in an upper left graph and a right graph in FIG. 49, the sharpness between the pass band and the attenuation band and the insertion loss in the pass band in the filter 10A according to the first example are equal or substantially equal to those in the filter 500C according to the fifth comparative example.

In contrast, as represented in a lower left graph in FIG. 49, in the frequency band at the high frequency side of the pass band, the return loss in the filter 10C according to the eighteenth example is reduced, compared with that in the filter 500C according to the fifth comparative example. In the resonator, the bulk-wave loss occurs in the band at the high frequency side of the anti-resonant frequency of the series arm resonator to degrade the return loss in the frequency band. In contrast, in the capacitor, any loss, such as degradation of the capacitance Q, does not occur in the frequencies. Accordingly, since the radio-frequency signal input into the filter 10C is subjected to the power distribution in the series arm resonator s11 and the capacitor C11 and is subjected to the power distribution in the series arm resonator s12 and the capacitor C12, the influence of the bulk-wave loss in the resonator is reduced in the filter 10C.

Figure 50:
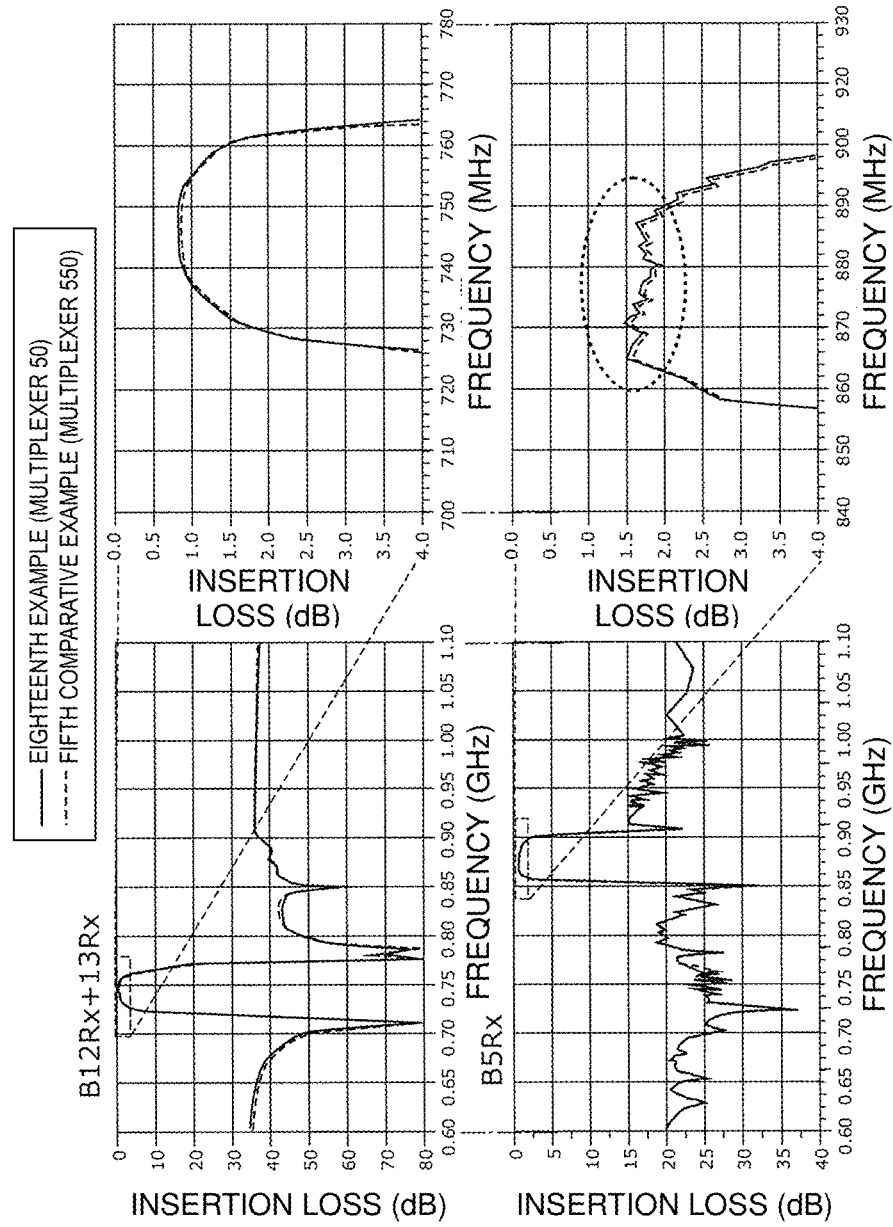
FIG. 50 includes graphs representing the results of comparison between the transmission characteristics of the multiplexer according to the fifth preferred embodiment of the present invention (the eighteenth example) and the multiplexer according to the fifth comparative example.

FIG. 50 includes graphs representing the results of a comparison between the transmission characteristics of the multiplexer 50 according to the fifth preferred embodiment (the eighteenth example) and the multiplexer 550 according to the fifth comparative example. As illustrated in an enlarged view in an upper right portion in FIG. 50, the transmission characteristics of the filter 10C in the state in which the two filters 10C and 20 are connected with the common terminal 110c (the eighteenth example) is in the same or substantially the same level as that of the transmission characteristic of the filter 500C in the state in which the two filters 500C and 20 are connected with the common terminal 110c (the fifth comparative example).

In contrast, the insertion losses within the band of the filter 20 in the state in which the two filters 10C and 20 are connected with the common terminal 110c (the eighteenth example) are about 1.717 dB (at about 869 MHz) and about 2.526 dB (at about 894 MHz) while the insertion losses within the band of the filter 20 in the state in which the two filters 500C and 20 are connected with the common terminal 110c (the fifth comparative example) are about 1.790 dB (at about 869 MHz) and about 2.607 dB (at 894 MHz). In other words, the insertion loss at the filter 20 side is improved by about 0.07 dB to about 0.08 dB in the multiplexer 50 according to the eighteenth example.

Figure 51:
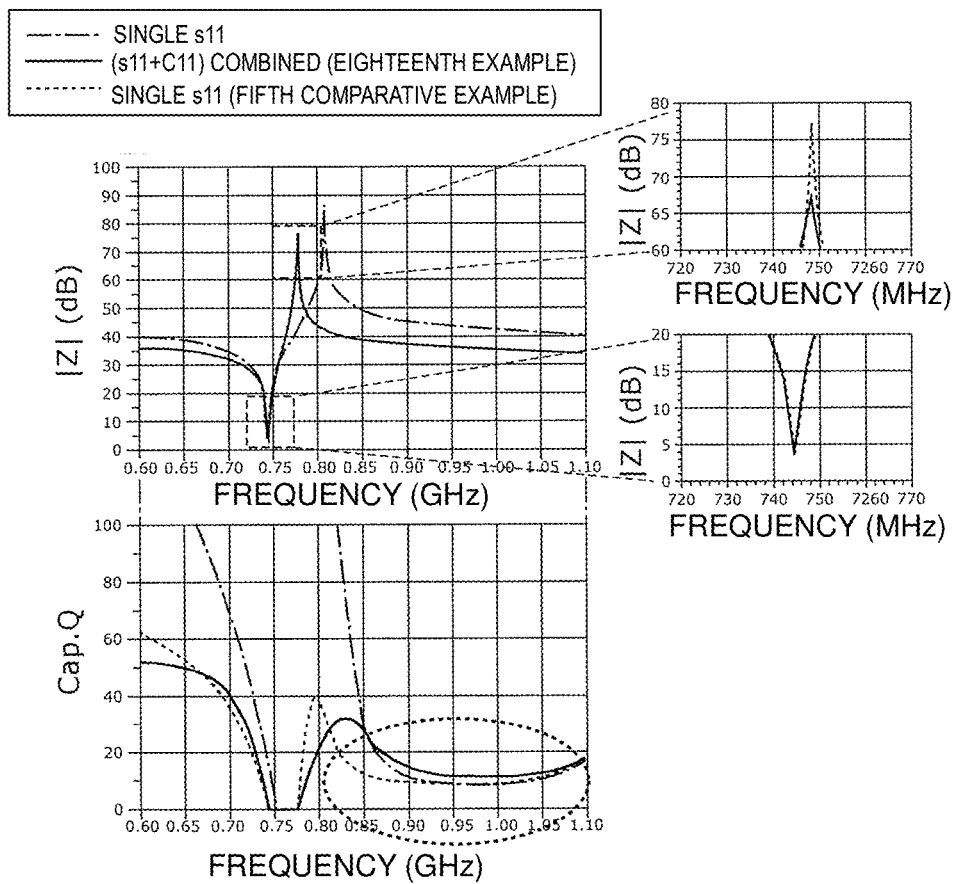
FIG. 51 includes graphs representing the results of comparison between the resonance characteristics and the capacitance Q values of the filter apparatus according to the fifth preferred embodiment of the present invention (the eighteenth example) and the filter according to the fifth comparative example.

FIG. 51 includes graphs representing the results of a comparison between the resonance characteristics and the capacitance Q values of the filter 10C according to the fifth preferred embodiment (the eighteenth example) and the filter according to the fifth comparative example.

In an upper graph in FIG. 51, the resonance characteristics of the series arm resonant circuit and the series arm resonator according to the eighteenth example are compared with those according to the fifth comparative example. As represented in enlarge views on the right side in FIG. 51, the anti-resonance Q value at the anti-resonant frequency of a series arm resonant circuit 511a (the series arm resonator s21) according to the fifth comparative example is higher than that of the series arm resonant circuit 11a according to the eighteenth example. However, since the anti-resonant frequency determines the attenuation pole of the filter, the transmission characteristics of the filter are hardly affected by the anti-resonant frequency. In addition, the resonance Q value at the resonant frequency defining the pass band of the series arm resonant circuit 11a according to the eighteenth example is equal or substantially equal to that of the series arm resonant circuit 511a (the series arm resonator s21) according to the fifth comparative example, and the insertion loss in the pass band of the series arm resonant circuit 11a according to the eighteenth example is in the same or substantially the same level as that of the series arm resonant circuit 511a (the series arm resonator s21) according to the fifth comparative example.

In contrast, as represented in a lower graph in FIG. 51, the capacitance Q value in the series arm resonant circuit 11a according to the eighteenth example is improved, compared with the capacitance Q values in the single series arm resonator s11 and the single series arm resonator s21, in the band at the high frequency side of the anti-resonant frequency. It is considered that this is because, since the capacitor C11 having no bulk-wave loss in the band at the high frequency side of the anti-resonant frequency is connected in parallel to the series arm resonator s11 in the series arm resonant circuit 11a in the eighteenth example, the input radio-frequency signal is subjected to the power distribution to increase the effective capacitance Q value of the series arm resonant circuit 11a in the above band. Accordingly, it is considered that the return loss is reduced in the filter 10C according to the eighteenth example to improve the insertion loss of the filter 20 having the above band as the pass band.

5.4 Example of Application of Filter 10S According to Fourth Preferred Embodiment to Multiplexer The filter 10S according to the fourth preferred embodiment (the seventeenth example) is applicable to a multiplexer. For example, the filter 10S according to the fourth preferred embodiment (the seventeenth example) may be provided, instead of the filter 10C illustrated in FIG. 47B.

The filter 10S is a variable frequency band pass filter having multiple bands as the pass bands. With this configuration, in the filter 10S, the sharpness (steepness) between the pass band and the attenuation band at the low frequency side and the high frequency side of the pass band is ensured and the return loss at the high frequency side of the pass band is reduced by switching between the on state and the off state of the switches SW11, SW12, SW41, and SW42. In addition, since the series arm resonant circuit 210s is connected to the common terminal 110c without one or more other acoustic wave resonators interposed therebetween, the return loss at the high frequency side of the pass band, when the filter 10S is viewed from the common terminal 110c, is able to be reduced or minimized to effectively reduce the insertion loss of the filter 20. In contrast, if another acoustic wave resonator exists at the common terminal 110c side, the return loss caused by the bulk-wave loss is increased.

5.5 Multiplexer 60 According to Modification (Nineteenth Example)

Figure 52:
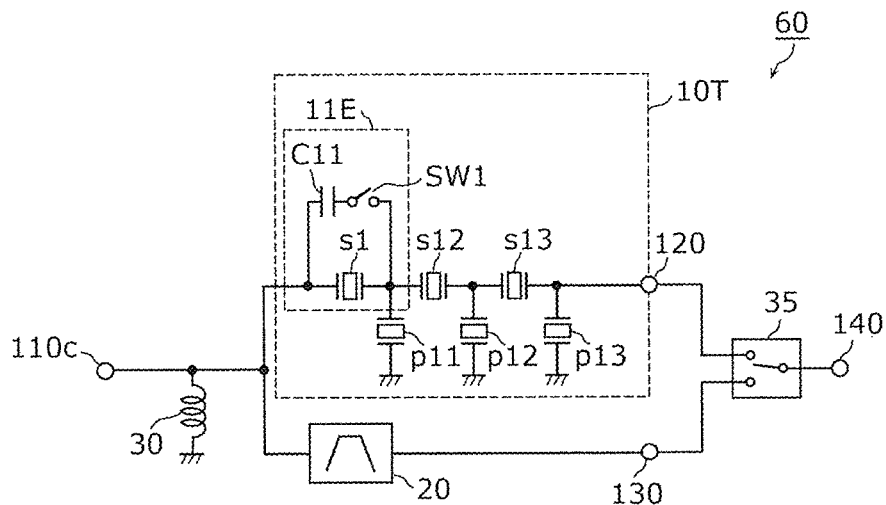
FIG. 52 is a circuit configuration diagram of a multiplexer according to a modification of the fifth preferred embodiment of the present invention (a nineteenth example).

FIG. 52 is a circuit configuration diagram of a multiplexer 60 according to a modification of the fifth preferred embodiment (a nineteenth example). The multiplexer 60 illustrated in FIG. 52 includes a filter 10T, the filter 20, a switch circuit 35, and the matching inductor 30. The filter 10T is connected to the common terminal 110c and the input/output terminal 120, and the filter 20 is connected to the common terminal 110c and the input/output terminal 130.

The filter 10T is preferably a ladder filter circuit, for example, including a plurality of series arm resonant circuits (the series arm resonant circuit 11E and circuits including the series arm resonators s12 and s13 in the present modification) provided on a path connecting the common terminal 110c to the input/output terminal 120 and one or more parallel arm resonant circuits (the three parallel arm resonant circuits p11, p12, and p13 in the present modification). Specifically, the filter 10T is a band pass filter that includes the three series arm resonators s1, s12, and s13 and that further includes the three parallel arm resonators p11 to p13 and the capacitor C11. The numbers of the series arm resonant circuits and the parallel arm resonant circuits are not limited to those described above.

Here, the series arm resonant circuit 11E of the filter 10T preferably has the same or substantially the same configuration as that of the series arm resonant circuit 11E in the filter 10E according to the first modification of the second preferred embodiment (the fourth example), and the parallel arm resonator p11 of the filter 10T preferably has the same or substantially the same configuration as that of the parallel arm resonator p1 in the filter 10E according to the first modification of the second preferred embodiment (the fourth example). The capacitor C11 in the filter 10T corresponds to the capacitor C1 in the filter 10E, and the switch SW1 in the filter 10T corresponds to the switch SW1 in the filter 10E. The series arm resonant circuit 11E in the filter 10T is connected to the common terminal 110c without another series arm circuit interposed therebetween. It is sufficient for the filter 10T to include the configuration of the filter, such as the filter 10G, 10J, 10L, 10M, 10P, or 10R in the second or third preferred embodiment, in which the switch SW is connected in series to the capacitor C11.

The filter 20 is the first filter having a pass band at the high frequency side of the pass band of the filter 10T.

The filters 10T and 20 may not be directly connected to the common terminal 110c. For example, the filters 10T and 20 may be indirectly connected to the common terminal 110c by providing a switch having one or more conducting states, a phase circuit, or a branch circuit such as a divider, for example, between the common terminal 110c and the filters 10T and 20.

The switch circuit 35 is preferably a single pole double throw (SPDT) switch circuit, for example, which includes a third terminal, a first selection terminal, and a second selection terminal and in which the first selection terminal is connected to the input/output terminal 120 and the second selection terminal is connected to the input/output terminal 130 (a second terminal) to switch between connection of the third terminal to the first selection terminal and connection of the third terminal to the second selection terminal.

When the third terminal is not connected to the first selection terminal (the filter 10T is not selected) in the above configuration, the switch SW1 is in the on state.

With the above configuration, when the switch SW1 is in the on state, the pass band of the filter 10T is shifted to the low frequency side, compared with the case in which the switch SW1 is in the off state. Accordingly, even when the filter 10T is not selected with the switch circuit 35, the radio-frequency signal leaking to the filter 20 through the switch circuit 35 is capable of being reduced or prevented, compared the case in which the filter 10T is selected. Consequently, the insertion loss in the pass band of the filter 20 is reduced even in non-selection of the filter 10T.

Sixth Preferred Embodiment

The filters and the multiplexers described above in the first to fifth preferred embodiments are applicable to a radio-frequency front end circuit corresponding to a system using many bands. Accordingly, such a radio-frequency front end circuit and a communication apparatus are described in the present preferred embodiment.

Figure 53:
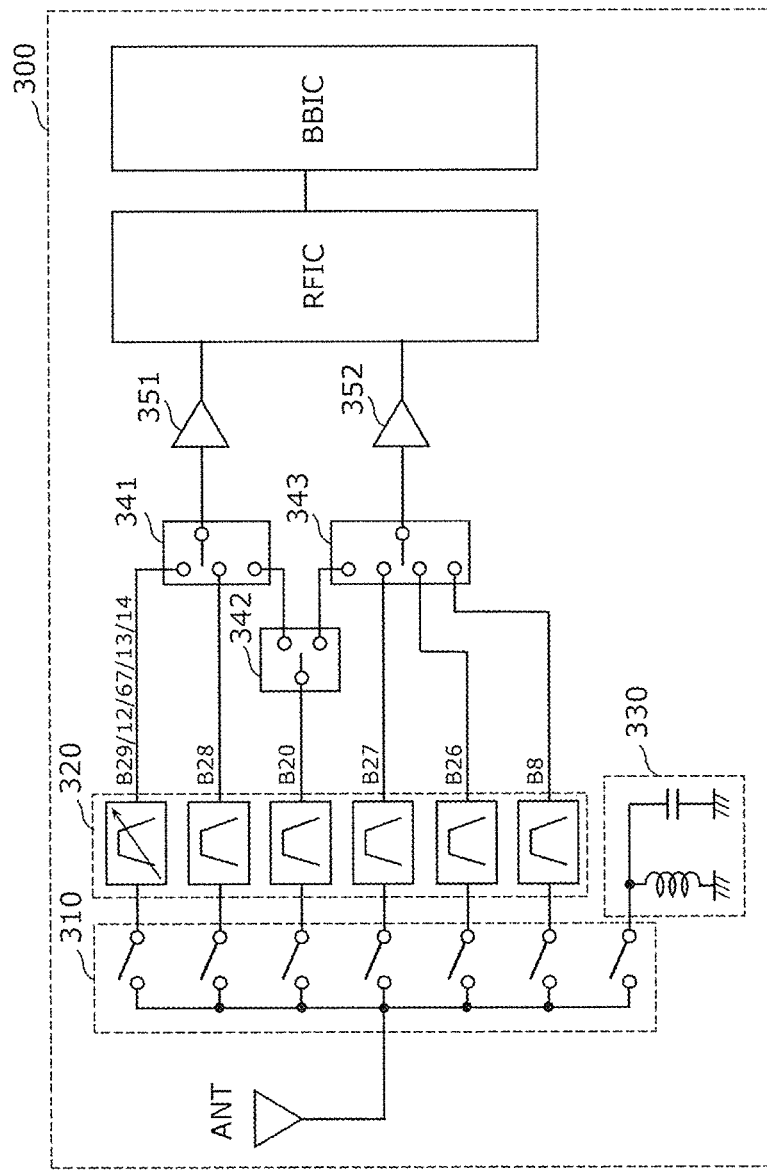
FIG. 53 is a configuration diagram of a communication apparatus according to a sixth preferred embodiment of the present invention and a circuit around the communication apparatus.

FIG. 53 is a configuration diagram of a communication apparatus 300 according to a sixth preferred embodiment of the present invention.

As illustrated in FIG. 53, the communication apparatus 300 includes a switch group 310 including a plurality of switches, a filter group 320 including a plurality of filters, a matching circuit 330, reception-side switches 341, 342, and 343, reception amplifier circuits 351 and 352, a radio-frequency (RF) signal processing circuit (for example, a RF integrated circuit (RFIC)), a baseband signal processing circuit (baseband (BB) integrated circuit (BBIC)), and an antenna element (ANT). The antenna element (ANT) may not be included in the communication apparatus 300.

The switch group 310 is preferably an SPnT switch, for example, that connects the antenna element (ANT) to a signal path corresponding to a certain band in accordance with a control signal from a controller (not illustrated) and that preferably includes, for example, multiple single pole single throw (SPST) switches. Electrical conduction to one or more switches is achieved with the switch group 310. The signal path connected to the antenna element (ANT) is not limited to one signal path and multiple signal paths may be connected to the antenna element (ANT). In other words, the communication apparatus 300 may support carrier aggregation.

The filter group 320 includes a plurality of filters (including duplexers) preferably having, for example, the following bands as the pass bands. Specifically, the bands are (i) a reception band of Band29, Band12, Band67, Band13, or Band 14, (ii) a reception band of Band28, (iii) a reception band of Band 20, (iv) a reception band of Band27, (v) a reception band of Band26, and (vi) a reception band of Band8.

The matching circuit 330 preferably includes, for example, an inductor and a capacitor and is selected when two or more filters, among the filters of (i) to (vi) described above, are concurrently selected (supporting the carrier aggregation).

The reception-side switch 341 includes a plurality of selection terminals connected to a plurality of reception-side signal paths at the low band side and a common terminal connected to the reception amplifier circuit 351. The reception-side switch 342 includes a common terminal connected to the reception-side signal path of a certain band (Band20 here) and two selection terminals connected to the selection terminal of the reception-side switch 341 and the selection terminal of the reception-side switch 343. The reception-side switch 343 includes a plurality of selection terminals connected to a plurality of reception-side signal paths at the high band side and a common terminal connected to the reception amplifier circuit 352. These reception-side switches 341 to 343 are provided downstream of the filter group 320 (downstream on the reception-side signal paths here), and the connection state of the reception-side switches 341 to 343 is switched in accordance with a control signal from the controller (not illustrated). The radio-frequency signals (radio-frequency reception signals here) input through the antenna element (ANT) are amplified in the reception amplifier circuits 351 and 352 through filters in the filter group 320 and are supplied to the RF signal processing circuit (RFIC). The RF signal processing circuit (RFIC) corresponding to the low bands and the RF signal processing circuit (RFIC) corresponding to the high bands may be separately provided.

The reception amplifier circuit 351 is a low noise amplifier that performs power amplification of the radio-frequency reception signals in the low bands, and the reception amplifier circuit 352 is a low noise amplifier that performs the power amplification of the radio-frequency reception signals in the high bands.

The RF signal processing circuit (RFIC) is a circuit that processes the radio-frequency signals transmitted and received through the antenna element (ANT). Specifically, the RF signal processing circuit (RFIC) performs signal processing, such as down-conversion, for example, of the radio-frequency signal (the radio-frequency reception signal here) supplied from the antenna element (ANT) through the reception-side signal path and supplies the reception signal subjected to the signal processing to the baseband signal processing circuit (BBIC). In addition, the RF signal processing circuit (RFIC) performs signal processing, such as up-conversion, for example, of the transmission signal supplied from the baseband signal processing circuit (BBIC) and supplies the radio-frequency signal (the radio-frequency transmission signal here) subjected to the signal processing to the transmission-side signal path.

The communication apparatus 300 configured in the above manner includes the filter according to any of the first to third preferred embodiments as at least one of the filters having the reception bands (i) to (vi) as the pass bands. In other words, the filter switches the pass band in accordance with the control signal.

In the communication apparatus 300, the switch group 310, the filter group 320, the matching circuit 330, the reception-side switches 341 to 343, the reception amplifier circuits 351 and 352, and the control unit define a radio-frequency front end circuit.

Here, the controller described above may be included in the RF signal processing circuit (RFIC), although not illustrated in FIG. 53, or may define a switch IC with the respective switches controlled by the controller.

With the radio-frequency front end circuit and the communication apparatus 300 configured in the above manner, the provision of any of the filters according to the first to third preferred embodiments enables the radio-frequency front end circuit and the communication apparatus including the filter having the reduced return loss at the high frequency side of the pass band, while ensuring the sharpness between the pass band and the attenuation band, to be provided.

The radio-frequency front end circuit according to the present preferred embodiment includes the reception-side switches 341 to 343 (the switch circuits) provided upstream or downstream of the filter group 320 (the multiple radio-frequency filter circuits). With this configuration, a portion of the signal paths through which the radio-frequency signals are transmitted is capable of being shared. Accordingly, for example, the reception amplifier circuits 351 and 352 (amplifier circuits) corresponding to the plurality of radio-frequency filter circuits are capable of being shared. Consequently, it is possible to reduce the size of the radio-frequency front end circuit and reduce the cost thereof.

It is sufficient for at least one of the reception-side switches 341 to 343 to be provided. The number of the reception-side switches 341 to 343 is not limited to the number described above and, for example, one reception-side switch may be provided. The numbers of the selection terminals and so on in the reception-side switches are not limited to those in the present preferred embodiment and may be two, for example.

Instead of including only the reception-side signal paths, as in the communication apparatus 300 according to the present preferred embodiment, a radio-frequency front end circuit and a communication apparatus including only the transmission-side signal paths or both of the reception-side signal paths and the transmission-side signal paths may be provided.

Although the filter apparatuses, the multiplexers, the radio-frequency front end circuits, and the communication apparatuses according to the preferred embodiments of the present invention are described above, taking the first to sixth preferred embodiments and the modifications as examples, the filter apparatuses, the multiplexers, the radio-frequency front end circuits, and the communication apparatuses of the present invention are not limited to the above-described preferred embodiments and modifications. Other preferred embodiments provided by combining arbitrary components in the above preferred embodiments and modifications, modifications resulting from making various changes conceived of by persons of ordinary skill in the art to the above preferred embodiments without departing from the scope and sprit of the present invention, and various devices incorporating the filter apparatus, the multiplexer, the radio-frequency front end circuits, and the communication apparatuses of preferred embodiments of the present invention are also included in the present invention.

In addition, in the filters according to the first to sixth preferred embodiments and their modifications, the piezoelectric substrate 102 in an acoustic wave filter may have a laminated structure in which a high-acoustic-velocity support substrate, a low-acoustic-velocity film, and a piezoelectric film are laminated in this order. The piezoelectric film is preferably made of, for example, 50° Y-cut X-propagation $LiTaO_3$ piezoelectric single crystal or piezoelectric ceramics (lithium tantalite single crystal cut along a plane the normal of which is an axis rotated from the Y axis around the X axis, which is a central axis, by about 50° or ceramics and single crystal in which the acoustic waves propagate in the X-axis direction or ceramics). The piezoelectric film preferably has a thickness of, for example, about 3.5× or less when the wavelength determined by the electrode finger pitch of the IDT electrodes is denoted by λ. The high-acoustic-velocity support substrate is a substrate that supports the low-acoustic-velocity film, the piezoelectric film, and the electrode film 101. Furthermore, the high-acoustic-velocity support substrate is a substrate in which the acoustic velocity of bulk waves in the high-acoustic-velocity support substrate is higher than that of the acoustic waves, such as surface acoustic waves or boundary acoustic waves, which propagate through the piezoelectric film, and traps the acoustic waves in a portion where the piezoelectric film and the low-acoustic-velocity film are laminated to prevent the acoustic waves from leaking below the high-acoustic-velocity support substrate. The high-acoustic-velocity support substrate is preferably, for example, a silicon substrate and has a thickness of, for example, about 120 μm. The low-acoustic-velocity film is a film in which the acoustic velocity of the bulk waves in the low-acoustic-velocity film is lower than that of the acoustic waves propagating through the piezoelectric film and is disposed between the piezoelectric film and the high-acoustic-velocity support substrate. Due to this structure and the property of the acoustic waves the energy of which concentrates on the medium that intrinsically has a low-acoustic-velocity, leakage of the acoustic wave energy to the outside of the IDT electrodes is reduced or prevented. The low-acoustic-velocity film is preferably a film containing, for example, silicon dioxide as the main component and has a thickness of, for example, about 670 nm. With this laminated structure, the Q values at the resonant frequency and the anti-resonant frequency are able to be greatly increased, compared with a single layer structure in which only the piezoelectric substrate 102 is used. In other words, since the acoustic wave resonator having the high Q values is capable of being provided, it is possible to provide a filter having low insertion loss.

The high-acoustic-velocity support substrate may have a structure in which the support substrate and a high-acoustic-velocity film are laminated. In the high-acoustic-velocity film, the acoustic velocity of the propagating bulk waves is higher than that of the acoustic waves, such as the surface acoustic waves or the boundary acoustic waves, which propagate through the piezoelectric film. In this case, a piezoelectric material, such as sapphire, lithium tantalite, lithium niobate, or crystal, for example; a variety of ceramics, such as alumina, magnesia, silicon nitride, aluminum nitride, silicon carbide, zirconia, cordierite, mullite, steatite, or forsterite, for example; a dielectric material, such as glass, for example; a semiconductor, such as silicon or gallium nitride, for example; and a resin substrate may be used for the support substrate. Various high-acoustic-velocity materials, such as, for example, aluminum nitride, aluminum oxide, silicon carbide, silicon nitride, silicon oxynitride, a diamond-like carbon (DLC) film or diamond, a medium containing any of the above materials as the main component, and a medium containing a mixture of the above materials as the main component, may be used for the high-acoustic-velocity film.

The switches SW1 to SW4 are preferably, for example, single pole signal throw (SPST) switch elements. The connection nodes of the respective switches SW1 to SW4 are set to the conducting state or the non-conducting state based on switching between turning-on and turning-off in response to a control signal from the control unit.

For example, field effect transistor (FET) switches made of GaAs or complementary metal oxide semiconductor (CMOS) or diode switches may preferably be used as the switches SW1 to SW4. In this case, since each of the switches SW1 to SW4 may be defined by one FET switch or one diode switch, the size of the filter is able to be reduced.

In addition, in the filter apparatuses, the multiplexers, the radio-frequency front end circuits, and the communication apparatuses according to the first to sixth preferred embodiments and their modifications, an inductance element or a capacitance element may be connected between each input/output terminal and the common terminal. Furthermore, the filter apparatuses, the multiplexers, the radio-frequency front end circuits, and the communication apparatuses according to the first to sixth preferred embodiments and their modifications may include an inductance component made of the wiring with which the respective circuit elements are connected.

Preferred embodiments of the present invention are capable of being widely used in communication devices, such as mobile phones, for example, as the compact filter apparatus, multiplexer, radio-frequency front end circuit, and communication apparatus applicable to a multiband-multimode system that concurrently or exclusively uses multiple adjacent bands.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter apparatus comprising:
   a series arm resonant circuit connected between a first input/output terminal and a second input/output terminal; and
   a parallel arm resonant circuit connected to a node on a path connecting the first input/output terminal to the second input/output terminal and ground; wherein
   when a value calculated by dividing a frequency difference between an anti-resonant frequency at a lowest frequency side, among one or more anti-resonant frequencies of a resonant circuit, and a resonant frequency at the lowest frequency side, among one or more resonant frequencies of the resonant circuit, by the resonant frequency, is defined as a band width ratio of the resonant circuit, and a value calculated by dividing a frequency difference between an anti-resonant frequency of a resonator and a resonant frequency of the resonator by the resonant frequency is defined as a band width ratio of the resonator;
   the series arm resonant circuit includes:
      a first series arm resonator having a band width ratio higher than the band width ratio of the parallel arm resonant circuit; and
      a first capacitor connected to the first series arm resonator.

2. The filter apparatus according to claim 1, wherein the band width ratio of the series arm resonant circuit is equal or substantially equal to the band width ratio of the parallel arm resonant circuit.

3. The filter apparatus according to claim 1, wherein the first series arm resonator is an acoustic wave resonator including an IDT electrode including a plurality of electrode fingers provided on a substrate at least partially having piezoelectricity.

4. The filter apparatus according to claim 3, wherein
the first capacitor is defined by the substrate and a first interdigital capacitor electrode including a plurality of electrode fingers provided on the substrate; and
a pitch of the plurality of electrode fingers in the first interdigital capacitor electrode is narrower than a pitch of the plurality of electrode fingers in the first series arm resonator.

5. The filter apparatus according to claim 4, wherein a film thickness of the plurality of electrode fingers in the first interdigital capacitor electrode is smaller than or equal to a film thickness of the plurality of electrode fingers in the first series arm resonator.

6. The filter apparatus according to claim 1, wherein
the first series arm resonator is connected on the path; and
the first capacitor is connected in parallel to the first series arm resonator.

7. The filter apparatus according to claim 1, wherein
the first series arm resonator is connected on the path;
the series arm resonant circuit includes a first impedance element connected in series to the first series arm resonator;
a circuit in which the first series arm resonator is connected in series to the first impedance element is connected in parallel to the first capacitor; and
the first impedance element is one of a second capacitor or an inductor.

8. The filter apparatus according to claim 1, wherein
the first series arm resonator is connected on the path;
the series arm resonant circuit further includes:
    a first impedance element connected in series to the first series arm resonator; and
    a first switch connected in series to the first capacitor;
a circuit in which the first series arm resonator is connected in series to the first impedance element is connected in parallel to a circuit in which the first capacitor is connected in series to the first switch; and
the first impedance element is one of a second capacitor or an inductor.

9. The filter apparatus according to claim 7, wherein the series arm resonant circuit further includes a second switch connected in parallel to the first impedance element.

10. The filter apparatus according to claim 1, wherein
the first series arm resonator is connected on the path;
the series arm resonant circuit further includes a first switch connected in series to the first capacitor; and
the first series arm resonator is connected in parallel to a circuit in which the first capacitor is connected in series to the first switch.

11. The filter apparatus according to claim 1, wherein
the parallel arm resonant circuit includes a first parallel arm resonator connected between the node and the ground;
the band width ratio of the first parallel arm resonator is narrower than the band width ratio of the first series arm resonator; and
the resonant frequency of the first parallel arm resonator is lower than the resonant frequency of the first series arm resonator, and the anti-resonant frequency of the first parallel arm resonator is lower than the anti-resonant frequency of the first series arm resonator.

12. The filter apparatus according to claim 1, wherein the parallel arm resonant circuit includes:
a first parallel arm resonator connected between the node and the ground; and
a third capacitor connected in series to the first parallel arm resonator;
the band width ratio of the first parallel arm resonator is equal to or narrower than the band width ratio of the first series arm resonator; and
the resonant frequency of the first parallel arm resonator is lower than the resonant frequency of the first series arm resonator, and the anti-resonant frequency of the first parallel arm resonator is lower than the anti-resonant frequency of the first series arm resonator.

13. The filter apparatus according to claim 1, wherein the parallel arm resonant circuit includes:
a first parallel arm resonator connected between the node and the ground; and
a first variable frequency circuit connected to the first parallel arm resonator and that varies at least one of the resonant frequency and the anti-resonant frequency of the parallel arm resonant circuit;
the first variable frequency circuit includes:
a third capacitor connected in series to the first parallel arm resonator; and
a third switch connected in parallel to the third capacitor;
the band width ratio of the first parallel arm resonator is equal to or narrower than the band width ratio of the first series arm resonator; and
the resonant frequency of the first parallel arm resonator is lower than the resonant frequency of the first series arm resonator, and the anti-resonant frequency of the first parallel arm resonator is lower than the anti-resonant frequency of the first series arm resonator.

14. The filter apparatus according to claim 13, wherein
the parallel arm resonant circuit further includes a second parallel arm resonator connected between the node and the ground;
the second parallel arm resonator is connected in parallel to a circuit in which the first parallel arm resonator is connected in series to the first variable frequency circuit;
the band width ratio of the second parallel arm resonator is equal to or narrower than the band width ratio of the first series arm resonator; and
the resonant frequency of the second parallel arm resonator is higher than the resonant frequency of the first parallel arm resonator, and the anti-resonant frequency of the second parallel arm resonator is higher than the anti-resonant frequency of the first parallel arm resonator.

15. The filter apparatus according to claim 1, wherein the parallel arm resonant circuit includes:
a first parallel arm resonator connected between the node and the ground;
a second parallel arm resonator connected between the node and the ground; and
a second variable frequency circuit connected to the second parallel arm resonator and that varies at least one of the resonant frequency and the anti-resonant frequency of the parallel arm resonant circuit;
the second variable frequency circuit includes:
a fourth capacitor connected in series to the second parallel arm resonator; and
a fourth switch connected in parallel to the fourth capacitor;
the first parallel arm resonator is connected in parallel to a circuit in which the second parallel arm resonator is connected in series to the fourth capacitor;

the band width ratio of the first parallel arm resonator is equal to or narrower than the band width ratio of the first series arm resonator;

the resonant frequency of the first parallel arm resonator is lower than the resonant frequency of the first series arm resonator, and the anti-resonant frequency of the first parallel arm resonator is lower than the anti-resonant frequency of the first series arm resonator;

the band width ratio of the second parallel arm resonator is equal to or narrower than the band width ratio of the first series arm resonator; and the resonant frequency of the second parallel arm resonator is higher than the resonant frequency of the first parallel arm resonator, and the anti-resonant frequency of the second parallel arm resonator is higher than the anti-resonant frequency of the first parallel arm resonator.

16. The filter apparatus according to claim 11, wherein each of the first series arm resonator and the first parallel arm resonator is an acoustic wave resonator including an IDT electrode including a plurality of electrode fingers provided on a substrate at least partially having piezoelectricity; and a first adjustment film that adjusts the band width ratio is provided between the IDT electrode of at least the first parallel arm resonator, in the first series arm resonator and the first parallel arm resonator, and the substrate.

17. The filter apparatus according to claim 11, wherein each of the first series arm resonator and the first parallel arm resonator is an acoustic wave resonator including an IDT electrode including a plurality of electrode fingers provided on a substrate at least partially having piezoelectricity; and a second adjustment film that adjusts the band width ratio covers the IDT electrode of at least the first parallel arm resonator, in the first series arm resonator and the first parallel arm resonator.

18. A multiplexer comprising:

a common terminal;

the filter apparatus according to claim 1; and a first filter having a pass band at a high frequency side of a pass band of the filter apparatus; wherein the first input/output terminal and the first filter are connected to the common terminal.

19. The multiplexer according to claim 18, wherein the filter apparatus further includes one or more acoustic wave resonators; and the series arm resonant circuit is connected to the common terminal without the one or more acoustic wave resonators and the parallel arm resonant circuit interposed therebetween.

20. A multiplexer comprising:

a common terminal;

the filter apparatus according to claim 8, in which the first input/output terminal is connected to the common terminal;

a first filter including a first terminal and a second terminal and in which the first terminal is connected to the common terminal; and a switch circuit including a third terminal, a first selection terminal, and a second selection terminal and in which the first selection terminal is connected to the second input/output terminal and the second selection terminal is connected to the second terminal to switch between a connection of the third terminal to the first selection terminal and a connection of the third terminal to the second selection terminal; wherein the frequency of a pass band of the first filter is higher than the frequency of a pass band of the filter apparatus;

the filter apparatus further includes one or more acoustic wave resonators;

the series arm resonant circuit is connected to the common terminal without the one or more acoustic wave resonators and the parallel arm resonant circuit interposed therebetween; and when the third terminal is not connected to the first selection terminal, the first switch is in a conducting state.

21. A radio-frequency front end circuit comprising:

the filter apparatus according to claim 1; and an amplifier circuit connected to the filter apparatus.

22. A communication apparatus comprising:

an RF signal processing circuit that processes a radio-frequency signal transmitted and received through an antenna element; and the radio-frequency front end circuit according to claim 21, which transmits the radio-frequency signal between the antenna element and the RF signal processing circuit.

* * * * *